US012684927B2

(12) United States Patent
    Akimoto

(10) Patent No.: US 12,684,927 B2
(45) Date of Patent: Jul. 14, 2026

(54) METHOD FOR MANUFACTURING IMAGE DISPLAY DEVICE AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 514 days.

(21) Appl. No.: 18/318,126

(22) Filed: May 16, 2023

(65) Prior Publication Data

US 2023/0343813 A1      Oct. 26, 2023

Related U.S. Application Data

(63) Continuation of application No. PCT/JP2021/042842, filed on Nov. 22, 2021.

(30) Foreign Application Priority Data

Nov. 25, 2020      (JP) ................................. 2020-195366

(51) Int. Cl.
    *H10H 29/14*          (2025.01)
    *H10H 20/851*         (2025.01)
                (Continued)

(52) U.S. Cl.
    CPC ........ *H10H 29/142* (2025.01); *H10H 20/851* (2025.01); *H10H 20/856* (2025.01); *H10H 20/0361* (2025.01); *H10H 20/0363* (2025.01)

(58) Field of Classification Search
    CPC .. H10H 29/142; H10H 20/851; H10H 20/856; H10H 20/0363; H10H 20/825; H10H 20/857
    See application file for complete search history.

(56) References Cited

U.S. PATENT DOCUMENTS

2012/0141799 A1    6/2012  Kub et al.
2015/0257258 A1*   9/2015  Naito ................... H05K 1/0274
                                                    174/251
(Continued)

FOREIGN PATENT DOCUMENTS

JP          2002-141492 A1    5/2002
JP          2018-205741 A     12/2018
                (Continued)

OTHER PUBLICATIONS

International Search Report with English language translation and Written Opinion of the International Searching Authority issued in the corresponding International Patent Application No. PCT/JP2021/042842, dated Jan. 11, 2022.

*Primary Examiner* — Monica D Harrison
*Assistant Examiner* — Jacob T Nelson
(74) *Attorney, Agent, or Firm* — Foley & Lardner LLP

(57) ABSTRACT

A method for manufacturing an image display device according to an embodiment includes forming a graphene layer on a first substrate, forming a semiconductor layer including a light-emitting layer on the graphene layer, forming the light-emitting element by patterning the semiconductor layer so that the light-emitting element includes a bottom surface on the graphene layer and a light-emitting surface at a side opposite to the bottom surface, forming a first insulating film that covers the first substrate, the graphene layer, and the light-emitting element, forming a circuit element on the first insulating film, forming a second insulating film that covers the first insulating film and the circuit element, exposing the light-emitting surface by removing a portion of the first insulating film and a portion of the second insulating film, forming a via extending through the first and second insulating films, and forming a wiring layer on the second insulating film.

9 Claims, 32 Drawing Sheets

(51) Int. Cl.
    *H10H 20/856*      (2025.01)
    *H10H 20/01*       (2025.01)

(56)           References Cited

U.S. PATENT DOCUMENTS

| | | |
|---|---|---|
| 2018/0294311 A1 | 10/2018 | Hsiang et al. |
| 2018/0351035 A1 | 12/2018 | Chung et al. |
| 2019/0355766 A1 | 11/2019 | Zhang et al. |
| 2020/0273906 A1 | 8/2020 | Li et al. |
| 2020/0274023 A1 | 8/2020 | Kang |
| 2020/0303471 A1 | 9/2020 | Akimoto |
| 2020/0395351 A1 | 12/2020 | Yajima |
| 2022/0059518 A1 | 2/2022 | Akimoto |
| 2022/0069187 A1 | 3/2022 | Akimoto |
| 2022/0069188 A1 | 3/2022 | Akimoto |

FOREIGN PATENT DOCUMENTS

| | | |
|---|---|---|
| JP | 2020-507107 A | 3/2020 |
| JP | 2020-205336 A | 12/2020 |
| TW | I626738 B | 6/2018 |
| WO | WO-2019/168187 A1 | 9/2019 |
| WO | WO-2020/196271 A1 | 10/2020 |
| WO | WO-2020/226044 A1 | 11/2020 |
| WO | WO-2020/230667 A1 | 11/2020 |
| WO | WO-2020/230668 A1 | 11/2020 |

* cited by examiner

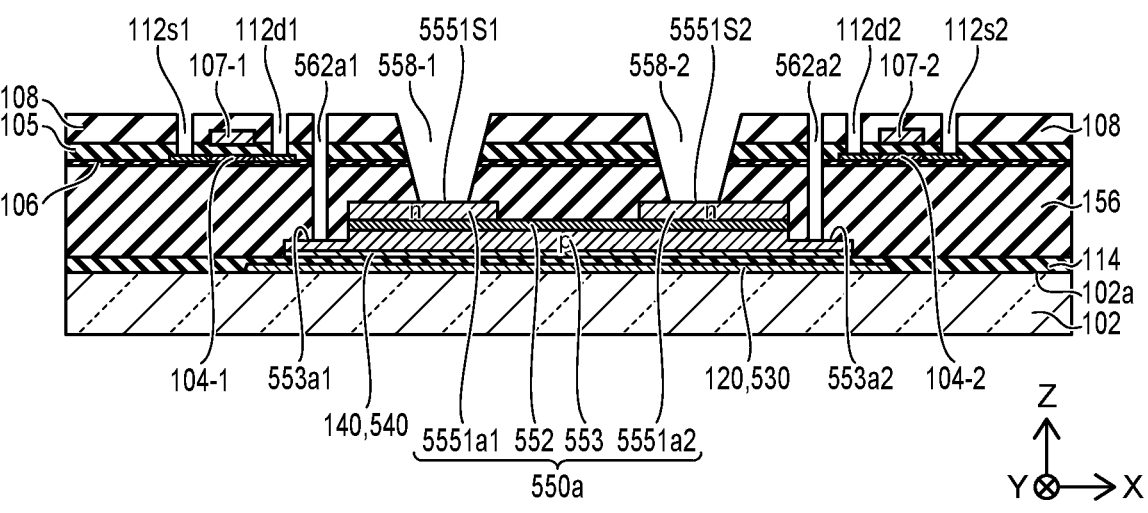
FIG. 29A
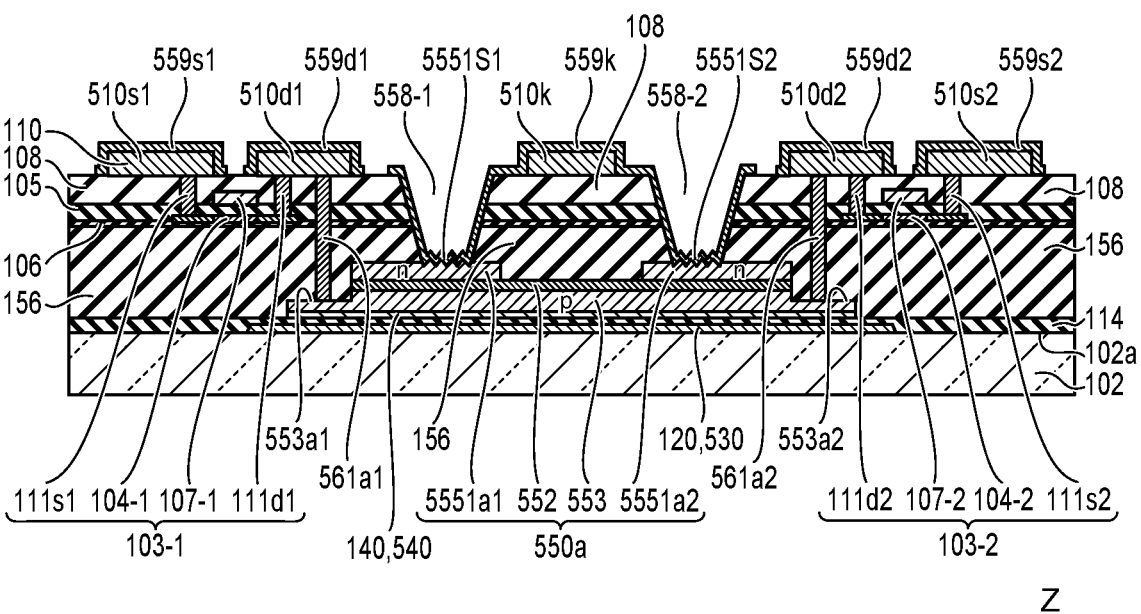
FIG. 29B
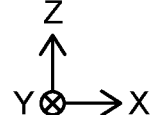

METHOD FOR MANUFACTURING IMAGE DISPLAY DEVICE AND IMAGE DISPLAY DEVICE

CROSS-REFERENCE TO RELATED APPLICATIONS

The present application is a bypass continuation of PCT Application No. PCT/JP2021/042842, filed Nov. 22, 2021, which claims priority to Japanese Application No. 2020-195366, filed Nov. 25, 2020. The contents of these applications are hereby incorporated by reference in their entireties.

BACKGROUND

Embodiments of the invention relate to a method for manufacturing an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality such as full HD, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a reduction of the yield may occur.

In known technology, a semiconductor layer that includes a light-emitting layer is grown on a Si substrate, an electrode is formed at the semiconductor layer, and bonding is subsequently performed to a circuit board in which a drive circuit is formed (see, e.g., Japanese Patent Publication No. 2002-141492).

SUMMARY

An embodiment of the invention provides a method for manufacturing an image display device and an image display device in which a transfer process of a light-emitting element is reduced, and the yield is increased.

A method for manufacturing an image display device according to an embodiment of the invention includes a process of forming a graphene-including layer on a first substrate, a process of forming a semiconductor layer including a light-emitting layer on the graphene-including layer, a process of forming a light-emitting element by patterning the semiconductor layer so that the light-emitting element includes a bottom surface on the graphene-including layer and a light-emitting surface that is a surface at a side opposite to the bottom surface, a process of forming a first insulating film that covers the first substrate, the graphene-including layer, and the light-emitting element, a process of forming a circuit element on the first insulating film, a process of forming a second insulating film that covers the first insulating film and the circuit element, a process of exposing the surface including the light-emitting surface by removing a portion of the first insulating film and a portion of the second insulating film, a process of forming a via that extends through the first and second insulating films, and a process of forming a wiring layer on the second insulating film. The light-emitting element includes a connection part formed on the graphene-including layer. The via is located between the wiring layer and the connection part and electrically connects the wiring layer and the connection part.

An image display device according to an embodiment of the invention includes a substrate including a first surface, a layer that includes graphene and is located on the first surface, a light-emitting element that is located on the graphene-including layer, includes a bottom surface on the graphene-including layer, and includes a surface including a light-emitting surface which is a surface at a side opposite to the bottom surface, a first insulating film that covers the graphene-including layer, the first surface, and a lateral surface of the light-emitting element, a circuit element located on the first insulating film, a second insulating film that covers the first insulating film and the circuit element, a via provided to extend through the first and second insulating films, and a wiring layer located on the second insulating film. The light-emitting element includes a first semiconductor layer, a light-emitting layer located on the first semiconductor layer, and a second semiconductor layer located on the light-emitting layer, wherein the first semiconductor layer, the light-emitting layer, and the second semiconductor layer are stacked in this order from the bottom surface toward the light-emitting surface. The via is located between the wiring layer and a connection part and electrically connects the first semiconductor layer and the wiring layer, and the connection part is formed on the graphene-including layer from the first semiconductor layer.

An image display device according to an embodiment of the invention includes a substrate including a first surface, a second part that is located on the first surface and is light-reflective, a layer that includes graphene and is located on the second part, a semiconductor layer that is located on the graphene-including layer, includes a bottom surface on the graphene-including layer, and includes multiple light-emitting surfaces at a surface at a side opposite to the bottom surface, a first insulating film that covers the first surface, the graphene-including layer, and a lateral surface of the semiconductor layer, multiple transistors located on the first insulating film, a second insulating film that covers the first insulating film and the multiple transistors, multiple vias provided to extend through the first and second insulating films, and a wiring layer that is located on the second insulating film and includes wiring parts electrically connected to the multiple transistors, the multiple light-emitting surfaces, and the multiple vias. An outer perimeter of the semiconductor layer is located within an outer perimeter of the second part in a plan view. The semiconductor layer includes a first semiconductor layer, a light-emitting layer located on the first semiconductor layer, and a second semiconductor layer located on the light-emitting layer, wherein the first semiconductor layer, the light-emitting layer, and the second semiconductor layer are stacked in this order from the bottom surface toward the light-emitting surface. The multiple vias are located between the wiring layer and a connection part and electrically connect the first semiconductor layer and the wiring layer, wherein the connection part is formed on the graphene-including layer from the first semiconductor layer.

According to an embodiment of the invention, a method for manufacturing an image display device is realized in which a transfer process of a light-emitting element is reduced, and the yield is increased.

According to an embodiment of the invention, an image display device is realized in which a transfer process of a light-emitting element is reduced, and the yield is increased.

BRIEF DESCRIPTION OF THE DRAWINGS

FIG. 29A is a schematic cross-sectional view illustrating the method for manufacturing the image display device of the modification of the fifth embodiment.

FIG. 29B is a schematic cross-sectional view illustrating the method for manufacturing the image display device of the modification of the fifth embodiment.

DETAILED DESCRIPTION

Figure 1:
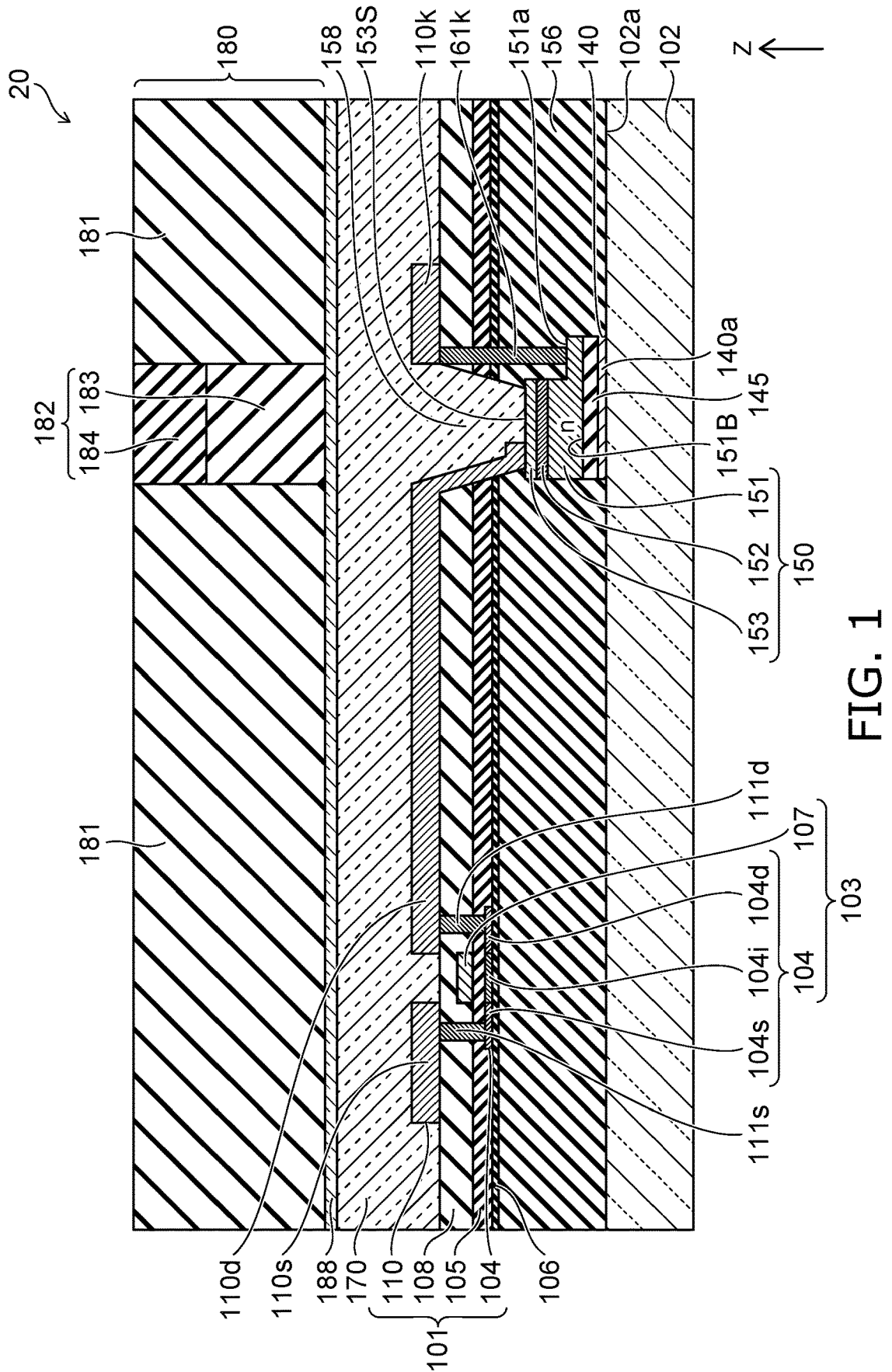
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are marked with the same reference numerals, and a detailed description is omitted as appropriate.

First Embodiment

FIG. 1 is a schematic cross-sectional view illustrating a portion of an image display device according to the embodiment.

The configuration of a subpixel 20 of the image display device of the embodiment is schematically shown in FIG. 1. A pixel that is included in an image displayed in the image display device includes multiple subpixels 20.

Hereinbelow, the description may use an XYZ three-dimensional coordinate system. The subpixels 20 are arranged in a two-dimensional planar configuration. The two-dimensional plane in which the subpixels 20 are arranged is taken as an XY plane. The subpixels 20 are arranged along an X-axis direction and a Y-axis direction. FIG. 1 is an auxiliary cross section along line AA' of FIG. 4 below, and is a cross-sectional view in which cross sections of multiple planes perpendicular to the XY plane are linked in one plane. In the other drawings as well, as in FIG. 1, in a cross-sectional view of multiple planes perpendicular to the XY plane, the X-axis and the Y-axis are not illustrated, and the Z-axis that is perpendicular to the XY plane is shown. That is, in these drawings, the plane perpendicular to the Z-axis is taken as the XY plane. Although the positive direction of the Z-axis may be called "up" or "above" and the negative direction of the Z-axis may be called "down" or "below" for convenience, directions along the Z-axis are not necessarily directions in which gravity acts. Also, a length in a direction along the Z-axis may be called a height.

The subpixel 20 includes a light-emitting surface 153S that is substantially parallel to the XY plane. The light-emitting surface 153S is a surface that radiates light mainly toward the positive direction of the Z-axis orthogonal to the XY plane.

As shown in FIG. 1, the subpixel 20 of the image display device includes a substrate 102, a graphene layer 140, a light-emitting element 150, a first inter-layer insulating film 156, a transistor 103, a second inter-layer insulating film 108, a via 161$k$, and a wiring layer 110.

According to the embodiment, the substrate 102 on which the light-emitting element 150 is formed is a light-transmitting substrate, e.g., a glass substrate. The substrate 102 includes a first surface 102$a$, and the light-emitting element 150 is formed on the first surface 102$a$. The light-emitting element 150 is driven by a TFT provided with the first inter-layer insulating film 156 interposed. The process of forming the circuit element that includes the TFT on a large glass substrate is advantageous in that the process is established for manufacturing a liquid crystal panel, an organic EL panel, etc., and an existing plant can be utilized.

The subpixel 20 further includes a color filter 180. The color filter (the wavelength conversion member) 180 is located on a surface resin layer 170 with a transparent thin film adhesive layer 188 interposed. The surface resin layer 170 is located on the second inter-layer insulating film 108 and the wiring layer 110.

The configuration of the subpixel 20 will now be described in detail.

The graphene layer 140 is located on the first surface 102$a$. The graphene layer 140 includes a graphene sheet 140$a$. The graphene sheet (the graphene-including layer) 140$a$ is provided for each light-emitting element 150, and the light-emitting element 150 is located on the graphene sheet 140$a$. The outer perimeter of the graphene sheet 140$a$ substantially matches the outer perimeter of the light-emitting element 150 when projected onto the XY plane. For example, the graphene layer 140 and the graphene sheet 140$a$ are layered bodies in which several layers to about 10 layers of single-layer graphene are stacked.

In the example, the light-emitting element 150 is located on the graphene sheet 140$a$ with a buffer layer 145 interposed. The outer perimeter of the buffer layer 145 substantially matches the outer perimeter of the light-emitting element 150 when projected onto the XY plane. In the example, the buffer layer 145 is formed of an insulative material and includes, for example, AlN, etc. The buffer layer 145 is mainly used to promote the growth of the semiconductor layer for forming the light-emitting element 150.

The light-emitting element 150 includes the light-emitting surface 153S and a bottom surface 151B. The light-emitting surface 153S is the surface at the side opposite to the bottom surface 151B of the light-emitting element 150. The light-emitting element 150 is a prismatic or cylindrical element that has the bottom surface 151B on the first surface 102$a$.

In the example, the bottom surface 151B of the light-emitting element 150 is a surface contacting the buffer layer 145.

The light-emitting element 150 includes an n-type semiconductor layer (a first semiconductor layer) 151, a light-emitting layer 152, and a p-type semiconductor layer (a second semiconductor layer) 153. The n-type semiconductor layer 151, the light-emitting layer 152, and the p-type semiconductor layer 153 are stacked in this order from the bottom surface 151B toward the light-emitting surface 153S. Accordingly, in the example, the n-type semiconductor layer 151 is provided in contact with the buffer layer 145.

The n-type semiconductor layer 151 includes a connection part 151a. For example, the connection part 151a is provided to protrude together with the buffer layer 145 and the graphene sheet 140a on the first surface 102a in one direction from the n-type semiconductor layer 151. The protruding direction is not limited to one direction and may be two or more directions, and the connection part 151a may be provided to protrude around the entire perimeter of the n-type semiconductor layer 151.

The height of the connection part 151a may be the same as the height of the n-type semiconductor layer 151 or less than the height of the n-type semiconductor layer 151, and the light-emitting element 150 is formed in a staircase shape. The connection part 151a is of the n-type and is electrically connected with the n-type semiconductor layer 151. The connection part 151a is connected to one end of the via 161k, and the n-type semiconductor layer 151 is electrically connected to the via 161k by the connection part 151a.

When the light-emitting element 150 has a prism shape, the shape of the light-emitting element 150 when projected onto the XY plane is, for example, substantially square or rectangular. When the shape of the light-emitting element 150 when projected onto the XY plane is polygonal including rectangular, the corner portions may be rounded. When the shape of the light-emitting element 150 when projected onto the XY plane is a cylindrical shape, the shape of the light-emitting element 150 when projected onto the XY plane is not limited to circular and may be, for example, elliptical. The degree of freedom of the layout is increased by appropriately selecting the shape, arrangement, etc., of the light-emitting element when projected onto the XY plane.

For example, a gallium nitride compound semiconductor that includes a light-emitting layer of $In_XAl_YGa_{1-X-Y}N$ ($0 \leq X$, $0 \leq Y$, and $X+Y<1$) or the like is favorably included in the light-emitting element 150. Hereinbelow, the gallium nitride compound semiconductor described above may be called simply gallium nitride (GaN). According to an embodiment of the invention, the light-emitting element 150 is a so-called light-emitting diode. The wavelength of the light emitted by the light-emitting element 150 is, for example, about 467 nm±30 nm. The wavelength of the light emitted by the light-emitting element 150 may be a bluish-violet light emission of about 410 nm±30 nm. The wavelength of the light emitted by the light-emitting element 150 is not limited to these values and can be set as appropriate.

The areas of the light-emitting layers 152 when projected onto the XY plane are set according to the light emission colors of the red, green, and blue subpixels. Hereinbelow, the area when projected onto the XY plane may be called simply the area. The area of the light-emitting layer 152 is appropriately set according to the luminous efficiency, the conversion efficiency of a color conversion part 182 of the color filter 180, etc. That is, the areas of the light-emitting layers 152 of the subpixels 20 of the light emission colors may be the same or may be different between the light emission colors. The area of the light-emitting layer 152 is the area of the region surrounded with the outer perimeter of the light-emitting layer 152 projected onto the XY plane.

The first inter-layer insulating film (a first insulating film) 156 covers the first surface 102a, the graphene layer 140, the buffer layer 145, and the light-emitting element 150. In the example, the first inter-layer insulating film 156 covers the lateral surface of the graphene sheet 140a, the lateral surface of the buffer layer 145, and the lateral surface of the light-emitting element 150. The first inter-layer insulating film 156 insulates the light-emitting elements 150 from each other. The first inter-layer insulating film 156 insulates the light-emitting element 150 from circuit elements such as the transistor 103, etc. The first inter-layer insulating film 156 provides a flat surface for forming a circuit 101 including circuit elements such as the transistor 103, etc. By covering the light-emitting element 150, the first inter-layer insulating film 156 protects the light-emitting element 150 from thermal stress when forming the transistor 103, etc.

The first inter-layer insulating film 156 is formed of an organic or inorganic insulating material. The insulating material included in the first inter-layer insulating film 156 is favorably a white resin. The white resin reflects the light of the light-emitting element 150 emitted in the lateral direction, returning light caused by the interface of the color filter 180, etc.; therefore, the use of a white resin as the first inter-layer insulating film 156 contributes to the substantial improvement of the luminous efficiency of the light-emitting element 150.

The white resin is formed by dispersing fine scattering particles having a Mie (Mie) scattering effect in a silicon resin such as SOG (Spin On Glass) or the like, a transparent resin such as a novolak phenolic resin, etc. The fine scattering particles are colorless or white and have a diameter of about ⅒ to about several times the wavelength of the light emitted by the light-emitting element 150. The fine scattering particles that are favorably used have a diameter of about ½ of the light wavelength. For example, $TiO_2$, $Al_2O_3$, ZnO, etc., are examples of such a fine scattering particle.

The white resin also can be formed by utilizing many fine voids or the like dispersed in a transparent resin. When whitening the first inter-layer insulating film 156, for example, a $SiO_2$ film or the like that is formed by ALD (Atomic-Layer-Deposition) or CVD may be used instead of SOG, etc.

The first inter-layer insulating film 156 may be a black resin. By using a black resin as the first inter-layer insulating film 156, the scattering of the light inside the subpixel 20 is suppressed, and stray light is more effectively suppressed. An image display device in which stray light is suppressed can display a sharper image.

A TFT underlying film 106 is formed over the first inter-layer insulating film 156. The TFT underlying film 106 is provided to ensure flatness when forming the transistor 103, and to protect the TFT channel 104 of the transistor 103 from contamination, etc., in the heat processing. The TFT underlying film 106 is, for example, an insulating film of $SiO_2$, etc.

The transistor 103 is formed on the TFT underlying film 106. In addition to the transistor 103, other circuit elements such as transistors, capacitors, etc., are formed on the TFT underlying film 106, and the circuit 101 is configured using wiring, etc. For example, in FIG. 3 below, the transistor 103 corresponds to a drive transistor 26. Also, a select transistor 24, a capacitor 28, etc., are circuit elements in FIG. 3. The circuit 101 includes the TFT channel 104, an insulating layer 105, the second inter-layer insulating film 108, vias 111*s* and 111*d*, and the wiring layer 110.

In the example, the transistor 103 is a p-channel thin film transistor (Thin Film Transistor, TFT). The transistor 103 includes the TFT channel 104 and a gate 107. Favorably, the TFT channel 104 is formed by a low-temperature polysilicon (Low Temperature Poly Silicon, LTPS) process. In the LTPS process, the TFT channel 104 is formed by polycrystallizing and activating a region of amorphous Si formed on the TFT underlying film 106. For example, laser annealing with a laser is used to polycrystallize and activate the amorphous Si region. The TFT that is formed by the LTPS process has sufficiently high mobility.

The TFT channel 104 includes regions 104*s*, 104*i*, and 104*d*. The regions 104*s*, 104*i*, and 104*d* each are located on the TFT underlying film 106. The region 104*i* is located between the region 104*s* and the region 104*d*. The regions 104*s* and 104*d* are doped with an impurity such as boron (B) or the like by ion implantation, etc., to form p-type semiconductor regions, and have ohmic connections with the vias 111*s* and 111*d*.

The gate 107 is located on the TFT channel 104 with the insulating layer 105 interposed. The insulating layer 105 is provided to insulate the TFT channel 104 and the gate 107 and insulate from other adjacent circuit elements. The current that flows between the regions 104*s* and 104*d* can be controlled by a channel that is formed in the region 104*i* when a potential lower than that of the region 104*s* is applied to the gate 107.

The insulating layer 105 is, for example, $SiO_2$. The insulating layer 105 may be a multilevel insulating layer that includes $SiO_2$, $Si_3N_4$, etc., according to the covered region.

For example, the gate 107 may be formed of polycrystalline Si or may be formed of a refractory metal such as W, Mo, etc. Generally, the polycrystalline Si film of the gate 107 is formed by CVD, etc.

The second inter-layer insulating film (a second insulating film) 108 is located on the gate 107 and the insulating layer 105. For example, the second inter-layer insulating film 108 is formed of the same material as the first inter-layer insulating film 156. That is, the second inter-layer insulating film 108 is formed of a white resin, an inorganic film of $SiO_2$, etc. The second inter-layer insulating film 108 also functions as a planarization film for forming the wiring layer 110.

The first inter-layer insulating film 156, the TFT underlying film 106, the insulating layer 105, and the second inter-layer insulating film 108 are configured as described above and therefore are not provided above the light-emitting surface 153S. That is, an opening 158 is formed by removing portions of the first inter-layer insulating film 156, the TFT underlying film 106, the insulating layer 105, and the second inter-layer insulating film 108. The light-emitting surface 153S is exposed via the opening 158. As described below, the opening 158 is filled with the surface resin layer 170.

The vias 111*s* and 111*d* are provided to extend through the second inter-layer insulating film 108 and the insulating layer 105. The wiring layer 110 is formed on the second inter-layer insulating film 108. The wiring layer 110 includes multiple wiring parts that may have different potentials. In the example, the wiring layer 110 includes wiring parts 110*s*, 110*d*, and 110*k*.

A portion of the wiring part 110*s* is located above the region 104*s*. For example, another portion of the wiring part 110*s* is connected to a power supply line 3 shown in FIG. 3 below. A portion of the wiring part 110*d* is located above the region 104*d*. Another portion of the wiring part (a second wiring part) 110*d* is connected to a surface including the light-emitting surface 153S. A portion of the wiring part 110*k* is located above the connection part 151*a*. For example, another portion of the wiring part 110*k* is connected to a ground line 4 shown in FIG. 3 below.

In FIG. 1 and subsequent cross-sectional views, unless otherwise noted, the reference numeral of the wiring layer is displayed at a position beside one wiring part included in the wiring layer to be marked with the reference numeral.

The via 111*s* is located between the wiring part 110*s* and the region 104*s* and electrically connects the wiring part 110*s* and the region 104*s*. The via 111*d* is located between the wiring part 110*d* and the region 104*d* and electrically connects the wiring part 110*d* and the region 104*d*.

The wiring part 110*s* is connected to the region 104*s* by the via 111*s*. The region 104*s* is a source region of the transistor 103. Accordingly, the source region of the transistor 103 is electrically connected to the power supply line 3 by the via 111*s* and the wiring part 110*s*.

The wiring part 110*d* is connected to the region 104*d* by the via 111*d*. The region 104*d* is a drain region of the transistor 103. Accordingly, the drain region of the transistor 103 is electrically connected to the p-type semiconductor layer 153 by the via 111*d* and the wiring part 110*d*.

The via 161*k* is provided to extend through the second inter-layer insulating film 108, the insulating layer 105, the TFT underlying film 106, and the first inter-layer insulating film 156. The via 161*k* is located between the connection part 151*a* and the wiring part (a first wiring part) 110*k* and electrically connects the wiring part 110*k* and the connection part 151*a*. Accordingly, the n-type semiconductor layer 151 is electrically connected to the ground line 4 via the connection part 151*a*, the via 161*k*, and the wiring part 110*k*.

For example, the wiring layer 110 and the vias 111*s*, 111*d*, and 161*k* are formed of Al and/or Cu, which are alone, in an alloy, in a stacked film with Ti or the like, etc. For example, in a stacked film of Al and Ti, Al is stacked on a thin film of Ti, and then Ti is stacked on the Al.

The surface resin layer 170 covers the second inter-layer insulating film 108 and the wiring layer 110. The surface resin layer 170 also is filled into the opening 158. The surface resin layer 170 covers over the light-emitting surface 153S. The surface resin layer 170 that is filled into the opening 158 covers the first inter-layer insulating film 156, the TFT underlying film 106, the insulating layer 105, and a portion of the lateral surface of the second inter-layer insulating film 108. The surface resin layer 170 is a transparent resin, protects the second inter-layer insulating film 108 and the wiring layer 110, and provides a planarized surface for bonding the color filter 180.

The color filter 180 includes a light-shielding part 181 and the color conversion part 182. The color conversion part 182 is located directly above the light-emitting surface 153S of the light-emitting element 150 to correspond to the shape of the light-emitting surface 153S. The portion of the color filter 180 other than the color conversion part 182 is the light-shielding part 181. The light-shielding part 181 is a so-called black matrix that reduces blur due to color mixing of the light emitted from the adjacent color conversion parts 182, etc., and makes it possible to display a sharp image.

The color conversion part 182 has one, two, or more layers. FIG. 1 shows a case where the color conversion part 182 has two layers. Whether the color conversion part 182 has one layer or two layers is determined by the color, i.e., the wavelength, of the light emitted by the subpixel 20. When the light emission color of the subpixel 20 is red, it is favorable for the color conversion part 182 to have the two layers of a color conversion layer 183 and a filter layer 184 that transmits red light. When the light emission color of the subpixel 20 is green, it is favorable for the color conversion part 182 to have the two layers of the color conversion layer 183 and the filter layer 184 that transmits green light. When the light emission color of the subpixel 20 is blue, it is favorable to use one layer.

When the color conversion part 182 has two layers, the first layer is the color conversion layer 183, and the second layer is the filter layer 184. The color conversion layer 183 of the first layer is located at a position that is closer to the light-emitting element 150. The filter layer 184 is stacked on the color conversion layer 183.

The color conversion layer 183 converts the wavelength of the light emitted by the light-emitting element 150 into the desired wavelength. When the subpixel 20 emits red, for example, light of the wavelength of the light-emitting element 150, i.e., 467 nm±30 nm, is converted into light of a wavelength of about 630 nm±20 nm. When of the subpixel 20 emits green, for example, light of the wavelength of the light-emitting element 150, i.e., 467 nm±30 nm, is converted into light of a wavelength of about 532 nm±20 nm.

The filter layer 184 shields the wavelength component of the blue light emission that remains without undergoing color conversion by the color conversion layer 183.

When the color of the light emitted by the subpixel 20 is blue, the output may be via the color conversion layer 183 and may be as-is without passing through the color conversion layer 183. When the wavelength of the light emitted by the light-emitting element 150 is about 467 nm±30 nm, the light may be output without passing through the color conversion layer 183. When the wavelength of the light emitted by the light-emitting element 150 is 410 nm±30 nm, it is favorable to provide a one-layer color conversion layer 183 to convert the wavelength of the output light into about 467 nm±30 nm.

The subpixel 20 may include the filter layer 184 even when the subpixel 20 is blue. By providing the filter layer 184 through which the blue light passes in the blue subpixel 20, the occurrence of a micro external light reflection other than blue light at the surface of the light-emitting element 150 is suppressed.

Figure 2:
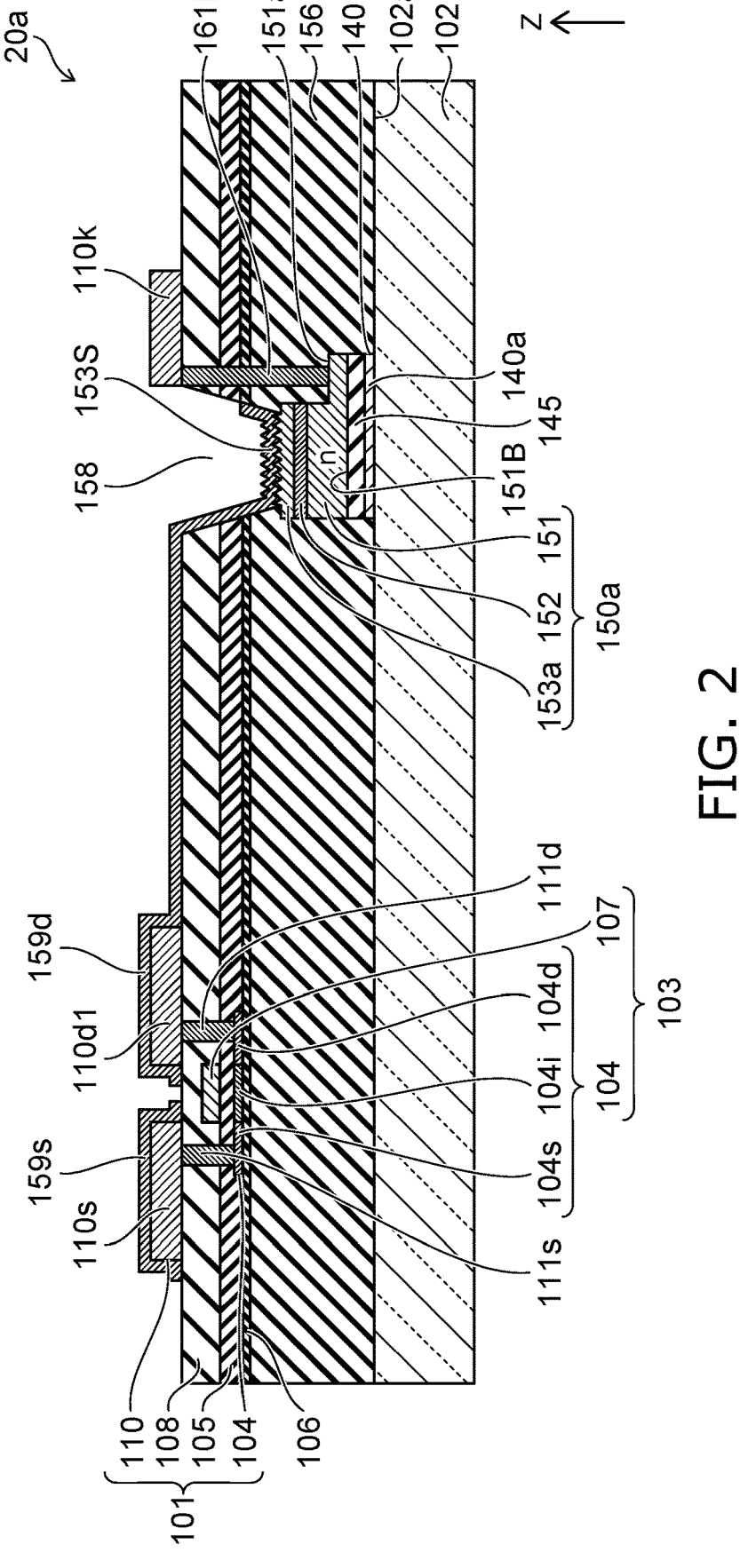
FIG. 2 is a cross-sectional view schematically showing a portion of a modification of the image display device according to the first embodiment.

FIG. 2 is a cross-sectional view schematically showing a portion of a modification of the image display device according to the embodiment.

To avoid complexity in FIG. 2, the surface resin layer 170, the transparent thin film adhesive layer 188, and the color filter 180 are not illustrated. The structural component of the surface resin layer 170 and higher parts is located on the second inter-layer insulating film 108, on the wiring layer 110, and in the opening 158.

The connection method between a light-emitting element 150a and a wiring part 110d1 in a subpixel 20a according to the modification is different from the connection method between the light-emitting element 150 and the wiring part 110d according to the first embodiment described above. The modification also differs from the first embodiment in that a light-transmitting electrode 159s is provided over the wiring part 110s. Otherwise, the modification is the same as the first embodiment, the same components are marked with the same reference numerals, and a detailed description is omitted as appropriate.

As shown in FIG. 2, the subpixel 20a includes the light-emitting element 150a, the wiring part 110d1, and a light-transmitting electrode 159d. A portion of the wiring part 110d1 is located above the region 104d and the via 111d.

A portion of the wiring part 110d1 is connected to the region 104d by the via 111d. The other portion of the wiring part 110d1 does not extend to reach the light-emitting surface 153S, and is not directly connected to the light-emitting surface 153S.

The light-transmitting electrode 159d is provided over the wiring part 110d1. The light-transmitting electrode 159d is provided over the light-emitting surface 153S. The light-transmitting electrode 159d also is located between the wiring part 110d1 and the light-emitting surface 153S and electrically connects the wiring part 110d1 and the light-emitting surface 153S.

The light-transmitting electrode 159s is provided over the wiring part 110s. The light-transmitting electrode 159d and the light-transmitting electrode 159s are formed of transmissive conductive films. Transmissive conductive films favorably include ITO films, ZnO films, etc. Although a light-transmitting electrode is not provided on the wiring part 110k in the example, a light-transmitting electrode also may be provided on the wiring part 110k.

Favorably, the light-emitting surface 153S is roughened. The light extraction efficiency of the light-emitting element 150 can be increased when the light-emitting surface 153S is a rough surface.

By providing the light-transmitting electrode 159d on the light-emitting surface 153S, the connection area between the light-transmitting electrode 159d and the p-type semiconductor layer 153 can be increased, the area of the light-emitting surface 153S can be increased, and therefore the luminous efficiency can be increased. When the light-emitting surface 153S is a rough surface, the luminous efficiency can be further increased by increasing the connection area between the light-emitting surface 153S and the light-transmitting electrode 159d and reducing the contact resistance.

The embodiment can include either of the configurations of the subpixels 20 and 20a described above. According to the other embodiments described below as well, either a direct electrical connection by metal circuitry an electrical connection by a light-transmitting electrode.

Figure 3:
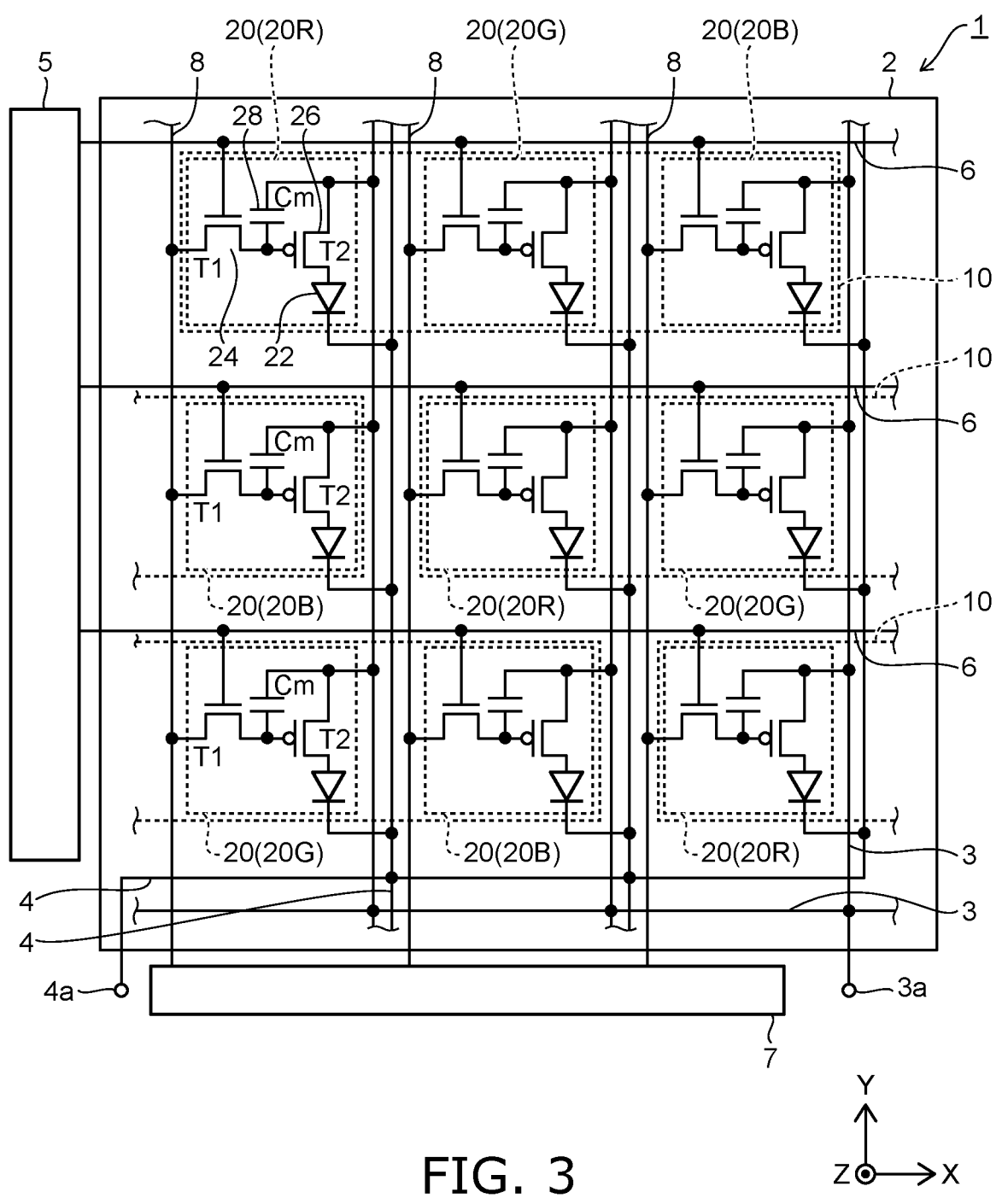
FIG. 3 is a schematic block diagram illustrating the image display device of the first embodiment.

FIG. 3 is a schematic block diagram illustrating the image display device according to the embodiment.

As shown in FIG. 3, the image display device 1 of the embodiment includes a display region 2. The subpixels 20 are arranged in the display region 2. For example, the subpixels 20 are arranged in a lattice shape. For example, n subpixels 20 are arranged along the X-axis, and m subpixels 20 are arranged along the Y-axis.

A pixel 10 includes multiple subpixels 20 that emit light of different colors. A subpixel 20R emits red light. A subpixel 20G emits green light. A subpixel 20B emits blue light. The light emission color and luminance of one pixel 10 is determined by the three types of the subpixels 20R, 20G, and 20B emitting light of the desired luminances.

One pixel 10 includes the three subpixels 20R, 20G, and 20B; for example, the subpixels 20R, 20G, and 20B are arranged in a straight line along the X-axis as shown in FIG. 3. In each pixel 10, subpixels of the same color may be arranged in the same column, or subpixels of different colors may be arranged in each column as in the example.

The image display device 1 further includes the power supply line 3 and the ground line 4. The power supply line 3 and the ground line 4 are wired in a lattice shape along the arrangement of the subpixels 20. The power supply line 3 and the ground line 4 are electrically connected to each subpixel 20, and electrical power is supplied to each subpixel 20 from a DC power supply connected between a power supply terminal 3a and the GND terminal 4a. The power supply terminal 3a and the GND terminal 4a are located respectively at end portions of the power supply line 3 and the ground line 4, and are connected to a DC power supply circuit located outside the display region 2. The power supply terminal 3a supplies a positive voltage when referenced to the GND terminal 4a.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the Y-axis direction of the outer edge of the display region 2. The row selection circuit 5 is electrically connected to the subpixel 20 of each column via the scanning line 6, and supplies a select signal to each subpixel 20.

The signal voltage output circuit 7 is located along the X-axis direction of the outer edge of the display region 2. The signal voltage output circuit 7 is electrically connected to the subpixel 20 of each row via the signal line 8, and supplies a signal voltage to each subpixel 20.

The subpixel 20 includes a light-emitting element 22, the select transistor 24, the drive transistor 26, and the capacitor 28. In FIG. 3 and in FIG. 4 below, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is a p-channel TFT, and an anode electrode of the light-emitting element 22 is connected to a drain electrode of the drive transistor 26. Major electrodes of the drive transistor 26 and the select transistor 24 are drain electrodes and source electrodes. The anode electrode of the light-emitting element 22 is connected to a p-type semiconductor layer. The cathode electrode of the light-emitting element is connected to an n-type semiconductor layer. A series circuit of the light-emitting element 22 and the drive transistor 26 is connected between the power supply line 3 and the ground line 4. The drive transistor 26 corresponds to the transistor 103 of FIG. 1, and the light-emitting element 22 corresponds to the light-emitting element 150 of FIG. 1. The current that flows in the light-emitting element 22 is determined by the voltage applied between the gate and source of the drive transistor 26, and the light-emitting element 22 emits light of a luminance corresponding to the current that flows.

The select transistor 24 is connected between the signal line 8 and the gate electrode of the drive transistor 26 via a major electrode. The gate electrode of the select transistor 24 is connected to the scanning line 6. The capacitor 28 is connected between the power supply line 3 and the gate electrode of the drive transistor 26.

The row selection circuit 5 selects one row from the arrangement of m rows of the subpixels 20 and supplies a select signal to the scanning line 6. The signal voltage output circuit 7 supplies a signal voltage that has an analog voltage value necessary for each subpixel 20 of the selected row. The signal voltage is applied between the gate and source of the drive transistor 26 of the subpixels 20 of the selected row.

The signal voltage is maintained by the capacitor 28. The drive transistor 26 allows a current corresponding to the signal voltage to flow in the light-emitting element 22. The light-emitting element 22 emits light of a luminance corresponding to the current that flows.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. An image is displayed in the display region 2 by each pixel 10 emitting the light emission color and luminance determined by the light emission color and luminance emitted by the subpixels 20 of the colors of RGB.

Figure 4:
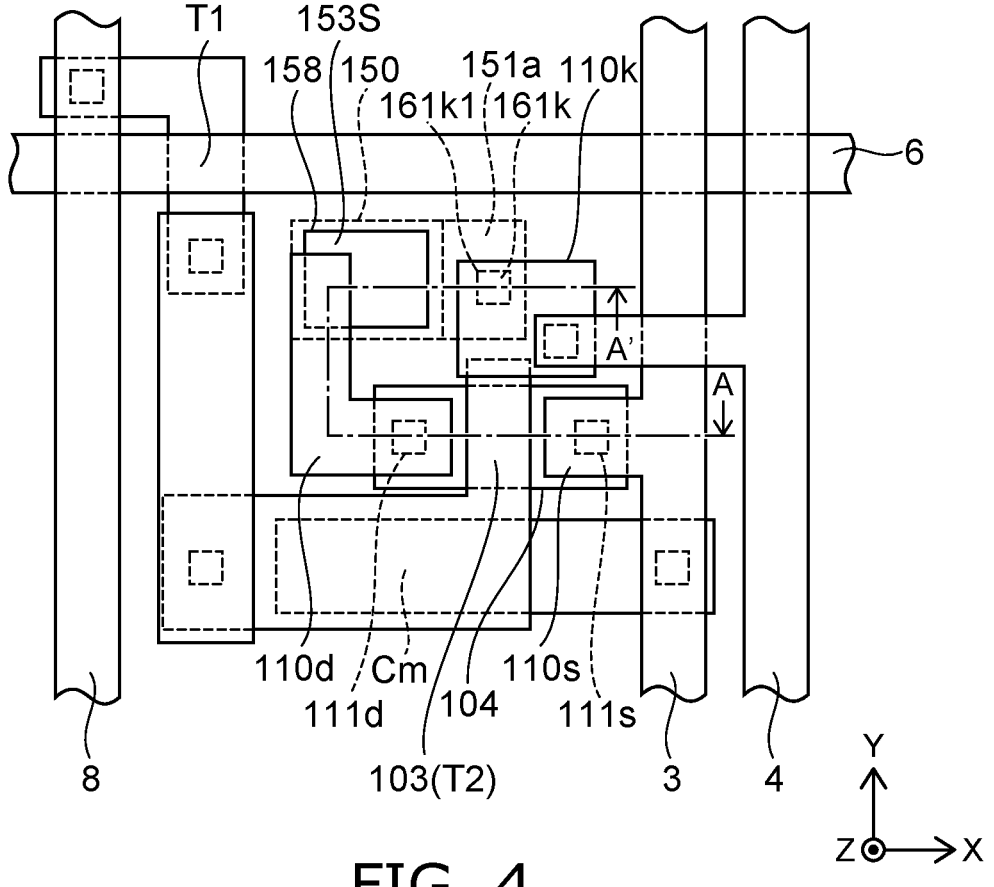
FIG. 4 is a schematic plan view illustrating a portion of the image display device of the first embodiment.

FIG. 4 is a schematic plan view illustrating a portion of the image display device of the embodiment.

According to the embodiment as described in reference to FIG. 1, the light-emitting element 150 and the drive transistor 103 are stacked in the Z-axis direction with the first inter-layer insulating film 156 interposed. The light-emitting element 150 corresponds to the light-emitting element 22 in FIG. 3. The drive transistor 103 corresponds to the drive transistor 26 in FIG. 3 and is labeled as T2.

As shown in FIG. 4, the cathode electrode of the light-emitting element 150 is provided by the connection part 151a. The connection part 151a is located in a lower layer than the transistor 103 or the wiring layer 110. The connection part 151a is electrically connected to the wiring part 110k by the via 161k. More specifically, one end of the via 161k is connected to the connection part 151a. The other end of the via 161k is connected to the wiring part 110k via a contact hole 161k1.

The anode electrode of the light-emitting element 150 is provided by the p-type semiconductor layer 153 shown in FIG. 1. The wiring part 110d extends to a surface including the light-emitting surface 153S via the opening 158. The p-type semiconductor layer 153 is connected to one end of the wiring part 110d via the surface including the light-emitting surface 153S. The surface including the light-emitting surface 153S is a surface in the same plane as the light-emitting surface 153S. One end of the wiring part 110d is connected to the surface including the light-emitting surface 153S, and the remaining surface is the light-emitting surface 153S.

Another end of the wiring part 110d is connected to the drain electrode of the transistor 103 by the via 111d. The drain electrode of the transistor 103 is the region 104d shown in FIG. 1. The source electrode of the transistor 103 is connected to the wiring part 110s by the via 111s. The source electrode of the transistor 103 is the region 104s shown in FIG. 1. In the example, the wiring layer 110 includes the power supply line 3, and the wiring part 110s is connected to the power supply line 3.

In the example, the ground line 4 is located in a higher layer than the wiring layer 110. Although not illustrated in FIG. 1, an inter-layer insulating film also is provided on the wiring layer 110. The ground line 4 is located on the inter-layer insulating film of the uppermost layer and insulated from the power supply line 3.

Thus, by using the via 161k, the light-emitting element 150 can be electrically connected to the wiring layer 110 located in a higher layer than the light-emitting element 150. Also, the light-emitting element 150 can be electrically connected to the wiring layer 110 located in a higher layer than the light-emitting element 150 by providing the opening 158 that exposes the light-emitting surface 153S.

A method for manufacturing the image display device 1 of the embodiment will now be described.

FIGS. 5A to 7B are schematic cross-sectional views illustrating a method for manufacturing the image display device of the embodiment.

Figure 5A:
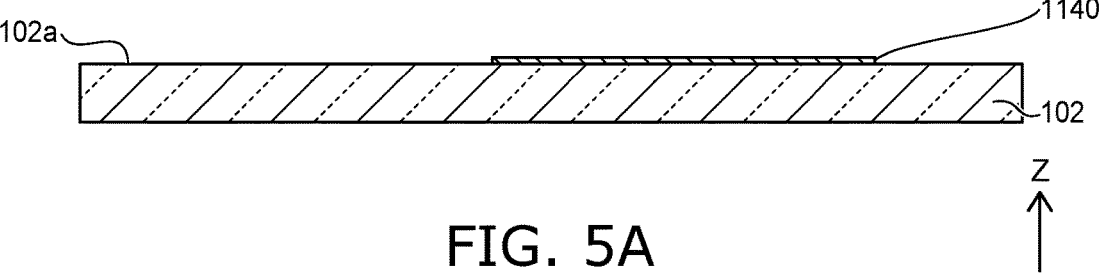
FIG. 5A is a schematic cross-sectional view illustrating a method for manufacturing the image display device of the first embodiment.

According to the method for manufacturing the image display device 1 of the embodiment as shown in FIG. 5A, a substrate (a first substrate) 102 is prepared. The substrate 102 is a light-transmitting substrate and is, for example, a substantially rectangular glass substrate of about 1500 mm×1800 mm. A graphene layer 1140 is formed on the first surface 102a. The graphene layer 1140 is a graphene-including layer and favorably is formed by stacking several layers to about 10 layers of single-layer graphene layers. The graphene layer 1140 that is cut to the appropriate size and shape is positioned at the prescribed position of the first surface 102a and is held by suction to the substrate 102 due to the flatness of the first surface 102a. For example, the graphene layer 1140 may be bonded onto the first surface 102a by an adhesive, etc.

Figure 5B:
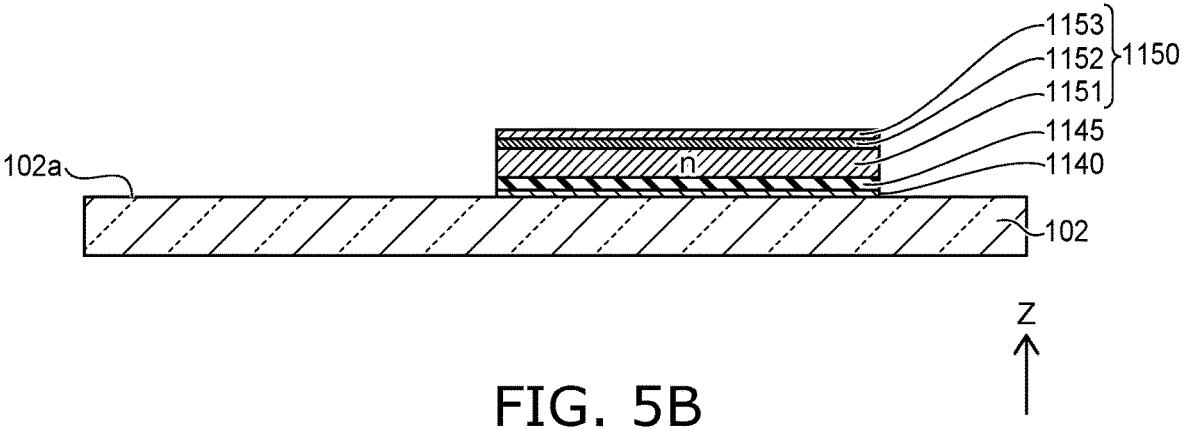
FIG. 5B is a schematic cross-sectional view illustrating the method for manufacturing the image display device of the first embodiment.

As shown in FIG. 5B, a buffer layer 1145 is formed over the graphene layer 1140 shown in FIG. 5A. For example, the buffer layer 1145 is formed by physical vapor deposition such as sputtering, etc. The GaN crystal growth can be promoted by providing the buffer layer 1145. As long as the GaN crystal growth is promoted, the buffer layer 1145 may be any type of material, and may be an insulating material or a conductive material such as a metal, etc. For example, the buffer layer may be a metal layer including a single crystal of Hf, Cu, etc. Also, as in other embodiments described below, the formation of the buffer layer may be omitted, and the semiconductor layer may be directly grown on the graphene layer.

A semiconductor layer 1150 is formed over the buffer layer 1145. The semiconductor layer 1150 includes an n-type semiconductor layer 1151, a light-emitting layer 1152, and a p-type semiconductor layer 1153 formed in this order from the buffer layer 1145 side toward the positive direction of the Z-axis. The semiconductor layer 1150 includes, for example, GaN, and more specifically, $In_XAl_YGa_{1-X-Y}N$ ($0 \leq X$, $0 \leq Y$, and $X+Y<1$), etc. In the initial growth of the semiconductor layer 1150, crystal defects caused by a mismatch of the crystal lattice easily occur, and crystals having GaN as a major component generally have n-type semiconductor characteristics. Therefore, the yield can be increased by growing from the n-type semiconductor layer 1151 on the buffer layer 1145.

To form the semiconductor layer 1150, physical vapor deposition such as vapor deposition, ion beam deposition, molecular beam epitaxy (Molecular Beam Epitaxy, MBE), sputtering, or the like is used, and it is favorable to use low-temperature sputtering. Low-temperature sputtering is favorable because a lower temperature when forming is possible by assisting with light and/or plasma. There are cases where 1000° C. is exceeded in epitaxial growth by MOCVD. In contrast, it is known that a GaN crystal including a light-emitting layer can be epitaxially grown on the graphene layer 1140 in low-temperature sputtering at a low temperature of about 400° C. to about 700° C. (see Non-Patent Literature 1 and 2, etc.). Such low-temperature sputtering is self-aligning when forming the semiconductor layer 1150 on a circuit board including TFTs, etc., formed by a LTPS process.

By using appropriate film formation technology, the semiconductor layer 1150 that is monocrystallized and includes the light-emitting layer 1152 is formed on the buffer layer 1145 by growing the GaN semiconductor layer 1150 on the graphene layer 1140 and the buffer layer 1145. The graphene layer 1140 is cut to the appropriate size and shape and is provided on the first surface 102a; therefore, the buffer layer 1145 is grown over the graphene layer 1140 and is not grown at locations at which the graphene layer 1140 does not exist. The semiconductor layer 1150 is grown over the buffer layer 1145 and likewise is not grown at locations at which the buffer layer 1145 does not exist. There are also cases where amorphous deposits including Al, Ga, etc., that are materials of the growth species are deposited in the growth processes of the buffer layer 1145 and the semiconductor layer 1150 at locations at which the graphene layer 1140 does not exist.

Figures 6A, 6B:
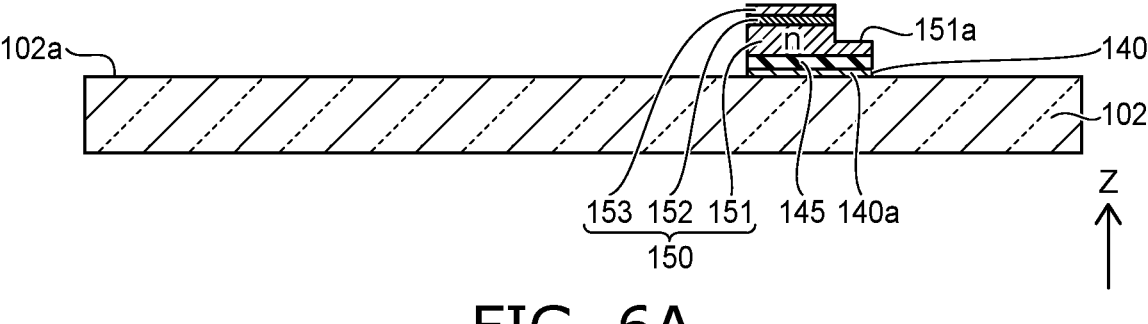
FIG. 6A is a schematic cross-sectional view illustrating the method for manufacturing the image display device of the first embodiment.
FIG. 6B is a schematic cross-sectional view illustrating the method for manufacturing the image display device of the first embodiment.

As shown in FIG. 6A, the light-emitting element 150 is formed by patterning the semiconductor layer 1150 shown in FIG. 5B into the desired shape by etching. In the formation process of the light-emitting element 150, the connection part 151a is formed, and the other portions are subsequently formed by further etching. The light-emitting element 150 that includes the connection part 151a protruding in one direction on the first surface 102a from the n-type semiconductor layer 151 can be formed thereby. For example, a dry etching process is used to form the light-emitting element 150, and it is favorable to use anisotropic plasma etching (Reactive Ion Etching, RIE). When deposits are formed at locations at which the graphene layer 1140 does not exist, the deposits that are formed are removed in the etching process forming the light-emitting element 150.

The graphene layer 1140 shown in FIG. 5B is shaped into the graphene sheet 140a having an outer perimeter shape substantially matching the shape of the outer perimeter of the connection part 151a by over-etching in the formation process of the connection part 151a. Likewise, the buffer layer 1145 shown in FIG. 5B is shaped into the buffer layer 145 having an outer perimeter shape substantially matching the shape of the outer perimeter of the connection part 151a by over-etching in the formation process of the connection part 151a.

As shown in FIG. 6B, the first inter-layer insulating film (the first insulating film) 156 is formed to cover the first surface 102a, the graphene layer 140, the buffer layer 145, and the light-emitting element 150. The TFT underlying film 106 is formed by, for example, CVD, etc., on the first inter-layer insulating film 156.

The TFT channel 104 is formed at the prescribed position on the TFT underlying film 106. For example, the transistor 103 is formed as follows in a LTPS process. First, amorphous Si is formed as a film in the shape of the TFT channel 104. For example, CVD or the like is used to form the amorphous Si. The TFT channel 104 is formed by performing laser annealing to polycrystallize the amorphous Si film that is formed.

Subsequently, for example, the source electrode and drain electrode of the TFT channel 104 are formed as p-type semiconductor regions by introducing an impurity such as boron (B) or the like into the regions 104s and 104d by using ion implantation technology, etc.

The insulating layer 105 is formed over the TFT underlying film 106 and the TFT channel 104. For example, the insulating layer 105 is formed by CVD, etc. The gate 107 is formed at a position on the TFT channel 104 with the insulating layer 105 interposed. An appropriate formation method according to the material of the gate 107 is used to form the gate 107. For example, when the gate 107 is polycrystalline Si, the gate 107 is formed by performing laser annealing to polycrystallize amorphous Si similarly to the TFT channel 104. Or, the gate 107 may be formed by patterning by etching a refractory metal film of W, Mo, etc., formed by sputtering.

The second inter-layer insulating film (the second insulating film) 108 is formed over the insulating layer 105 and over the gate 107. An appropriate formation method according to the material of the second inter-layer insulating film 108 is applied to form the second inter-layer insulating film 108. For example, technology such as ALD, CVD, or the like is used when the second inter-layer insulating film 108 is formed of $SiO_2$.

It is sufficient for the flatness of the second inter-layer insulating film 108 to be such that the wiring layer 110 can be formed on the second inter-layer insulating film 108, and a planarizing process is not necessarily performed. The number of processes can be reduced when a planarizing process is not performed on the second inter-layer insulating film 108. For example, when there is a location at the periphery of the light-emitting element 150 at which the thickness of the second inter-layer insulating film 108 is thin, a sufficient opening diameter can be ensured because the depth of a via hole 162k described below is shallow. It is therefore easier to ensure the electrical connection by the via, and the reduction of the yield due to defects of the electrical characteristics can be suppressed.

Figures 7A, 7B:
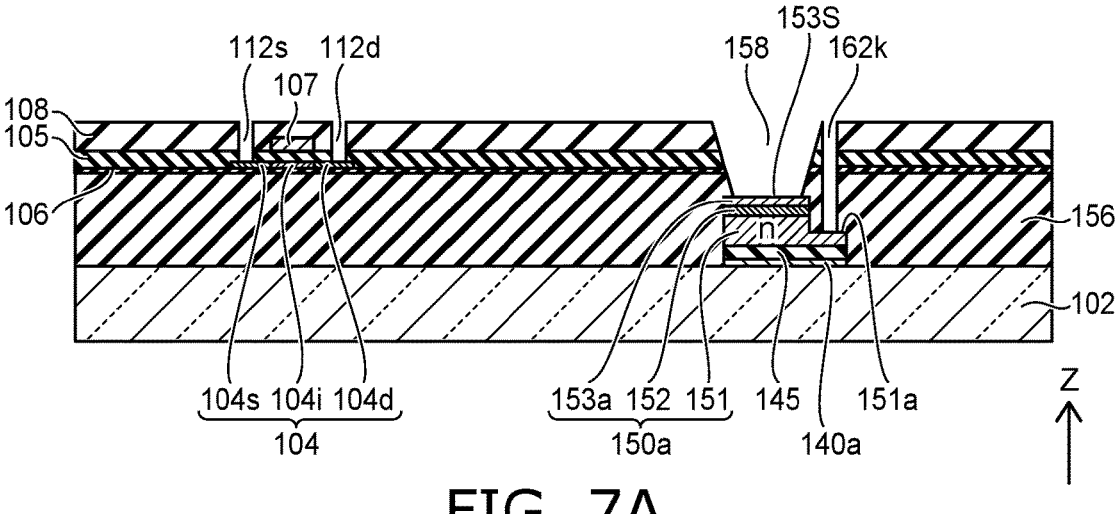
FIG. 7A is a schematic cross-sectional view illustrating the method for manufacturing the image display device of the first embodiment.
FIG. 7B is a schematic cross-sectional view illustrating the method for manufacturing the image display device of the first embodiment.

As shown in FIG. 7A, the via hole 162k is formed to extend through the second inter-layer insulating film 108, the insulating layer 105, the TFT underlying film 106, and the first inter-layer insulating film 156 and reach the connection part 151a. The opening 158 is formed to reach the light-emitting surface 153S by removing a portion of the second inter-layer insulating film 108, a portion of the insulating layer 105, a portion of the TFT underlying film 106, and a portion of the first inter-layer insulating film 156. A via hole 112d is formed to extend through the second inter-layer insulating film 108 and the insulating layer 105 and reach the region 104d. A via hole 112s is formed to extend through the second inter-layer insulating film 108 and the insulating layer 105 and reach the region 104s. For example, RIE or the like is used to form the via holes and openings.

As shown in FIG. 7B, the via 161k is formed by filling a conductive material into the via hole 162k shown in FIG. 7A. The vias 111d and 111s are formed by filling a conductive material respectively into the via holes 112d and 112s shown in FIG. 7A. Subsequently, the wiring layer 110 that includes the wiring parts 110k, 110d, and 110s is formed on the second inter-layer insulating film 108. The wiring parts 110k, 110d, and 110s are connected respectively to the vias 161k, 111d, and 111s. The wiring layer 110 may be formed simultaneously with the formation of the vias 161k, 111d, and 111s.

Figure 8A:
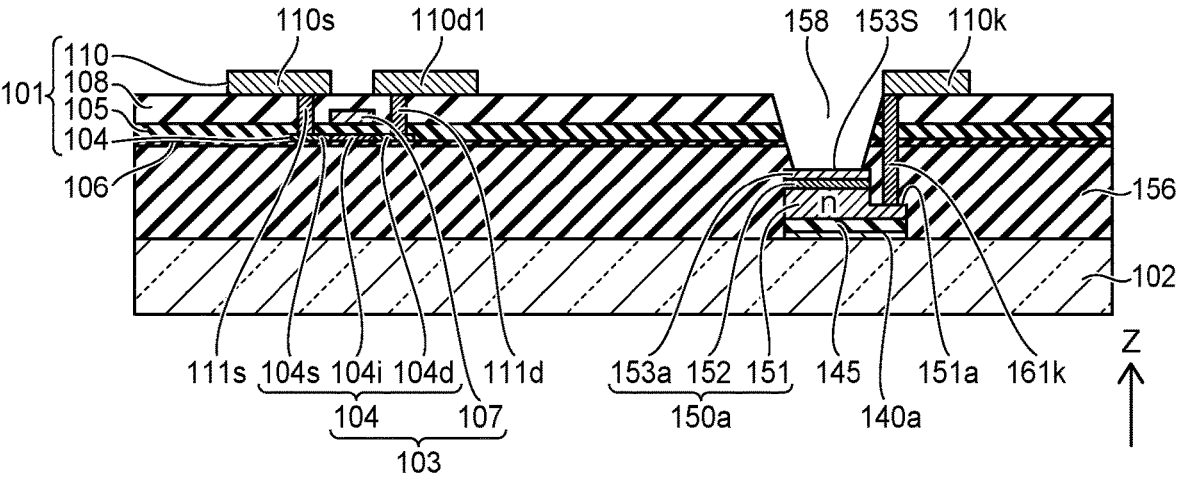
FIG. 8A is a schematic cross-sectional view illustrating a method for manufacturing an image display device of a modification of the first embodiment.
Figure 8B:
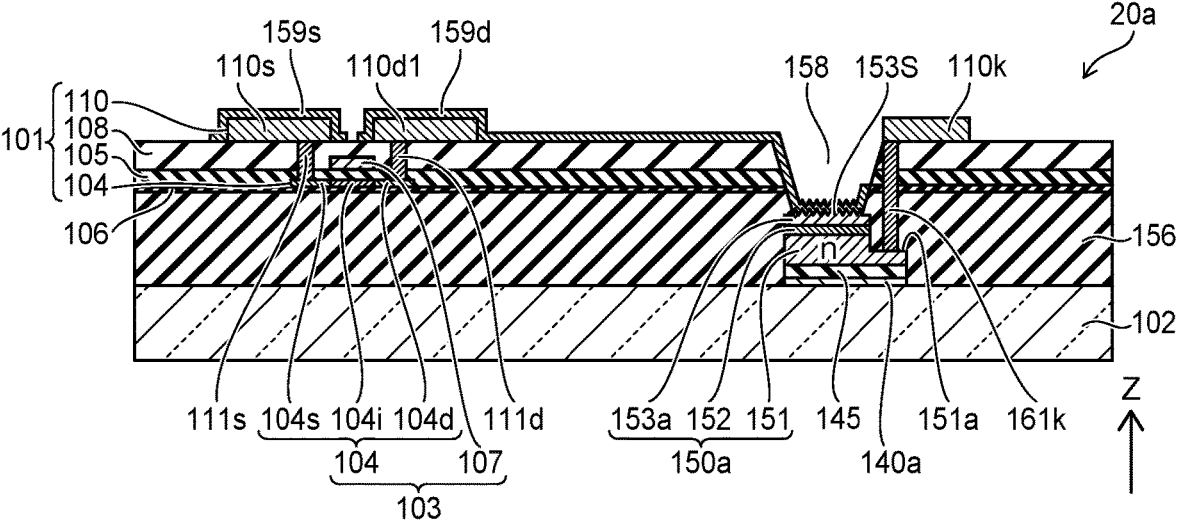
FIG. 8B is a schematic cross-sectional view illustrating the method for manufacturing the image display device of the modification of the first embodiment.

FIGS. 8A and 8B are schematic cross-sectional views illustrating a method for manufacturing an image display device of a modification of the embodiment.

FIGS. 8A and 8B show processes for forming the subpixel 20a shown in FIG. 2. In this case, the same processes as the processes described above are used up to the formation of the second inter-layer insulating film 108 and the formation of the via holes 162k, 112d, and 112s. In the following description, the processes of FIGS. 8A and 8B are performed for the process of FIG. 7A and subsequent processes.

As shown in FIG. 8A, the vias 161k, 111d, and 111s are formed by filling a conductive material into the via holes 162k, 112d, and 112s shown in FIG. 7A. Subsequently, the wiring layer 110 that includes the wiring parts 110k, 110d1, and 110s is formed. Here, a portion of the wiring part 110d1 is connected with the via 111d. On the other hand, the other portion of the wiring part 110d1 is located at a position separated from the opening 158 and is not directly connected to the light-emitting surface 153S. Similarly to the first embodiment, the vias 161k, 111d, and 111s and the wiring layer 110 may be simultaneously formed.

As shown in FIG. 8B, the light-transmitting electrode 159d is formed over the wiring part 110d1 and over the light-emitting surface 153S. As in the example, it is favorable for the light-emitting surface 153S to be roughened by wet etching, etc., before forming the light-transmitting electrode 159d. The roughening process may be performed directly after the opening 158 is formed. The light-transmitting electrode 159d also is formed between the wiring part 110d1 and the light-emitting surface 153S and electrically connects the wiring part 110d1 and the light-emitting surface 153S. The light-transmitting electrode 159s is formed over the wiring part 110s. The light-transmitting electrodes 159d and 159s are simultaneously formed. When a light-transmitting electrode is formed on the wiring part 110k, the light-transmitting electrode is formed simultaneously with the light-transmitting electrodes 159d and 159s.

Subsequently, the upper structural component of the color filter, etc., is formed, and the subpixel 20a of the modification of the image display device of the first embodiment is formed.

For example, the circuit of FIG. 3 is a drive circuit driving the light-emitting element 150 by the select transistor 24, the drive transistor 26, and the capacitor 28. Such a drive circuit is formed in the subpixels 20 and 20a. A portion of the circuit other than the drive circuit is formed, for example, in the peripheral edge part of the display region 2 outside the subpixels 20 and 20a. For example, the row selection circuit 5 shown in FIG. 3 is formed simultaneously with the drive transistor, the select transistor, etc., and is formed in the peripheral edge part of the display region 2. That is, the row selection circuit 5 can be simultaneously embedded by the manufacturing processes described above.

It is desirable for the signal voltage output circuit 7 to be embedded in a semiconductor device manufactured by manufacturing processes capable of higher integration by fine patterning. The signal voltage output circuit 7 is mounted to another substrate together with a CPU and/or other circuit components, and is connected to the subpixels 20 and 20a via, for example, connectors and the like located in the peripheral edge part of the display region before embedding the color filter described below or after embedding the color filter.

In the image display device 1 of the embodiment, an image can be formed in the display region 2 by the light-emitting elements 150 radiating light upward from a light-emitting surface 153Ss. However, when light is scattered lower than the light-emitting surface 153S, the luminous efficiency is substantially reduced because the substrate 102 is transmissive. Therefore, for example, the light scattered in the substrate 102-direction can be reflected toward the direction of the light-emitting surface 153S by providing a light-reflecting film, a light-reflecting plate, etc., at the surface of the substrate 102 at the side opposite to the first surface 102a. Such a light-reflecting film or the like may be located at the substrate 102 or may be located inside a case, frame, or the like that fixes the image display device 1.

Figure 9:
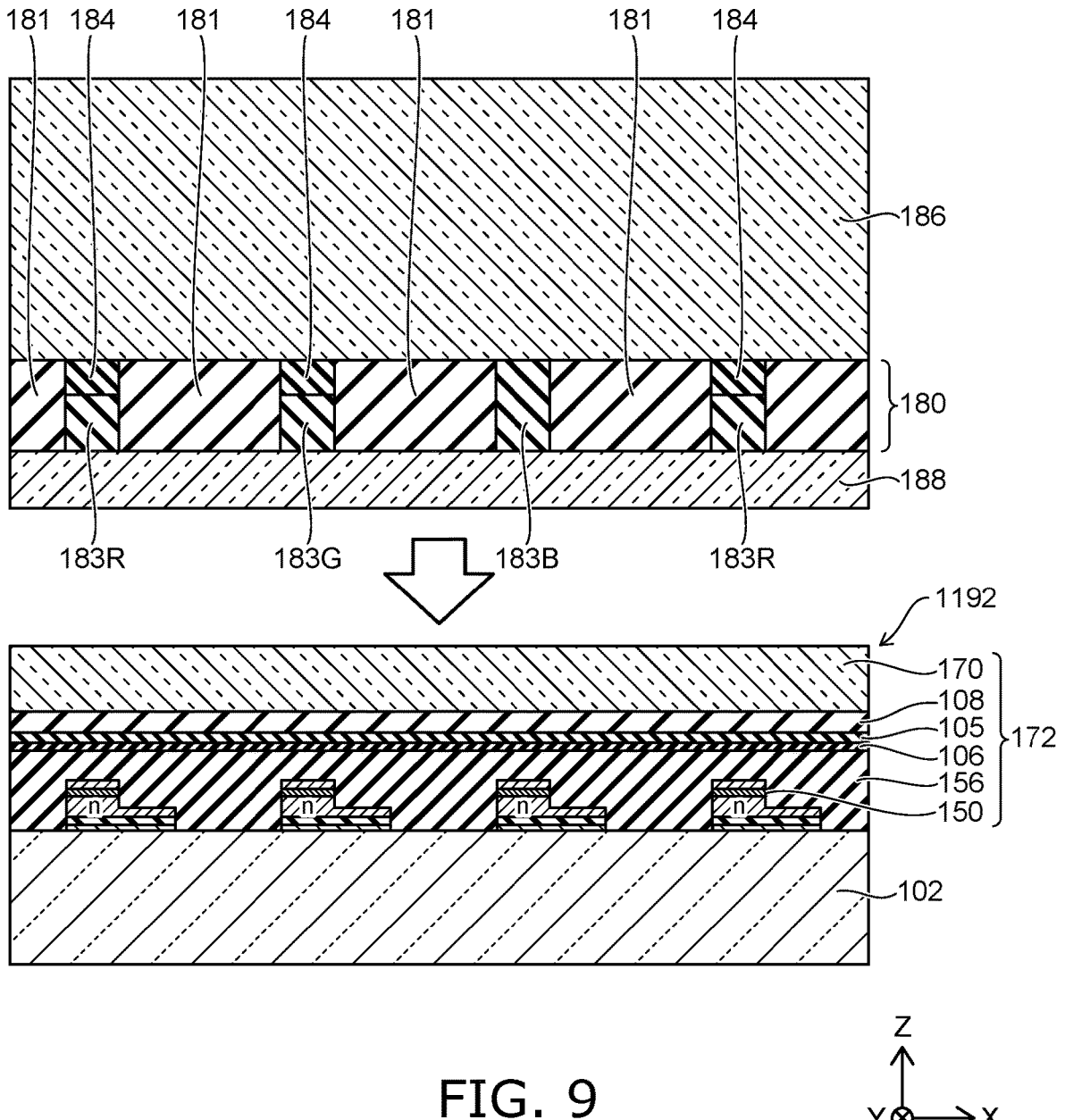
FIG. 9 is a schematic cross-sectional view illustrating the method for manufacturing the image display device of the first embodiment.

FIG. 9 is a schematic cross-sectional view illustrating the method for manufacturing the image display device of the embodiment.

In FIG. 9, the diagram above the arrow shows a configuration including the color filter 180, and the diagram below the arrow shows a structural component including the light-emitting element 150, etc., formed in the processes described above. The arrow of FIG. 9 indicates the process of bonding the color filter to the structural component including the light-emitting element 150, etc.

To avoid complexity in FIG. 9, the components other than the illustrated components on the substrate 102 are not illustrated. The components that are not illustrated are the TFT channel 104, the circuit 101 including the wiring layer 110, etc., and the via 161k shown in FIG. 1. Also, in FIG. 9, a portion of the color conversion members such as the color filter 180, etc., is displayed. In the description related to FIGS. 9 to 10D, the structural component that includes the substrate 102, the light-emitting element 150, the first inter-layer insulating film 156, the TFT underlying film 106, the insulating layer 105, the second inter-layer insulating film 108, the surface resin layer 170, and the components that are not illustrated is called a structure body 1192.

As shown in FIG. 9, the color filter (the wavelength conversion member) 180 is bonded to the structure body 1192 at one surface. The other surface of the color filter 180 is bonded to a glass substrate 186. The transparent thin film adhesive layer 188 is located at one surface of the color filter 180, and bonding to the exposed surface of the surface resin layer 170 of the structure body 1192 is performed via the transparent thin film adhesive layer 188.

In the color filter 180 of the example, color conversion parts are arranged in the positive direction of the X-axis in the order of red, green, and blue. For red, a red color conversion layer 183R is located in the first layer; for green, a green color conversion layer 183G is located in the first layer. The filter layer 184 is located in the second layer for both red and green. For blue, a single-layer color conversion layer 183B may be provided, and the filter layer 184 may be provided. Although the light-shielding part 181 is located between the color conversion parts, it goes without saying that the frequency characteristics of the filter layer 184 can be modified for each color of the color conversion parts.

The color filter 180 is adhered to the structure body 1192 so that the positions of the color conversion layers 183R, 183G, and 183B of each color match the positions of the light-emitting elements 150.

FIGS. 10A to 10D are schematic cross-sectional views showing a modification of the method for manufacturing the image display device of the embodiment.

FIGS. 10A to 10D show a method of using an inkjet method to form the color filter.

Figures 10A, 10B, 10C, 10D:
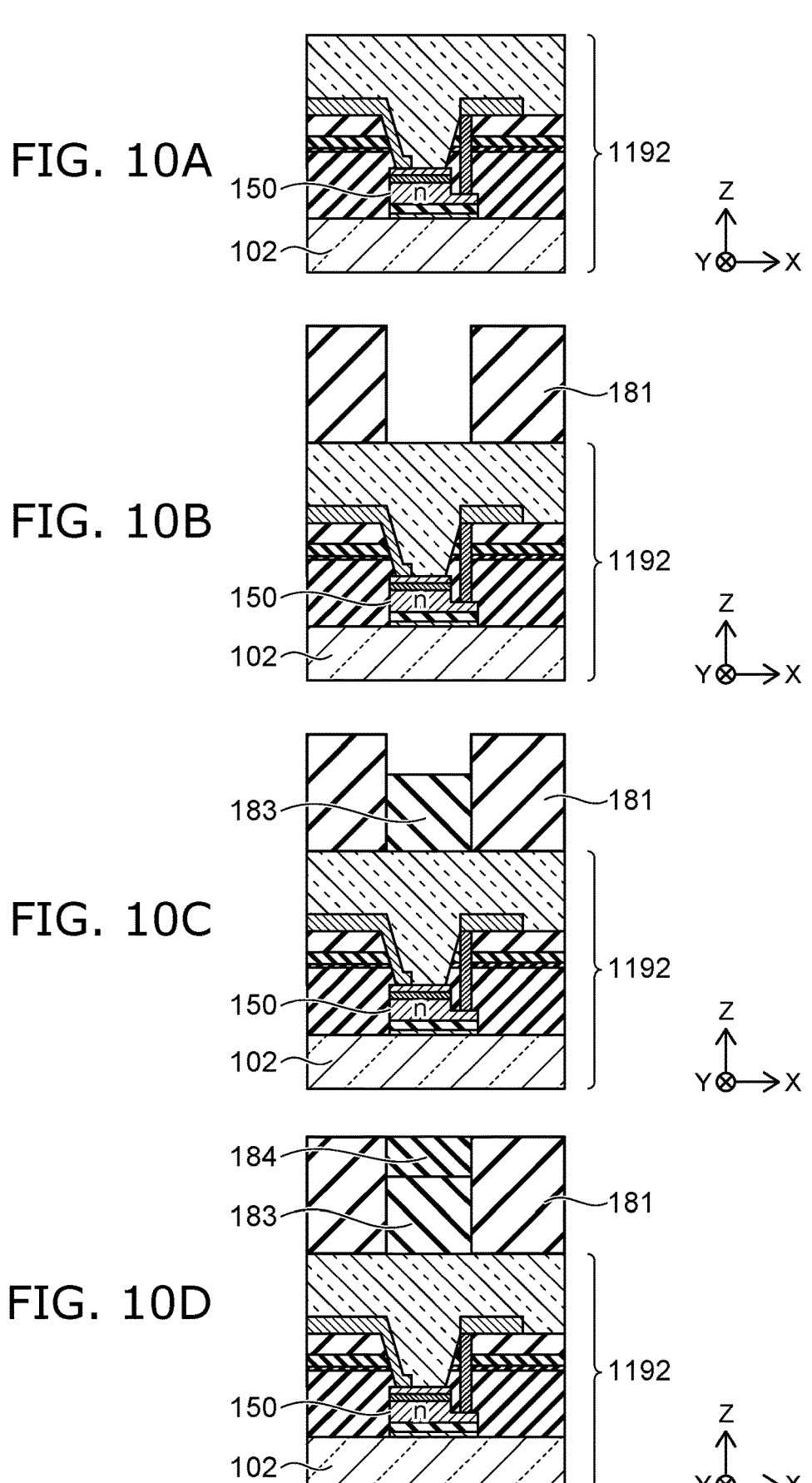
FIG. 10A is a schematic cross-sectional view illustrating a modification of the method for manufacturing the image display device of the first embodiment.
FIG. 10B is a schematic cross-sectional view illustrating the modification of the method for manufacturing the image display device of the first embodiment.
FIG. 10C is a schematic cross-sectional view illustrating the modification of the method for manufacturing the image display device of the first embodiment.
FIG. 10D is a schematic cross-sectional view illustrating the modification of the method for manufacturing the image display device of the first embodiment.

As shown in FIG. 10A, the structure body 1192 in which the components such as the light-emitting element 150, etc., are formed on the substrate 102 is prepared.

As shown in FIG. 10B, the light-shielding part 181 is formed on the structure body 1192. For example, the light-shielding part 181 is formed using screen printing, photolithography technology, etc.

As shown in FIG. 10C, the color conversion layer 183 is formed by dispensing a fluorescer that corresponds to the light emission color from an inkjet nozzle. The fluorescer colors the region in which the light-shielding part 181 is not formed. The fluorescer includes, for example, a fluorescent coating that uses a general fluorescer material, a perovskite fluorescer material, or a quantum dot fluorescer material. It is favorable to use a perovskite fluorescer material or a quantum dot fluorescer material because the light emission colors can be realized with high monochromaticity and high color reproducibility. After printing with the inkjet nozzle, drying processing is performed using an appropriate temperature and time. The thickness of the coating when coloring is set to be less than the thickness of the light-shielding part 181.

As described above, the color conversion layer 183 is not formed in the subpixel of blue light emission when the color conversion part is not formed. Also, when a blue color conversion layer is formed in the subpixel of blue light emission, and when the color conversion part may have one layer, it is favorable for the thickness of the coating of the blue fluorescer to be about equal to the thickness of the light-shielding part 181.

As shown in FIG. 10D, the coating for the filter layer 184 is dispensed from the inkjet nozzle. The coating is applied to overlap the coating of the fluorescer. The total thickness of the fluorescer and the coating is set to be about equal to the thickness of the light-shielding part 181.

It is desirable to make the color conversion layer 183 as thick as possible to increase the color conversion efficiency for both a film-type color filter and an inkjet-type color filter. On the other hand, when the color conversion layer 183 is too thick, the light emitted by the color-converted light approximates Lambertian, but the blue light that is not color-converted has an emission angle limited by the light-shielding part 181. Therefore, a problem undesirably occurs in that the display color of the display image has viewing angle dependence. To match the light distribution of the light of the subpixels in which the color conversion layer 183 is provided with the light distribution of the blue light that is not color-converted, it is desirable to set the thickness of the color conversion layer 183 to be about half of the opening size of the light-shielding part 181.

For example, in the case of a high-definition image display device of about 250 ppi (pitch per inch), the pitch of the subpixels 20 is about 30 μm, and so it is desirable for the thickness of the color conversion layer 183 to be about 15 μm. Here, when the color conversion material is made of spherical fluorescer particles, it is favorable to stack in a close-packed structure to suppress light leakage from the light-emitting element 150. It is therefore necessary to use at least three layers of particles. Accordingly, it is favorable for the particle size of the fluorescer material included in the color conversion layer 183 to be, for example, not more than about 5 μm, and more favorably not more than about 3 μm.

Figure 11:
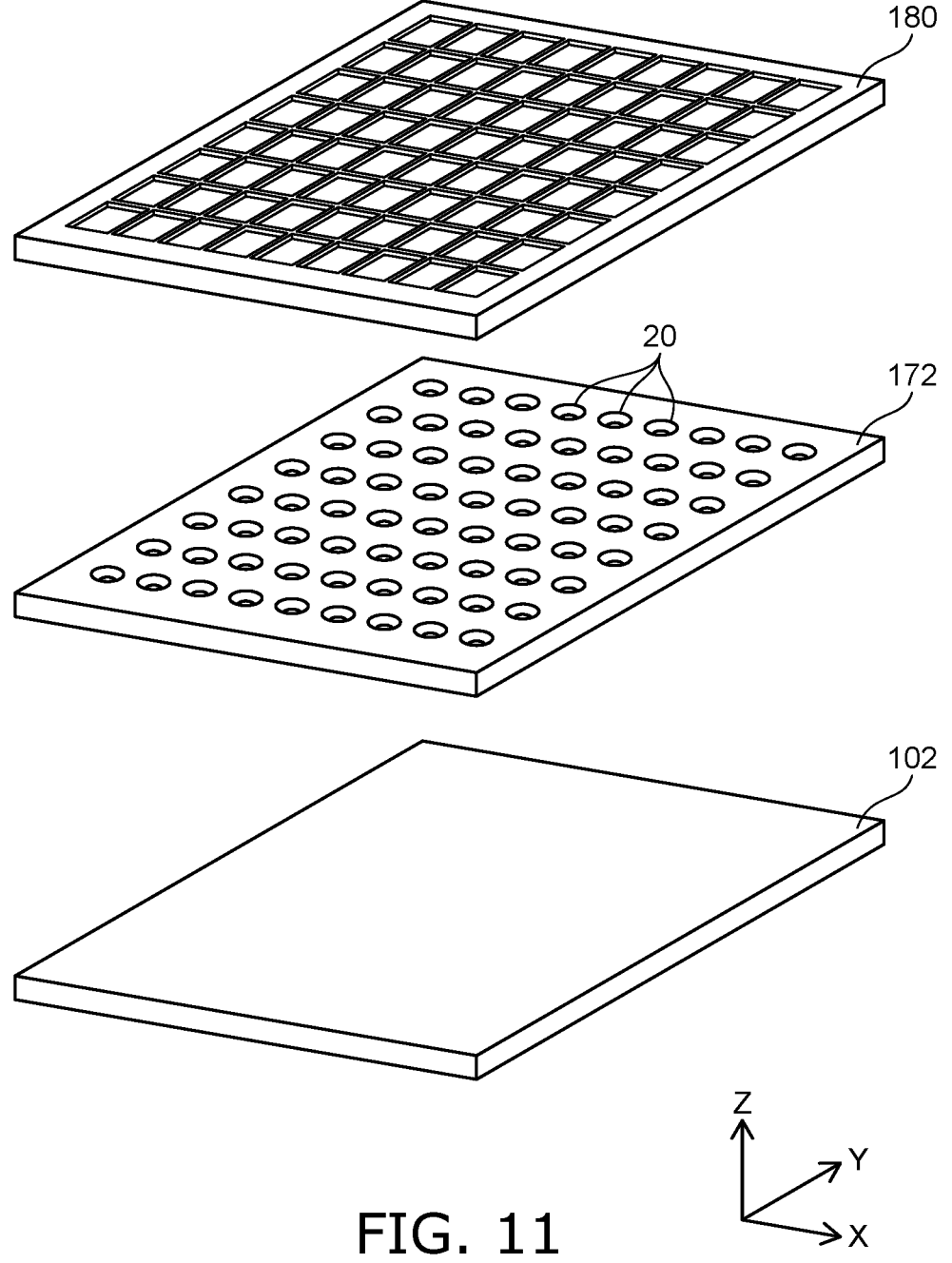
FIG. 11 is a schematic perspective view illustrating the image display device according to the first embodiment.

FIG. 11 is a schematic perspective view illustrating the image display device according to the embodiment.

In the image display device of the embodiment as shown in FIG. 11, a light-emitting circuit part 172 that includes many subpixels 20 is located on the substrate 102. The color filter 180 is located on the light-emitting circuit part 172. The other embodiments and modifications described below also have configurations similar to the configuration shown in FIG. 11.

Effects of the image display device 1 of the embodiment will now be described.

According to the method for manufacturing the image display device 1 of the embodiment, the light-emitting element 150 is formed by etching the semiconductor layer 1150 formed by crystal growth on the substrate 102. Subsequently, the light-emitting element 150 is covered with the first inter-layer insulating film 156, and the circuit 101 that includes circuit elements such as the transistor 103 driving the light-emitting element 150, etc., is made on the first inter-layer insulating film 156. Therefore, the manufacturing processes are markedly reduced compared to when singulated light-emitting elements are individually transferred to the substrate 102.

According to the method for manufacturing the image display device 1 of the embodiment, the buffer layer 1145 and the semiconductor layer 1150 can be formed as a seed for crystal growth by forming the graphene layer 1140 on the substrate 102. When the first surface 102a of the substrate 102 is sufficiently flat, the graphene layer 1140 can be easily held by suction and fixed to the first surface 102a. Therefore, the production technique can be simple, the process can be configured without contaminating the production site, and substantially high productivity can be realized.

For example, in an image display device having 4K image quality, the number of subpixels is greater than 24 million, and in the case of an image display device having 8K image quality, the number of subpixels is greater than 99 million. When individually forming and mounting such a large quantity of light-emitting elements to a circuit board, an enormous amount of time is necessary. It is therefore difficult to realize an image display device that uses micro LEDs at a realistic cost. Also, when individually mounting a large quantity of light-emitting elements, the yield decreases due to connection defects when mounting, etc., and an even higher cost is unavoidable.

In contrast, according to the method for manufacturing the image display device 1 of the embodiment, the transfer process of the light-emitting element 150 can be eliminated because the light-emitting elements 150 are formed after forming the entire semiconductor layer 1150 on the graphene layer 1140 formed on the substrate 102. Therefore, according to the method for manufacturing the image display device 1 of the embodiment, compared to a conventional manufacturing method, the time of the transfer process can be reduced, and the number of processes can be reduced.

Because the semiconductor layer 1150 that has a uniform crystal structure is grown on the buffer layer 1145 formed on the graphene layer 1140, the light-emitting elements 150 can be self-aligningly positioned by appropriately patterning the graphene layer 1140. This is favorable for a higher definition display because alignment of the light-emitting elements on the substrate 102 is unnecessary, and it is easy to downsize the light-emitting element 150.

The light-emitting elements 150 and the circuit elements formed in the layer on the light-emitting elements 150 are electrically connected by via formation after the light-emitting elements are directly formed on the substrate 102 by etching, etc.; therefore, a uniform connection structure can be realized, and the reduction of the yield can be suppressed.

According to the embodiment, for example, a glass substrate formed as described above can be covered with an inter-layer insulating film, and drive circuits, scanning circuits, and the like that include TFTs, etc., can be formed on the planarized surface by using a LTPS process, etc. Therefore, an advantage is provided in that existing flat panel display manufacturing processes and plants can be utilized.

According to the embodiment, the light-emitting element 150 that is formed in a lower layer than the transistor 103, etc., can be electrically connected to power supply lines, ground lines, drive transistors, etc., formed in the upper layer by forming vias extending through the first inter-layer insulating film 156, the TFT underlying film 106, the insulating layer 105, and the second inter-layer insulating film 108. Thus, a uniform connection structure can be easily realized using technically-established multilevel wiring technology, and the yield can be increased. Accordingly, the reduction of the yield due to connection defects of the light-emitting elements, etc., is suppressed.

Second Embodiment

Figure 12:
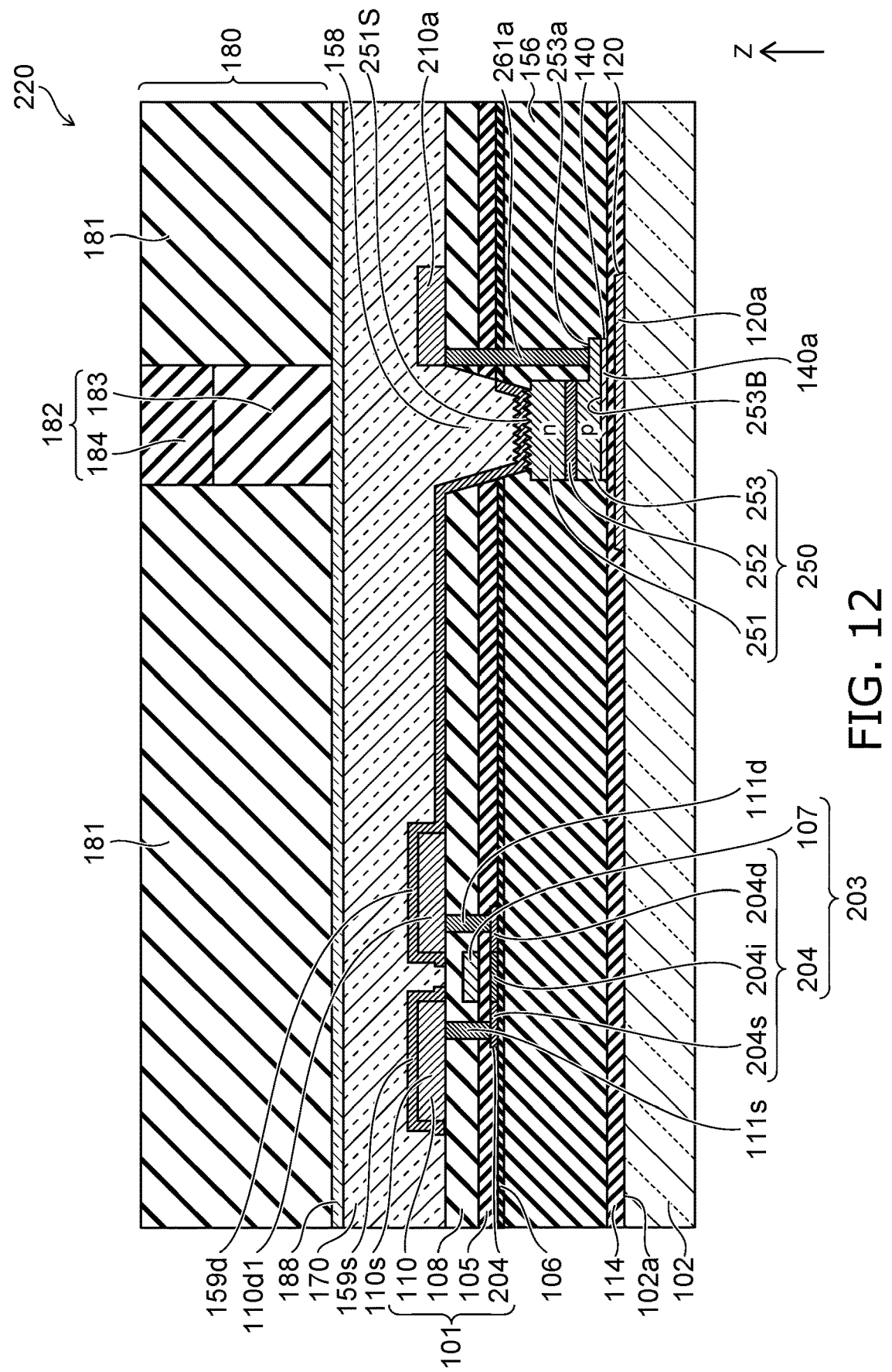
FIG. 12 is a schematic cross-sectional view illustrating a portion of an image display device according to a second embodiment.

FIG. 12 is a schematic cross-sectional view illustrating a portion of an image display device according to the embodiment.

The embodiment differs from the other embodiment described above in that a light-reflecting layer 120 that includes a light-reflecting plate 120a is located on the first surface 102a, and the light-emitting element 150 is located on the light-reflecting plate 120a with an insulating layer 114 interposed. The embodiment differs from the other embodiment described above in that an n-type semiconductor layer 251 provides a light-emitting surface 251S. The embodiment differs from the other embodiment described above in that the embodiment has a configuration in which a light-emitting element 250 is driven by an n-type transistor 203. The same components as the other embodiment are marked with the same reference numerals, and a detailed description is omitted as appropriate.

As shown in FIG. 12, a subpixel 220 of the image display device of the embodiment includes the substrate 102, the light-reflecting layer 120, the graphene layer 140, the light-emitting element 250, the first inter-layer insulating film 156, the transistor 203, the second inter-layer insulating film 108, a via 261a, and the wiring layer 110.

The light-reflecting layer 120 is located on the first surface 102a. The light-reflecting layer 120 includes the light-reflecting plate 120a. The light-reflecting plate (a first part) 120a is located on the first surface 102a and is a film-shaped, layer-shaped, or plate-shaped member having the shape of a rectangle, any polygon, ellipse, circle, etc., when projected onto the XY plane.

The light-reflecting layer 120 includes multiple light-reflecting plates 120a, and in the example, the light-reflecting plate 120a is provided for each light-emitting element 250. Although separated from each other in the example, the multiple light-reflecting plates 120a may be connected to each other.

When projected onto the XY plane, the outer perimeter of the light-reflecting plate 120a is set to include the outer perimeter of the light-emitting element 250 when the light-emitting element 250 is projected. That is, the outer perimeter of the light-emitting element 250 is located within the outer perimeter of the light-reflecting plate 120a when projected onto the XY plane. One light-reflecting plate 120a may be provided for one light-emitting element 250, or one light-reflecting plate 120a may be provided for multiple light-emitting elements 250. For example, the multiple light-reflecting plates 120a may be formed to be connected in a lattice shape without being divided one by one. The light-reflecting layer 120 may include a single light-reflecting plate 120a. For example, a single light-reflecting plate 120a is provided over the entire surface of the display region 2 shown in FIG. 13 below.

The light-reflecting plate 120a includes a light-reflective material. For example, the light-reflecting plate 120a is formed of a metal material such as Ag, an alloy including Ag, etc. As long as the material is light-reflective, the material is not limited to Ag or the like, and an appropriate material can be used.

The insulating layer 114 is provided over the first surface 102a, the light-reflecting layer 120, and the light-reflecting plate 120a. The insulating layer 114 is formed of an oxide film of $SiO_2$, etc. The insulating layer 114 is provided to insulate the light-reflecting plate 120a from the light-emitting element 250. Also, the insulating layer 114 provides a planarized surface for forming the graphene sheet 140a.

The graphene layer 140 that includes the graphene sheet 140a is located on the insulating layer 114. The light-reflecting plate 120a is located between the first surface 102a and the graphene layer 140, and the light-emitting element 250 is located on the light-reflecting plate 120a with the graphene sheet 140a and the insulating layer 114 interposed. The light-emitting element 250 is located directly above the light-reflecting plate 120a.

Thus, by providing the light-reflecting plate 120a, the light that is scattered downward from the light-emitting element 250 is reflected upward by the light-reflecting plate 120a. Accordingly, the luminous efficiency of the light-emitting element 250 is substantially improved.

The light-emitting element 250 includes the light-emitting surface 251S. The light-emitting element 250 is a prismatic or cylindrical element that includes a bottom surface 253B on the first surface 102a. The light-emitting surface 251S is the surface at the side opposite to the bottom surface 253B. The bottom surface 253B is a surface that contacts the graphene sheet 140a.

The light-emitting element 250 includes a p-type semiconductor layer (a first semiconductor layer) 253, a light-emitting layer 252, and the n-type semiconductor layer (the second semiconductor layer) 251. The p-type semiconductor layer 253, the light-emitting layer 252, and the n-type semiconductor layer 251 are stacked in this order from the bottom surface 253B toward the light-emitting surface 251S. According to the embodiment, the light-emitting surface 251S is provided by the n-type semiconductor layer 251. The thickness of the n-type semiconductor layer 251 can be increased because the n-type semiconductor layer 251 can have a lower resistance value than the p-type semiconductor layer 253. It is therefore easy to roughen the light-emitting surface 251S.

The light-emitting element 250 includes a connection part 253a. The connection part 253a is provided to protrude in one direction from the p-type semiconductor layer 253 on the insulating layer 114. Similarly to the other embodiments described above, the connection part 253a may protrude in multiple directions, and may protrude over the outer perimeter of the p-type semiconductor layer 253. The height of the connection part 253a is the same as that of the p-type semiconductor layer 253, or is less than that of the p-type semiconductor layer 253, and the light-emitting element 250 is formed in a staircase shape. The connection part 253a is of the p-type and is electrically connected with the p-type semiconductor layer 253. The connection part 253a is connected to one end of the via 261a and electrically connects the p-type semiconductor layer 253 to the via 261a.

The light-emitting element 250 has a shape similar to the light-emitting element 150 of the other embodiments described above when projected onto the XY plane. An appropriate shape is selected according to the layout of the circuit elements, etc. The shape of the light-reflecting plate 120a when projected onto the XY plane can be any shape as described above, and an appropriate shape is selected according to the layout of the circuit elements, etc.

The light-emitting element 250 is a light-emitting diode similar to the light-emitting element 150 of the other embodiments described above. In other words, the wavelength of the light emitted by the light-emitting element 250 is, for example, a blue light emission of about 467 nm±30 nm or a bluish-violet light emission of about 410 nm±30 nm. The wavelength of the light emitted by the light-emitting element 250 is not limited to the values described above and can be an appropriate value.

The transistor 203 is located on the TFT underlying film 106. The transistor 203 is an n-channel TFT. The transistor 203 includes the TFT channel 204 and the gate 107. Favorably, similarly to the other embodiment described above, the transistor 203 is formed by a LTPS process, etc. According to the embodiment, the circuit 101 includes the TFT channel 204, the insulating layer 105, the second inter-layer insulating film 108, the vias 111s and 111d, and the wiring layer 110.

The TFT channel 204 includes regions 204s, 204i, and 204d. The regions 204s, 204i, and 204d are located on the TFT underlying film 106. The regions 204s and 204d are doped with an impurity such as phosphorus (P) or the like by ion implantation, etc., to form n-type semiconductor regions. The region 204s has an ohmic connection with the via 111s. The region 204d has an ohmic connection with the via 111d.

The gate 107 is located on the TFT channel 204 with the insulating layer 105 interposed. The insulating layer 105 insulates the TFT channel 204 and the gate 107.

In the transistor 203, a channel is formed in the region 204i when a higher voltage than that of the region 204s is applied to the gate 107. The current that flows between the regions 204s and 204d is controlled by the voltage of the gate 107 with respect to the region 204s. The TFT channel 204 and the gate 107 are formed using materials and formation methods similar to the TFT channel 104 and the gate 107 of the other embodiments described above.

The wiring layer 110 includes the wiring parts 110s, 110d1, and 210a. The wiring parts 110s and 110d1 are the same as those of the modification of the first embodiment described above in FIG. 2. A portion of the wiring part 210a is located above the connection part 253a. For example, another portion of the wiring part 210a extends to the power supply line 3 shown in FIG. 13 below and is connected to the power supply line 3.

The vias 111s and 111d are provided to extend through the second inter-layer insulating film 108. The via 111s is located between the wiring part 110s and the region 204s. The via 111s electrically connects the wiring part 110s and the region 204s. The via 111d is located between the wiring part 110d1 and the region 204d. The via 111d electrically connects the wiring part 110d1 and the region 204d. The vias 111s and 111d are formed using materials and formation methods similar to those of the other embodiment described above.

The via 261a is provided to extend through the second inter-layer insulating film 108, the insulating layer 105, the TFT underlying film 106, and the first inter-layer insulating film 156. The via 261a is located between the wiring part 210a and the connection part 253a and electrically connects the wiring part 210a and the connection part 253a.

For example, the wiring part 110s is electrically connected to the ground line 4 shown in FIG. 13 below. The wiring part 110d1 is electrically connected to the n-type semiconductor layer 251 via the light-transmitting electrode 159d.

According to the embodiment, the light-transmitting electrode 159d is provided over the light-emitting surface 251S of the roughened n-type semiconductor layer 251. The light-transmitting electrode 159d is provided over the wiring part 110d1. The light-transmitting electrode 159d also is located between the light-emitting surface 251S and the wiring part 110d and electrically connects the n-type semiconductor layer 251 and the wiring part 110d.

As in the other embodiment described above, the wiring part 110d may extend to be directly connected to the n-type semiconductor layer 251 as in the example shown in FIG. 1.

Figure 13:
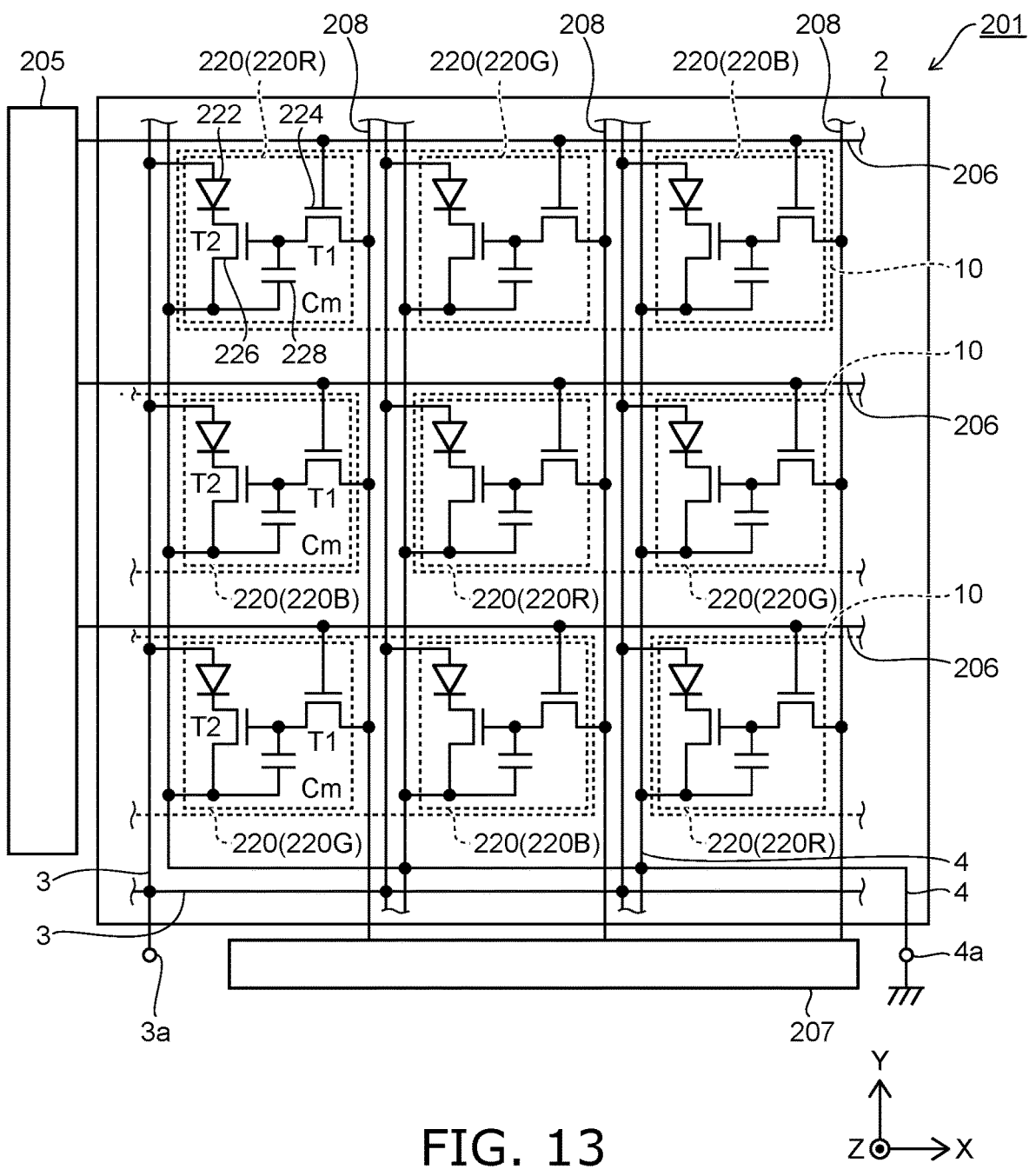
FIG. 13 is a schematic block diagram illustrating the image display device of the second embodiment.

FIG. 13 is a schematic block diagram illustrating an image display device according to the embodiment.

As shown in FIG. 13, the image display device 201 of the embodiment includes the display region 2, a row selection circuit 205, and a signal voltage output circuit 207. In the display region 2, similarly to the other embodiment described above, for example, the subpixels 220 are arranged in a lattice shape in the XY plane.

Similarly to the other embodiment described above, the pixel 10 includes multiple subpixels 220 that emit light of different colors. A subpixel 220R emits red light. A subpixel 220G emits green light. A subpixel 220B emits blue light. The light emission color and luminance of one pixel 10 are determined by the three types of the subpixels 220R, 220G, and 220B emitting light of the desired luminances.

One pixel 10 includes the three subpixels 220R, 220G, and 220B; for example, the subpixels 220R, 220G, and 220B are arranged in a straight line along the X-axis as in the example. In the pixels 10, subpixels of the same color may be arranged in the same column, or subpixels of different colors may be arranged in each column as in the example.

The subpixel 220 includes a light-emitting element 222, a select transistor 224, a drive transistor 226, and a capacitor 228. In FIG. 13, the select transistor 224 may be displayed as T1, the drive transistor 226 may be displayed as T2, and the capacitor 228 may be displayed as Cm.

According to the embodiment, the light-emitting element 222 is located at the power supply line 3 side, and the drive transistor 226 that is connected in series to the light-emitting element 222 is located at the ground line 4 side. That is, the drive transistor 226 is connected to a lower potential side than the light-emitting element 222. The drive transistor 226 is an n-channel transistor.

The select transistor 224 is connected between a signal line 208 and the gate electrode of the drive transistor 226. The capacitor 228 is connected between the ground line 4 and the gate electrode of the drive transistor 226.

To drive the drive transistor 226 that is an n-channel transistor, the row selection circuit 205 and the signal voltage output circuit 207 supply a signal voltage that has a different polarity from that of the other embodiment described above to the signal line 208.

According to the embodiment, because the polarity of the drive transistor 226 is an n-channel, the polarity of the signal voltage and the like are different from those of the other embodiment described above. Namely, the row selection circuit 205 supplies a select signal to a scanning line 206 to sequentially select one row from the arrangement of the m rows of the subpixels 220. The signal voltage output circuit 207 supplies a signal voltage having an analog voltage value necessary for each subpixel 220 of the selected row. The drive transistors 226 of the subpixels 220 of the selected row allow currents corresponding to the signal voltages to flow in the light-emitting elements 222. The light-emitting elements 222 emit light of luminances corresponding to the currents flowing in the light-emitting elements 222.

A method for manufacturing the image display device of the embodiment will now be described.

FIGS. 14A to 17B are schematic cross-sectional views illustrating the method for manufacturing the image display device of the embodiment.

Figure 14A:
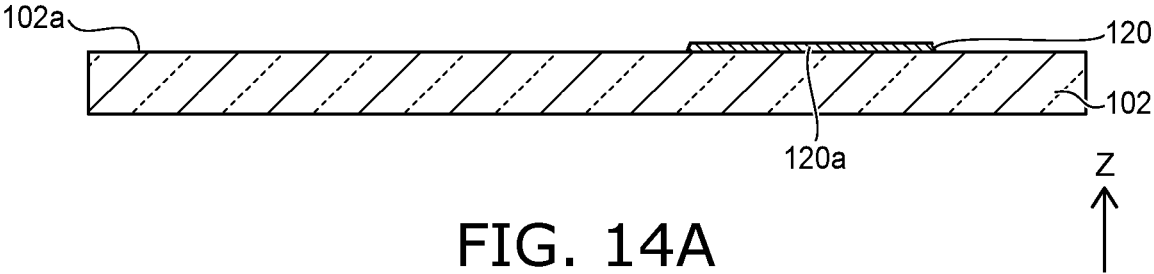
FIG. 14A is a schematic cross-sectional view illustrating a method for manufacturing the image display device of the second embodiment.

As shown in FIG. 14A, the light-reflecting layer 120 is formed on the first surface 102a. The light-reflecting layer 120 may be formed by sputtering, etc., or may be formed by firing after applying Ag paste or the like in the shape of the light-reflecting plate 120a. The light-reflecting plate (the first part) 120a of the light-reflecting layer 120 is located at the position at which the light-emitting element 250 will be formed.

Figure 14B:
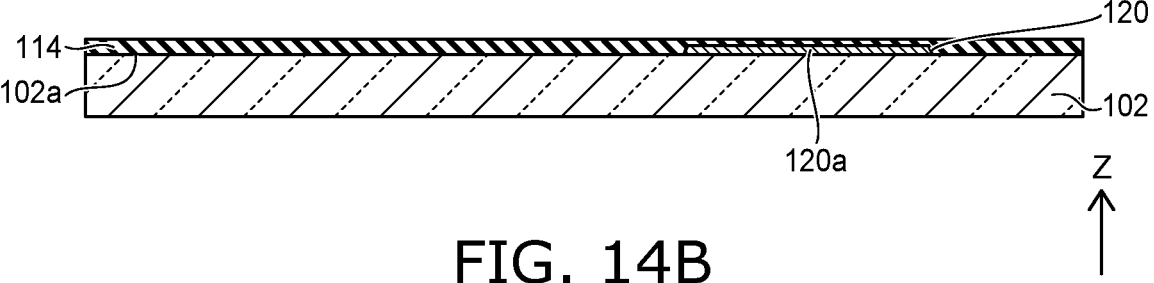
FIG. 14B is a schematic cross-sectional view illustrating the method for manufacturing the image display device of the second embodiment.

As shown in FIG. 14B, the insulating layer 114 is formed over the first surface 102a and the light-reflecting layer 120. The insulating layer 114 is formed by CVD, etc. It is favorable to planarize the exposed surface of the insulating layer 114 by CMP (Chemical Mechanical Polishing) or the like so that the graphene layer 1140 can be adhered by suction.

Figure 14C:
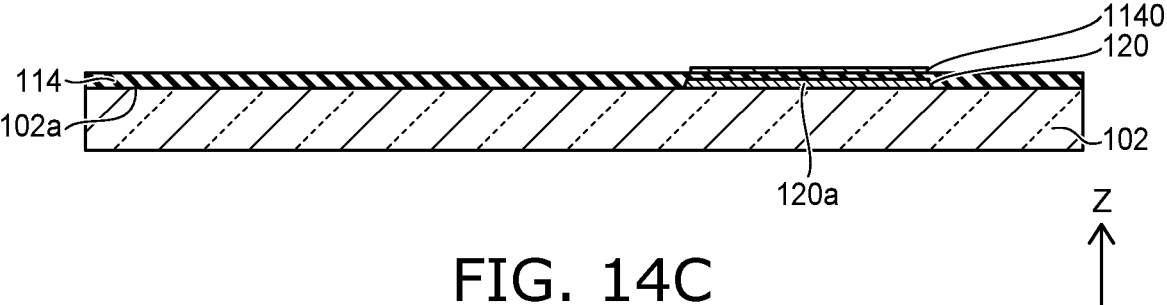
FIG. 14C is a schematic cross-sectional view illustrating the method for manufacturing the image display device of the second embodiment.

As shown in FIG. 14C, the graphene layer 1140 is formed on the insulating layer 114. It is favorable for the graphene layer 1140 to be cut to a sufficiently large size compared to the area of the light-emitting element 250 formed on the graphene layer 1140 to be subsequently adhered by suction on the insulating layer 114.

Figure 15A:
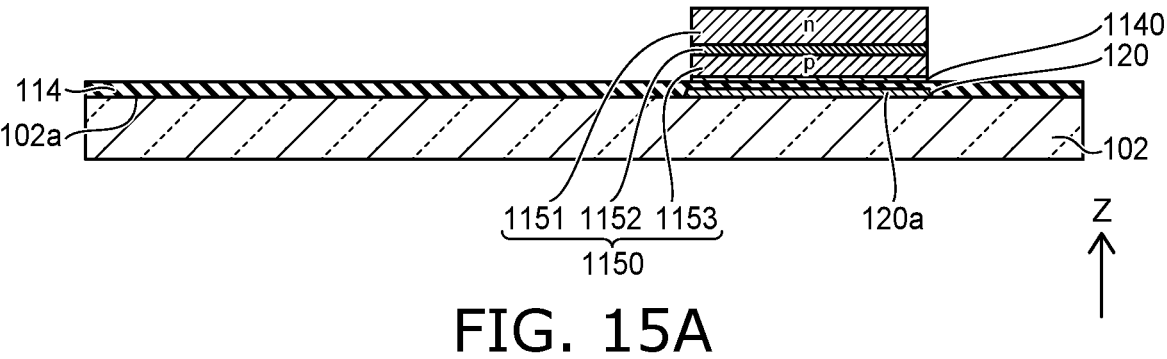
FIG. 15A is a schematic cross-sectional view illustrating the method for manufacturing the image display device of the second embodiment.

As shown in FIG. 15A, the semiconductor layer 1150 is formed over the graphene layer 1140. The semiconductor layer 1150 includes the p-type semiconductor layer 1153, the light-emitting layer 1152, and the n-type semiconductor layer 1151 formed in this order from the graphene layer 1140 toward the positive direction of the Z-axis. The embodiment differs from the other embodiments described above in that the formation of the semiconductor layer 1150 is started from the p-type semiconductor layer 1153, but the formation can be performed using technology similar to the other embodiments described above. In other words, physical vapor deposition is used, and it is favorable to use low-temperature sputtering. Also, physical vapor deposition such as vapor deposition, ion beam deposition, MBE, etc., may be used to form the semiconductor layer 1150.

Similarly to the other embodiments described above, there are cases where deposits including the materials of the growth species are deposited at locations at which the graphene layer 1140 does not exist.

Figure 15B:
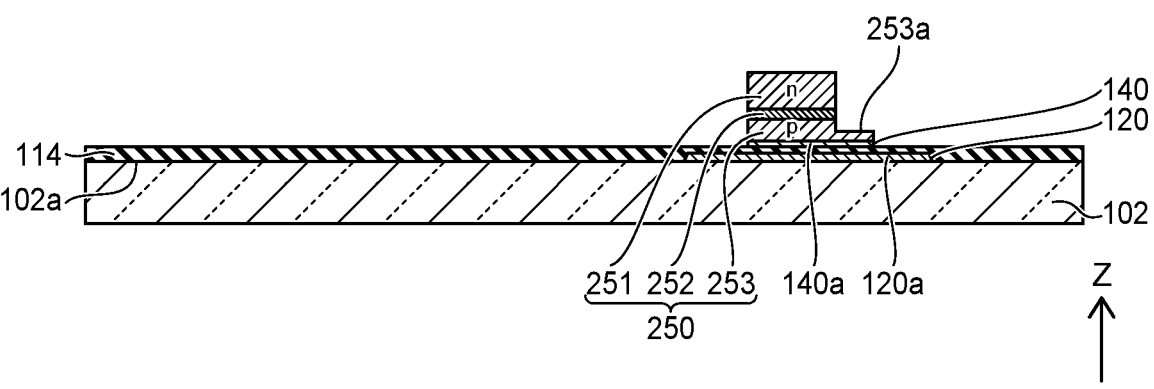
FIG. 15B is a schematic cross-sectional view illustrating the method for manufacturing the image display device of the second embodiment.

As shown in FIG. 15B, the light-emitting element 250 is formed in the desired shape by performing dry etching or the like of the semiconductor layer 1150 shown in FIG. 15A. In the formation process of the light-emitting element 250, the connection part 253a is formed, and then the other portions are formed by further etching. The graphene layer 1140 shown in FIG. 15A is over-etched when forming the connection part 253a. Therefore, the outer perimeter of the graphene sheet 140a is shaped to substantially match the outer perimeter of the light-emitting element 250.

Figure 16A:
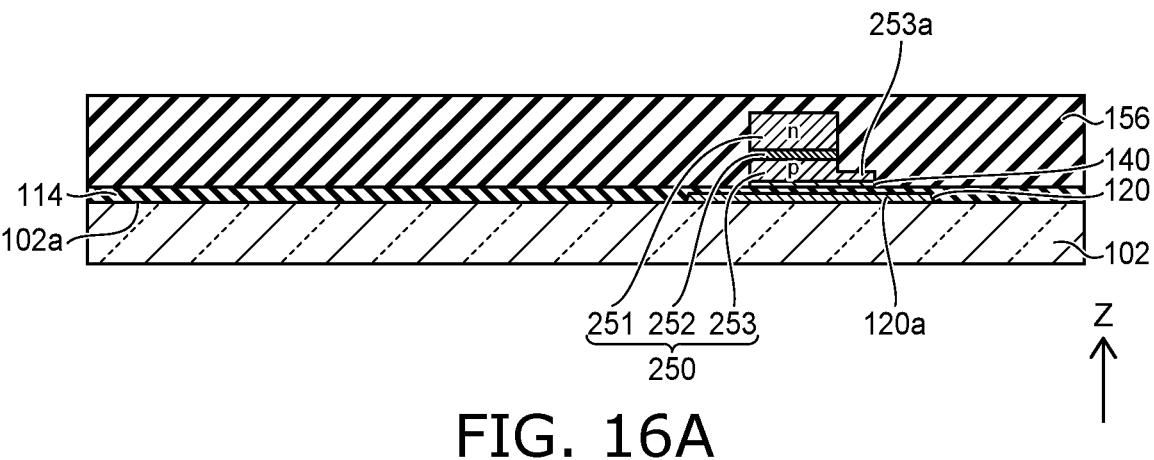
FIG. 16A is a schematic cross-sectional view illustrating the method for manufacturing the image display device of the second embodiment.

As shown in FIG. 16A, the first inter-layer insulating film 156 is formed to cover the graphene layer 140, the insulating layer 114, and the light-emitting element 250.

Figure 16B:
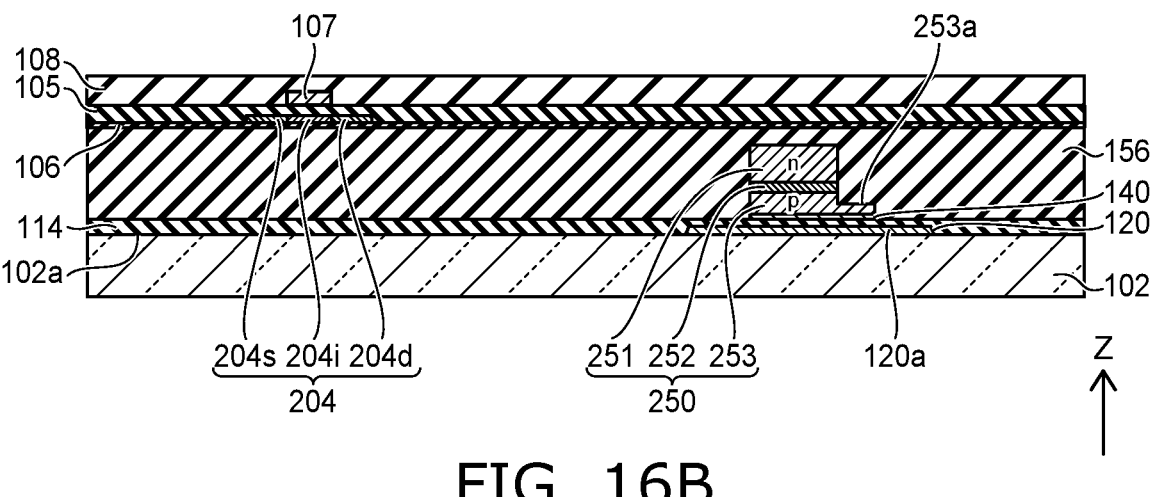
FIG. 16B is a schematic cross-sectional view illustrating the method for manufacturing the image display device of the second embodiment.

As shown in FIG. 16B, the TFT underlying film 106 is formed over the first inter-layer insulating film 156 by CVD, etc. The TFT channel 204 is formed on the planarized TFT underlying film 106. The insulating layer 105 is formed to cover the TFT underlying film 106 and the TFT channel 204. The gate 107 is formed on the TFT channel 204 with the insulating layer 105 interposed. The second inter-layer insulating film 108 is formed to cover the insulating layer 105 and the gate 107.

Figure 17A:
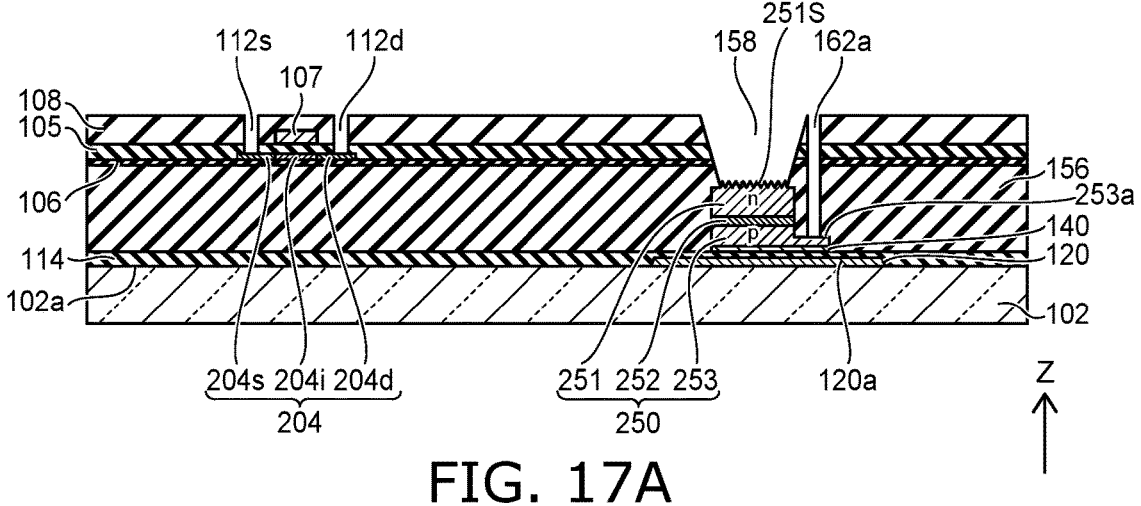
FIG. 17A is a schematic cross-sectional view illustrating the method for manufacturing the image display device of the second embodiment.

As shown in FIG. 17A, a via hole 162a is formed to extend through the second inter-layer insulating film 108, the insulating layer 105, the TFT underlying film 106, and the first inter-layer insulating film 156 and reach the surface of the connection part 253a. The opening 158 is formed to reach the light-emitting surface 251S by removing a portion of the second inter-layer insulating film 108, a portion of the insulating layer 105, a portion of the TFT underlying film 106, and a portion of the first inter-layer insulating film 156. Surface roughening of the light-emitting surface 251S may be performed after the formation of the opening 158. The via hole 112*d* is formed to extend through the second inter-layer insulating film 108 and the insulating layer 105 and reach the region 204*d*. The via hole 112*s* is formed to extend through the second inter-layer insulating film 108 and the insulating layer 105 and reach the region 204*s*. For example, RIE or the like is used to form the via holes and openings.

Figure 17B:
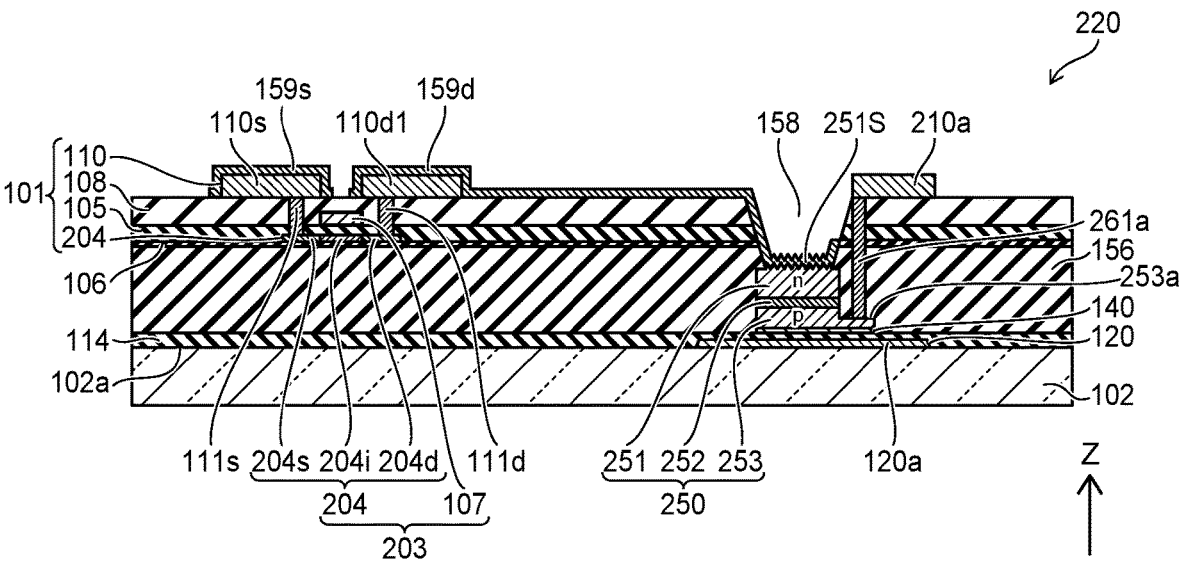
FIG. 17B is a schematic cross-sectional view illustrating the method for manufacturing the image display device of the second embodiment.

As shown in FIG. 17B, the via 261*a* is formed by filling a conductive material into the via hole 162*a* shown in FIG. 17A. The vias 111*d* and 111*s* also are formed by filling a conductive material respectively into the via holes 112*d* and 112*s* shown in FIG. 17A. Subsequently, the wiring layer 110 that includes the wiring parts 210*a*, 110*d*1, and 110*s* is formed. The wiring parts 210*a*, 110*d*1, and 110*s* are connected respectively to the vias 261*a*, 111*d*, and 111*s*. The wiring layer 110 may be formed simultaneously with the formation of vias 261*a*, 111*d*1, and 111*s*.

A transmissive conductive film that includes the light-transmitting electrodes 159*d* and 159*s* is formed to cover the second inter-layer insulating film 108, the light-emitting surface 251S, and the wiring layer 110. The light-transmitting electrode 159*d* is formed over the wiring part 110*d*1 and over the light-emitting surface 251S, and is formed between the wiring part 110*d*1 and the light-emitting surface 251S to electrically connect the wiring part 110*d*1 and the light-emitting surface 251S. The light-transmitting electrode 159*s* is formed over the wiring part 110*s*. Although not illustrated in the embodiment, a light-transmitting electrode also may be formed on the wiring part 210*a*.

Thereafter, the subpixel 220 of the image display device 201 of the embodiment is formed by providing the color filter (the wavelength conversion member) 180, etc.

Effects of the image display device of the embodiment will now be described.

In addition to the effects of reducing the time of the transfer process for forming the light-emitting element 250 and reducing the number of processes similarly to the other embodiments described above, in the image display device of the embodiment, the light-emitting surface 251S can be sufficiently roughened by using the n-type semiconductor layer 251 as the light-emitting surface 251S. Therefore, the luminous efficiency can be increased, and a loss increase due to the contact resistance can be suppressed.

Third Embodiment

Figure 18:
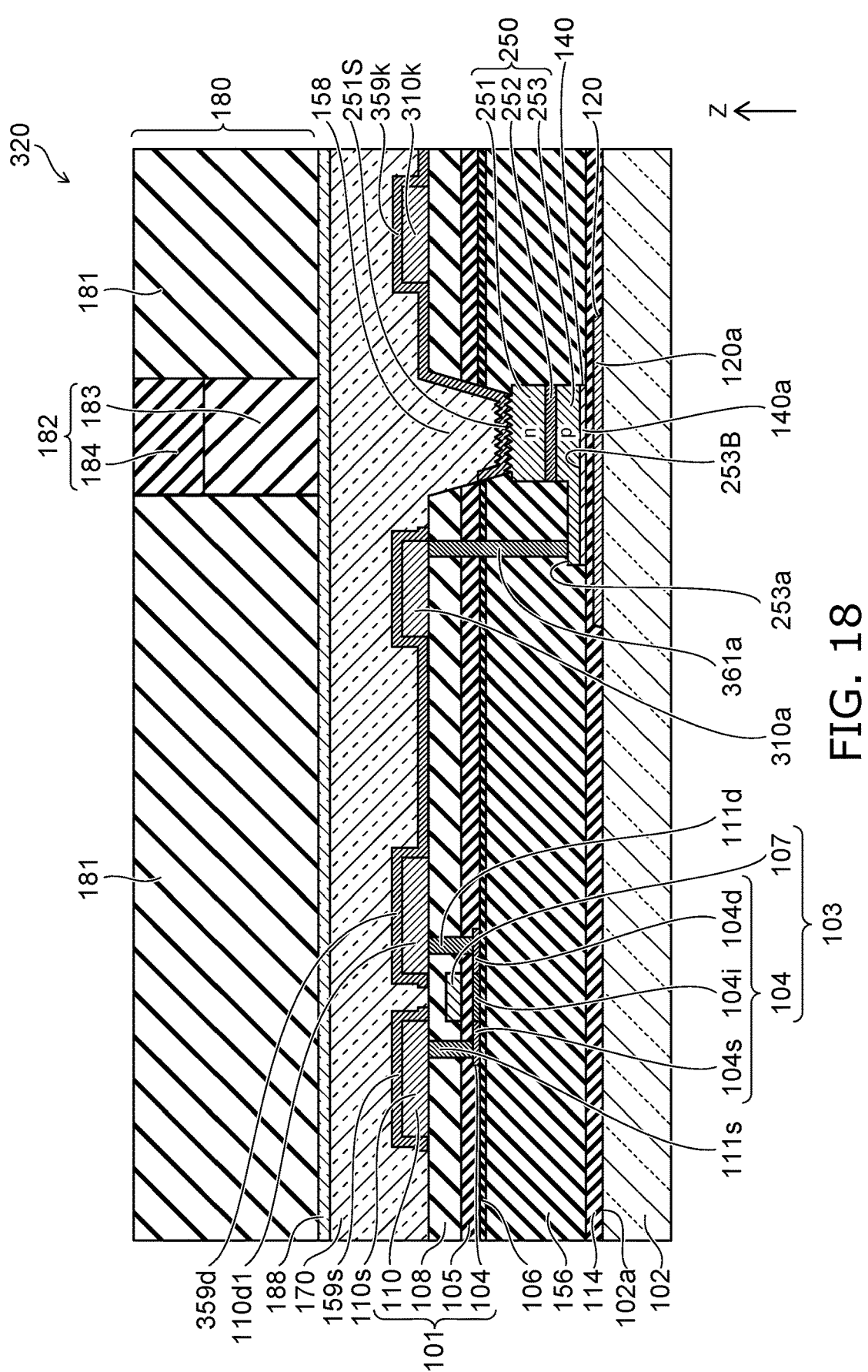
FIG. 18 is a schematic cross-sectional view illustrating a portion of an image display device according to a third embodiment.

FIG. 18 is a schematic cross-sectional view illustrating a portion of an image display device according to the embodiment.

The embodiment differs from the other embodiments described above in that the light-emitting element 250 that uses the n-type semiconductor layer 251 as the light-emitting surface 251S is driven by the p-type transistor 103. The same components as those of the other embodiments described above are marked with the same reference numerals, and a detailed description is omitted as appropriate.

As shown in FIG. 18, a subpixel 320 of the image display device of the embodiment includes the substrate 102, the light-reflecting layer 120, the graphene layer 140, the light-emitting element 250, the first inter-layer insulating film 156, the transistor 103, the second inter-layer insulating film 108, a via 361*a*, and the wiring layer 110. The transistor 103 is a p-channel TFT. The light-emitting element 250 uses the n-type semiconductor layer 251 to provide the light-emitting surface 251S.

The light-emitting element 250 is located on the light-reflecting plate 120*a* with the graphene sheet 140*a* and the insulating layer 114 interposed. The light-reflecting plate 120*a* is provided with a configuration similar to that of the other embodiments described above. The light-reflecting plate 120*a* is located directly under the light-emitting element 250. When projected onto the XY plane, the outer perimeter of the light-reflecting plate 120*a* is set to include the outer perimeter of the light-emitting element 250 when the light-emitting element 250 is projected. The light-reflecting plate 120*a* substantially improves the luminous efficiency by reflecting the downward-scattered light of the light-emitting element 250 toward the light-emitting surface 251S side.

The light-emitting element 250 is a prismatic or cylindrical element that includes the bottom surface 253B on the first surface 102*a*. The light-emitting surface 251S is the surface at the side opposite to the bottom surface 253B. The bottom surface 253B is a surface that contacts the graphene sheet 140*a*.

The light-emitting element 250 includes the p-type semiconductor layer (the first semiconductor layer) 253, the light-emitting layer 252, and the n-type semiconductor layer (the second semiconductor layer) 251. The p-type semiconductor layer 253, the light-emitting layer 252, and the n-type semiconductor layer 251 are stacked in this order from the bottom surface 253B toward the light-emitting surface 251S. The p-type semiconductor layer 253 includes the connection part 253*a*. The connection part 253*a* is provided to protrude on the insulating layer 114 from the p-type semiconductor layer 253 in one direction. The connection part 253*a* is connected to one end of the via 361*a* and electrically connects the p-type semiconductor layer 253 to the via 361*a*.

The configuration of the transistor 103 is the same as that of the first embodiment. A description of the detailed configuration of the transistor 103 is omitted.

The wiring layer 110 is formed on the second inter-layer insulating film 108. The wiring layer 110 includes wiring parts 310*k*, 310*a*, 110*d*1, and 110*s*. The wiring part 310*a* and the wiring part 310*k* are located proximate to the light-emitting element 250 above the light-emitting element 250. The wiring part 310*a* is located above the connection part 253*a*. The wiring part 310*k* is located at a position that does not cross the wiring part 310*a*.

The via 361*a* is provided to extend through the second inter-layer insulating film 108, the insulating layer 105, the TFT underlying film 106, and the first inter-layer insulating film 156. The via 361*a* is located between the connection part 253*a* and the wiring part (a third wiring part) 310*a*. The via 361*a* electrically connects the wiring part 310*a* and the connection part 253*a*.

The vias 111*d* and 111*s* are provided similarly to those of the other embodiments described above.

A light-transmitting electrode 359*k* is provided over the wiring part 310*k*. The light-transmitting electrode 359*k* is provided over the light-emitting surface 251S. The light-transmitting electrode 359*k* also is located between the wiring part 310*k* and the light-emitting surface 251S and electrically connects the wiring part 310*k* and the light-emitting surface 251S. For example, the wiring part 310*k* and the light-transmitting electrode 359*k* are connected to the ground line 4 shown in FIG. 3. Accordingly, the n-type semiconductor layer 251 is electrically connected to the ground line 4 via the light-emitting surface 251S, the light-transmitting electrode 359*k*, and the wiring part (a fourth wiring part) 310*k*.

A light-transmitting electrode 359*d* is provided over the wiring part 310*a*. The light-transmitting electrode 359*d* is provided over the wiring part 110*d*1. The light-transmitting electrode 359*k* also is located between the wiring part 310*a* and the wiring part 110*d*1 and electrically connects the wiring part 310*a* and the wiring part 110*d*1. Accordingly, the p-type semiconductor layer 253 is electrically connected to the region 104*d* via the connection part 253*a*, the via 361*a*, the wiring part 310*a*, the light-transmitting electrode 359*d*, the wiring part 110*d*1, and the via 111*d*.

The light-transmitting electrode 159*s* is provided over the wiring part 110*s*. For example, the wiring part 110*s* and the light-transmitting electrode 159*s* are connected to the power supply line 3 shown in FIG. 3. Accordingly, the region 104*s* of the transistor 103 is electrically connected to the power supply line 3 by the via 111*s*, the wiring part 110*s*, and the light-transmitting electrode 159*s*.

The vias 361*a*, 111*d*, and 111*s* and the wiring parts 310*k*, 310*a*, 110*d*1, and 110*s* are formed by materials and formation methods similar to those of the other embodiments and their modifications described above.

Similarly to the other embodiments described above, the color filter 180, etc., also are provided.

A method for manufacturing the image display device of the embodiment will now be described.

FIGS. 19A to 20B are schematic cross-sectional views illustrating the method for manufacturing the image display device of the embodiment.

The same processes as those of the second embodiment can be used up to the formation of the graphene layer 1140 on the substrate 102 in which the light-reflecting layer 120 and the insulating layer 114 are formed, and the formation of the semiconductor layer 1150 on the graphene layer 1140. In the following description, the processes of FIGS. 19A to 20B are performed as the process of FIG. 15A and subsequent processes.

Figure 19A:
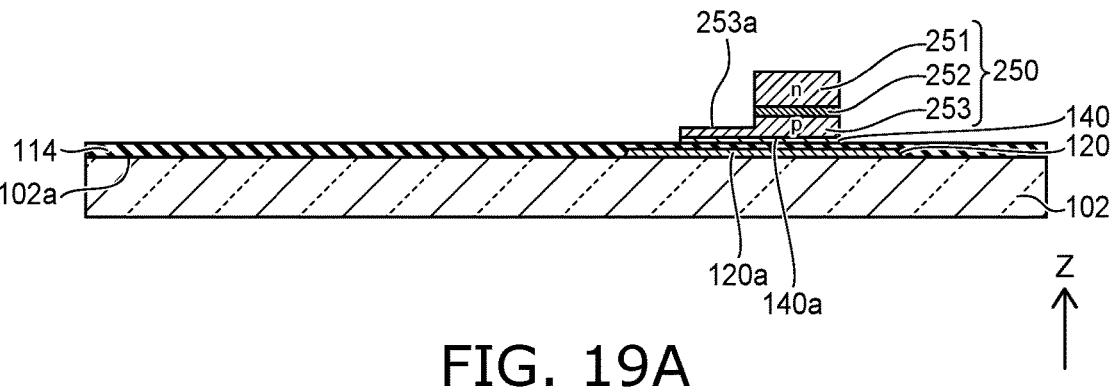
FIG. 19A is a schematic cross-sectional view illustrating a method for manufacturing the image display device of the third embodiment.

As shown in FIG. 19A, the light-emitting element 250 is formed by patterning the semiconductor layer 1150 shown in FIG. 15A into the desired shape. The other portions of the light-emitting element 250 are formed after the connection part 253*a* is formed. The graphene layer 1140 shown in FIG. 15A is shaped by over-etching when forming the connection part 253*a* so that the outer perimeter of the graphene sheet 140*a* substantially matches the outer perimeter of the light-emitting element 250. In the example, the connection part 253*a* and the graphene sheet 140*a* are formed to protrude on the insulating layer 114 in one direction when viewed from the light-emitting surface 251S.

Figure 19B:
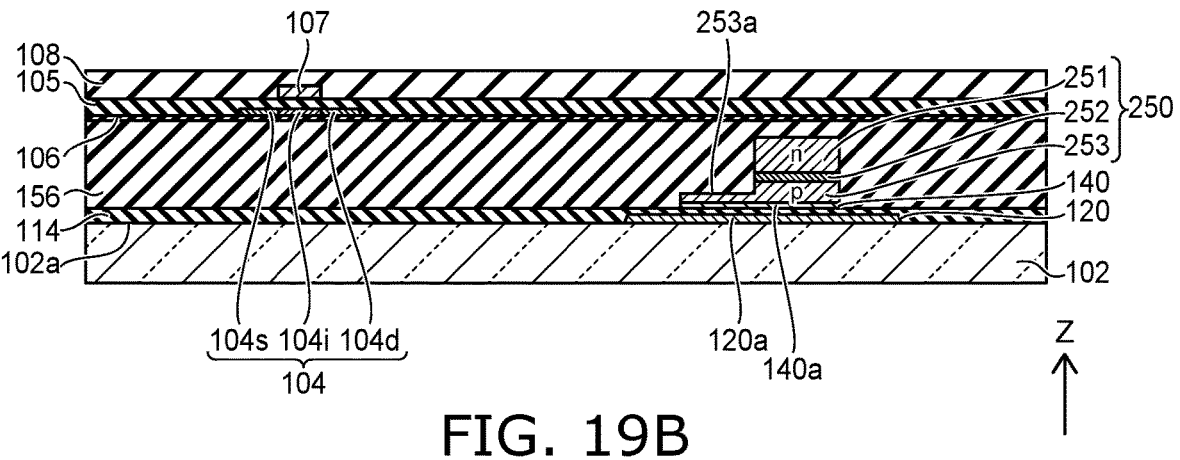
FIG. 19B is a schematic cross-sectional view illustrating the method for manufacturing the image display device of the third embodiment.

As shown in FIG. 19B, the first inter-layer insulating film 156 that covers the insulating layer 114, the graphene sheet 140*a*, and the light-emitting element 250 is formed. Similarly to the first embodiment, the TFT underlying film 106 is formed, the TFT channel 104 is formed, the insulating layer 105 is formed, and the gate 107 is formed. The second inter-layer insulating film 108 that covers the insulating layer 105 and the gate 107 is formed.

Figure 20A:
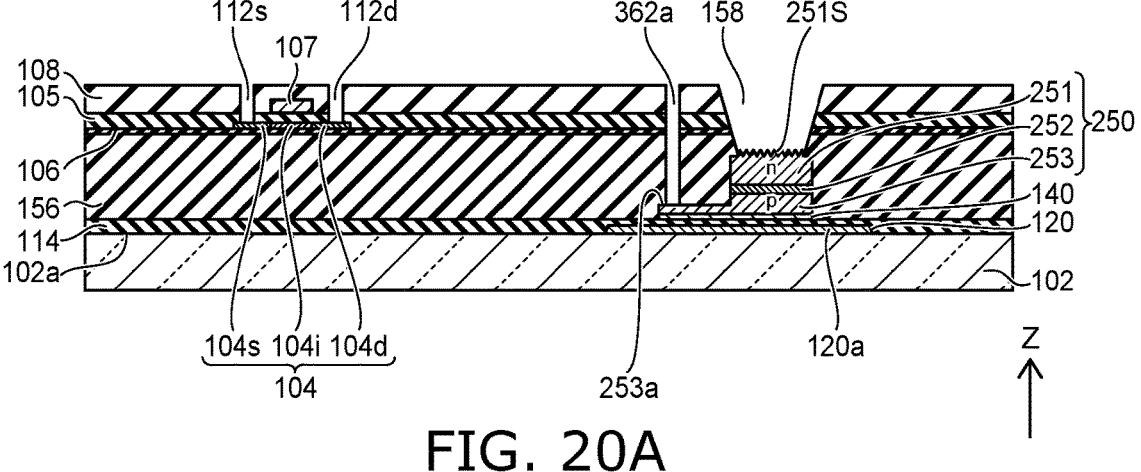
FIG. 20A is a schematic cross-sectional view illustrating the method for manufacturing the image display device of the third embodiment.

As shown in FIG. 20A, a via hole 362*a* is formed to extend through the second inter-layer insulating film 108, the insulating layer 105, the TFT underlying film 106, and the first inter-layer insulating film 156 and reach the connection part 253*a*. The opening 158 and the via holes 112*d* and 112*s* are formed similarly to the other embodiments described above.

Figure 20B:
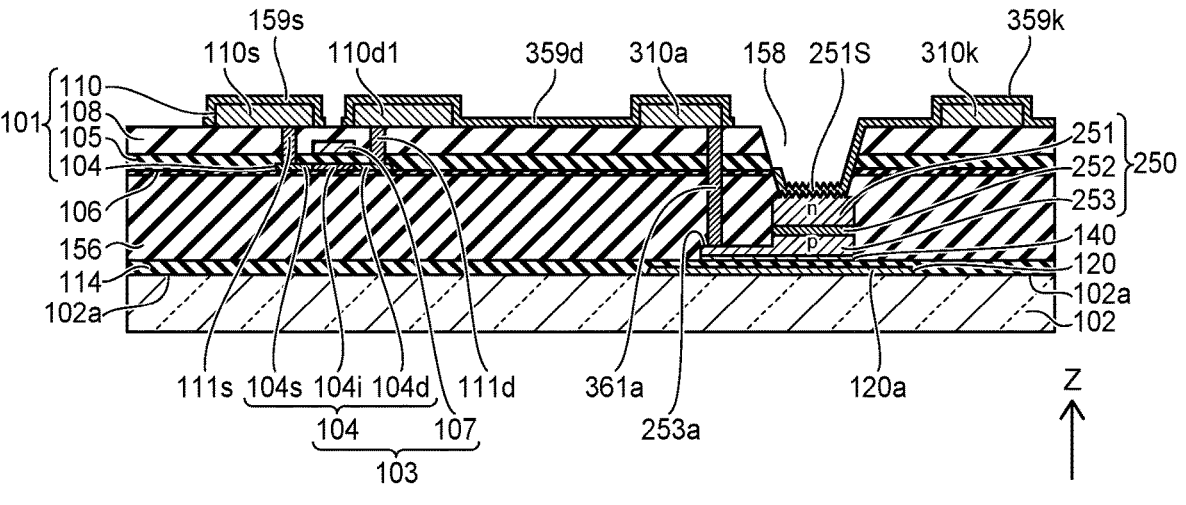
FIG. 20B is a schematic cross-sectional view illustrating the method for manufacturing the image display device of the third embodiment.

As shown in FIG. 20B, the vias 361*a*, 111*d*, and 111*s* are formed by filling a conductive material into the via holes 362*a*, 112*d*, and 112*s* shown in FIG. 20A. The wiring layer 110 that includes the wiring parts 310*k*, 310*a*, 110*d*1, and 110*s* is formed on the second inter-layer insulating film 108. The wiring parts 310*a*, 110*d*1, and 110*s* are connected respectively to the vias 361*a*, 111*d*, and 111*s*. The light-transmitting electrodes 359*k*, 359*d*, and 159*s* are formed by forming a transmissive conductive film on the wiring layer 110. The light-transmitting electrode 359*k* is formed over the wiring part 310*k* and the light-emitting surface 251S and is formed between the wiring part 310*k* and the light-emitting surface 251S as well. The light-transmitting electrode 359*d* is formed over the wiring part 310*a* and the wiring part 110*d*1 and is formed between the wiring part 310*a* and the wiring part 110*d*1 as well. The light-transmitting electrode 159*s* is formed over the wiring part 110*s*.

According to the image display device of the embodiment, a circuit configuration can be used in which the light-emitting element 250 is driven by the p-channel transistor 103 while using the n-type semiconductor layer 251 as the light-emitting surface 251S. Therefore, the degree of freedom of the circuit configuration and the degree of freedom of the circuit layout can be increased, and the design period of the image display device can be reduced.

Fourth Embodiment

Figure 21:
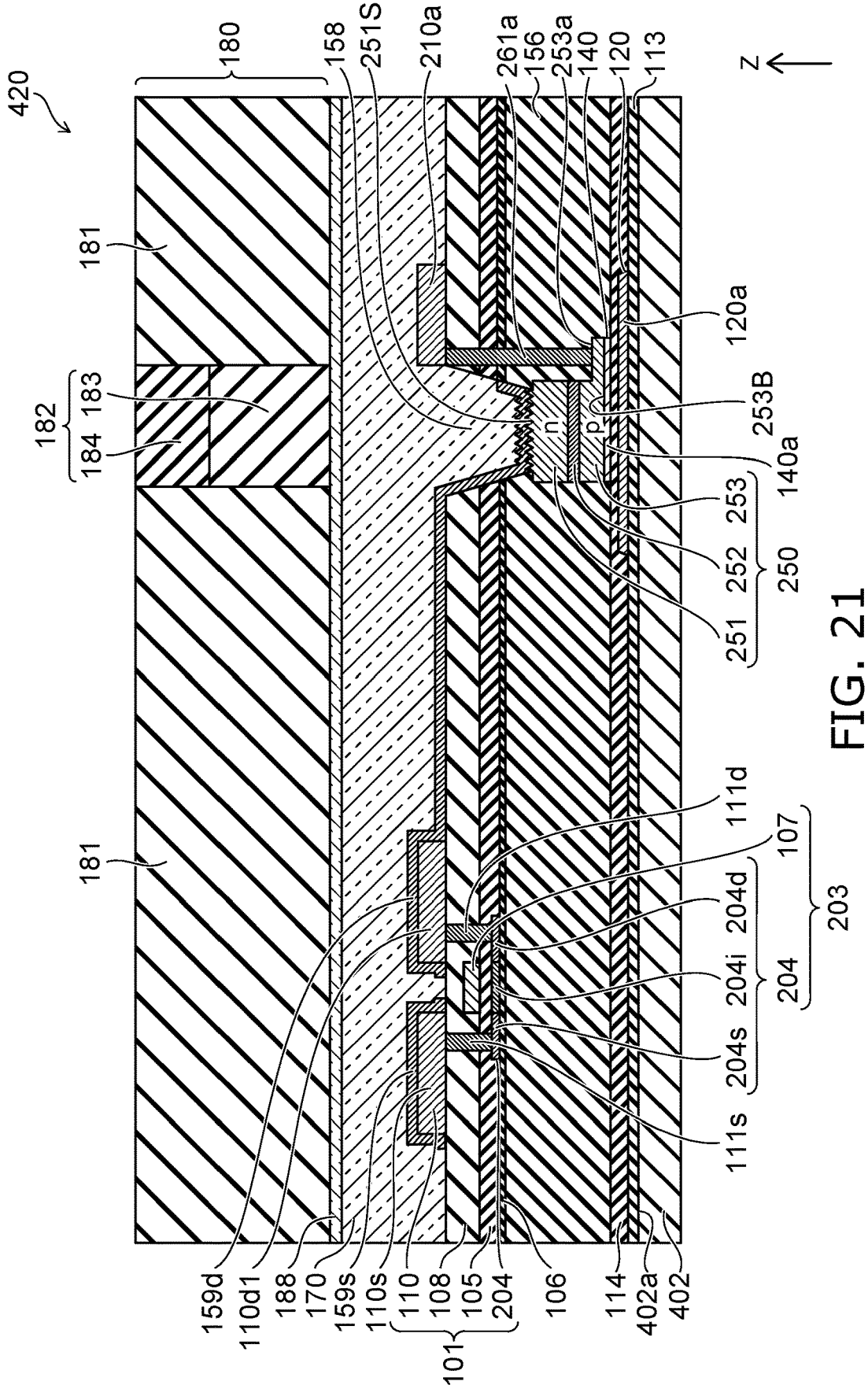
FIG. 21 is a schematic cross-sectional view illustrating a portion of an image display device according to a fourth embodiment.

FIG. 21 is a schematic cross-sectional view illustrating a portion of an image display device according to the embodiment.

The image display device of the embodiment includes a flexible substrate 402 instead of a glass substrate. Circuit elements such as light-emitting elements, transistors, etc., are formed on a first surface 402*a* of the substrate 402. Otherwise, the embodiment is similar to the other embodiments described above; the same components are marked with the same reference numerals, and a detailed description is omitted as appropriate.

As shown in FIG. 21, the image display device of the embodiment includes a subpixel 420. The subpixel 420 includes the substrate 402. The substrate 402 includes the first surface 402*a*. When the substrate 402 is made of a resin such as a polyimide resin, etc., a layer 113 that includes a silicon compound such as $SiO_2$ or the like is formed on the first surface 402*a*. The silicon compound-including layer 113 is located between the substrate 402 and the graphene layer 140. The light-reflecting layer 120 and the light-reflecting plate 120*a* are formed on the silicon compound-including layer 113. The silicon compound-including layer 113 is provided to improve the adhesion between the substrate 402 formed of the resin and the light-reflecting layer 120 formed of the metal material.

The insulating layer 114 is formed over the silicon compound-including layer 113 and over the light-reflecting layer 120. The insulating layer 114 is planarized by CMP, etc.

The light-emitting element 250 is located on the light-reflecting plate 120*a* with the graphene sheet 140*a* and the insulating layer 114 interposed. In the example, the structures and components higher than the insulating layer 114 are the same as those of the second embodiment described above, and a detailed description is omitted.

The substrate 402 is flexible. For example, the substrate 402 is formed of a polyimide resin, etc. It is favorable for the first inter-layer insulating film 156, the second inter-layer insulating film 108, the wiring layer 110, etc., to be formed of a material that is somewhat flexible to correspond to the flexibility of the substrate 402. The wiring layer 110 that has the longest wiring length has the highest risk of damage when bending. When the image display device is bent, the inner surface that is curved contracts due to compressive stress, and the outer surface elongates due to elongation stress. The neutral surface at which both stresses cancel exists inside the image display device, and elongation and contraction due to the stress due to the curving do not occur at the neutral surface. Therefore, by providing the wiring layer 110 at the neutral surface, the damage risk of the wiring layer 110 can be avoided. As necessary, the stress due to the curving may be reduced by providing multiple protective films at the front surface and/or back side of the image display device. Also, it is desirable for the neutral surface to overlap the position of the wiring layer 110 by adjusting the film thicknesses, film properties, materials, etc., of these protective films.

In the example, the structures and components that are higher than the insulating layer 114 are the same as those of the second embodiment, but can be those of the other embodiments and modifications.

A method for manufacturing the image display device of the embodiment will now be described.

Figure 22A:
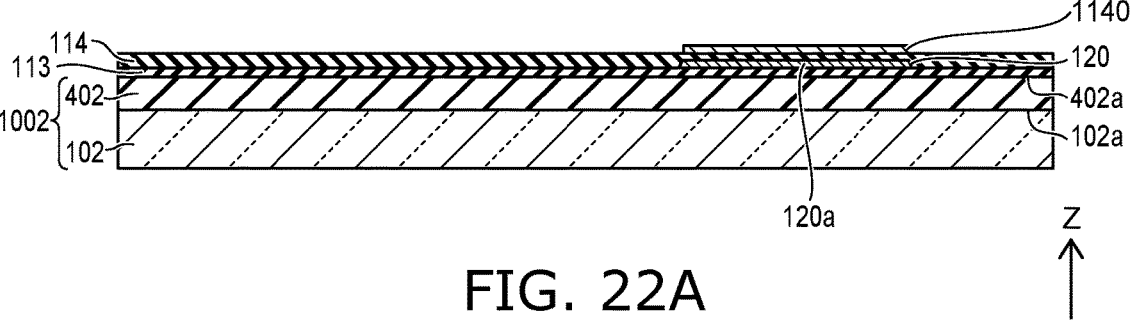
FIG. 22A is a schematic cross-sectional view illustrating a method for manufacturing the image display device of the fourth embodiment.
Figure 22B:
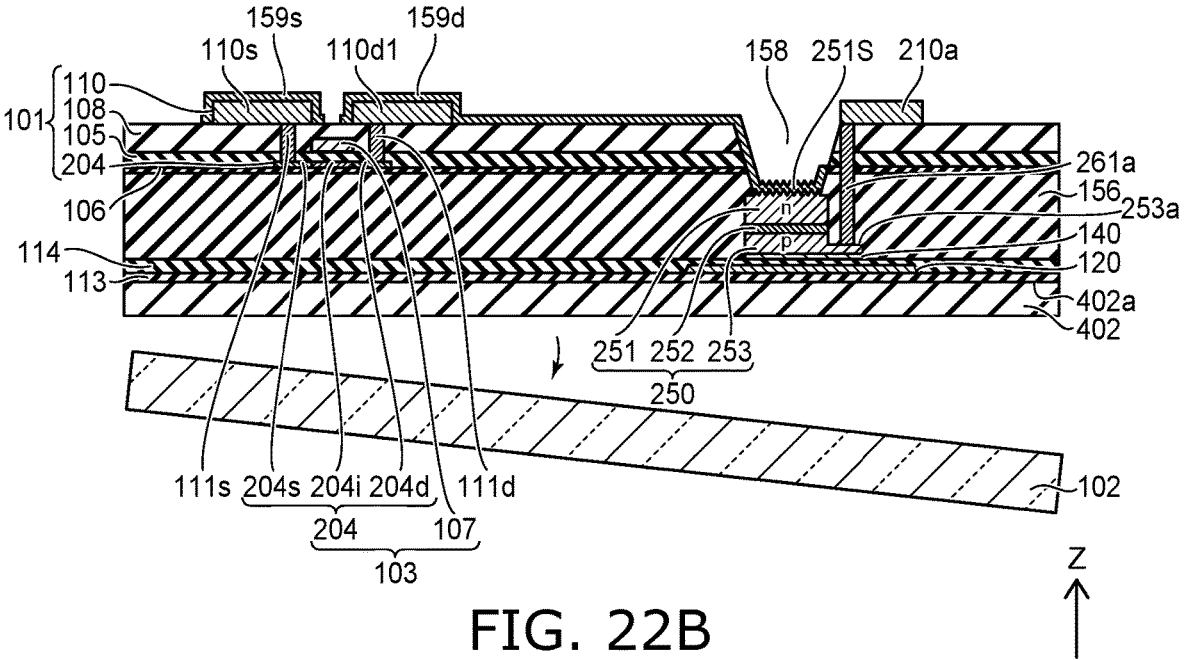
FIG. 22B is a schematic cross-sectional view illustrating the method for manufacturing the image display device of the fourth embodiment.

FIGS. 22A and 22B are schematic cross-sectional views illustrating the method for manufacturing the image display device of the embodiment.

As shown in FIG. 22A, the embodiment differs from the other embodiments described above in that a substrate 1002 is prepared. The substrate (the first substrate) 1002 includes the two layers of the substrates 102 and 402. The substrate 102 is a light-transmitting substrate, e.g., a glass substrate. The substrate (a second substrate) 402 is located on the first surface 102*a* of the substrate 102. For example, the substrate 402 is formed by coating a polyimide material on the first surface 102*a* of the substrate 102 and by firing. An inorganic film of SiN$_x$ or the like may be formed on the substrate 102 before forming the substrate 402. In such a case, the substrate 402 is formed by coating a polyimide material on the inorganic film and by firing. The silicon compound-including layer 113 is formed over the first surface 402*a* of the substrate 402. The first surface 402*a* of the substrate 402 is a surface at the side opposite to the surface at which the substrate 102 is located.

The upper structure of the subpixel 420 is formed by applying, for example, the processes of FIGS. 14A to 17B and FIGS. 9 to 10D above to such a substrate 1002.

As shown in FIG. 22B, the substrate 102 is removed from the structure body in which the upper structural component including the not-illustrated color filter and the like are formed. For example, laser lift-off or the like is used to remove the substrate 102.

The removal of the substrate 102 is not limited to the timing described above and can be performed at an appropriate timing. When the substrate 402 is made of an organic resin and there is a high-temperature process after the substrate 102 is removed, there is a risk that the substrate 402 may contract due to the heat of such a process, etc. It is therefore favorable to remove the substrate 102 in a process that is after such a high-temperature process. For example, it is favorable to remove the substrate 102 after the process of forming the wiring layer 110 has ended. By removing the substrate 102 at an appropriate timing, discrepancies such as cracking, chipping, etc., in the manufacturing processes may be reduced.

Effects of the image display device of the embodiment will now be described.

The image display device of the embodiment also has the following effects in addition to the effects of reducing the time of the transfer process for forming the light-emitting element 150 and reducing the number of processes similarly to the other embodiments described above. Namely, because the substrate 402 is flexible, bending of the image display device is possible, and adhering to a curved surface, utilizing in a wearable terminal, etc., can be realized without discomfort.

Fifth Embodiment

Figure 23:
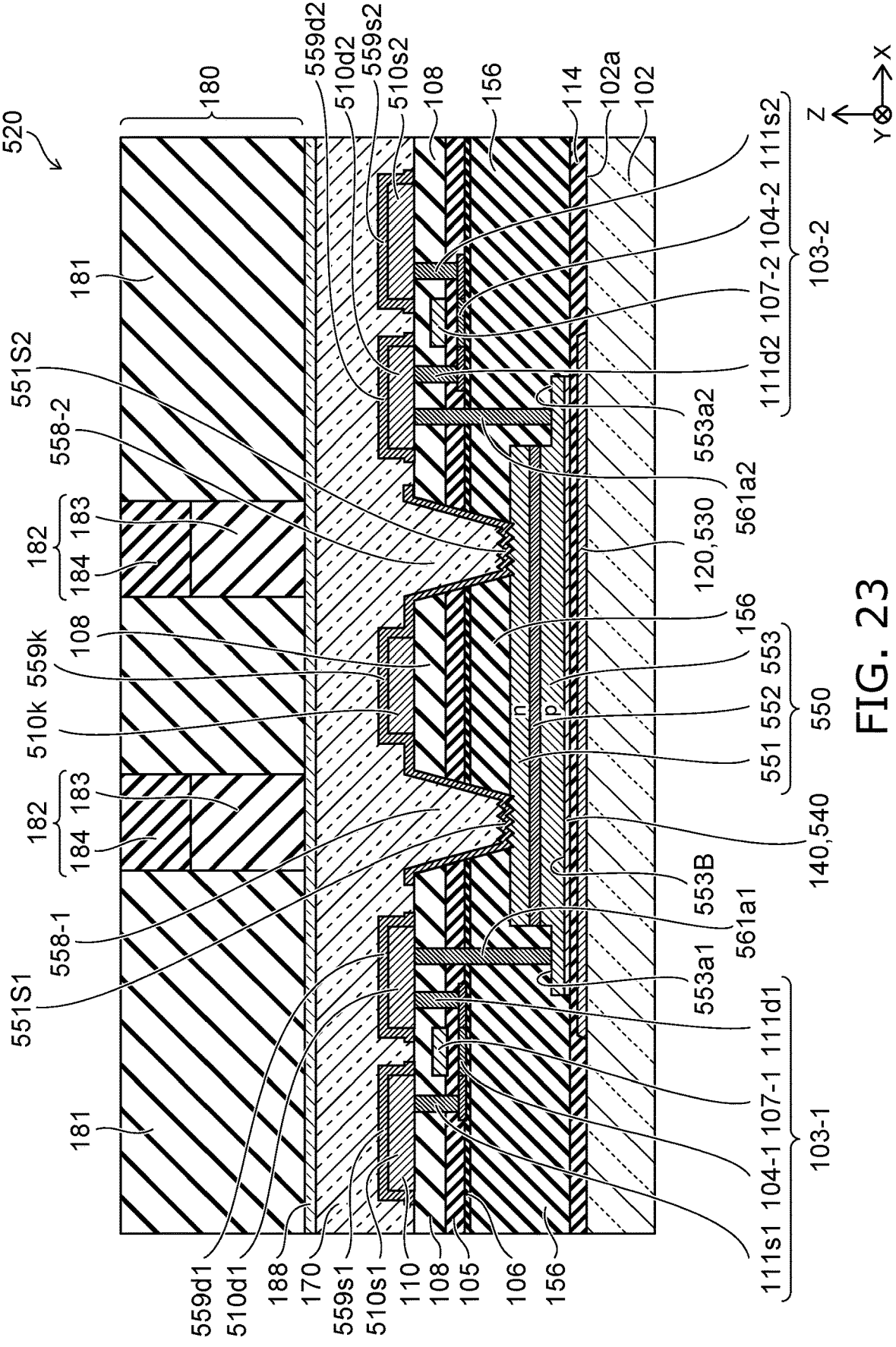
FIG. 23 is a schematic cross-sectional view illustrating a portion of an image display device according to a fifth embodiment.

FIG. 23 is a schematic cross-sectional view illustrating a portion of an image display device according to the embodiment.

According to the embodiment, an image display device that has a higher luminous efficiency is realized by forming multiple light-emitting surfaces 551S1 and 551S2 in a single semiconductor layer 550 that includes a light-emitting layer. In the following description, the same components as those of the other embodiments described above are marked with the same reference numerals, and a detailed description is omitted as appropriate.

As shown in FIG. 23, the image display device of the embodiment includes a subpixel group 520. The subpixel group 520 includes the substrate 102, the light-reflecting layer 120, the graphene layer 140, the semiconductor layer 550, the first inter-layer insulating film 156, multiple transistors 103-1 and 103-2, the second inter-layer insulating film 108, multiple vias 561*a*1 and 561*a*2, and the wiring layer 110. In the embodiment and its modifications, the reference numeral of the light-reflecting layer 120 is labeled next to the reference numeral of a light-reflecting plate 530. Also, the reference numeral of the graphene layer 140 is labeled next to the reference numeral of a graphene sheet 540.

The semiconductor layer 550 is located at the first surface 102*a* side of the substrate 102. In the example, the light-reflecting layer 120 is located between the substrate 102 and the semiconductor layer 550. The light-reflecting layer 120 is located on the first surface 102*a*. The light-reflecting layer 120 includes the light-reflecting plate 530. The insulating layer 114 covers the first surface 102*a*, the light-reflecting layer 120, and the light-reflecting plate 530. The insulating layer 114 is planarized.

According to the embodiment, by switching the p-channel transistors 103-1 and 103-2 on, holes are injected from one side of the semiconductor layer 550 via the wiring layer 110 and the vias 561*a*1 and 561*a*2. By switching the p-channel transistors 103-1 and 103-2 on, electrons are injected from the other side of the semiconductor layer 550 via the wiring layer 110. The holes and the electrons are injected into the semiconductor layer 550, and a light-emitting layer 552 is caused to emit light by the combination of the holes and electrons. For example, the circuit configuration shown in FIG. 3 is applied to the drive circuit for driving the light-emitting layer 552. By using the other embodiments described above, a configuration in which an n-channel transistor drives the semiconductor layer also is possible by vertically interchanging the n-type semiconductor layer and p-type semiconductor layer of the semiconductor layer. In such a case, the circuit configuration of FIG. 13 is applied to the drive circuit.

The configuration of the subpixel group 520 will now be described in detail.

The graphene layer 140 includes the graphene sheet 540. The graphene sheet 540 is located on the insulating layer 114. The outer perimeter of the graphene sheet 540 substantially matches the outer perimeter of the semiconductor layer 550. The semiconductor layer 550 is located on the light-reflecting plate 530 with the insulating layer 114 and the graphene sheet 540 interposed. When projected onto the XY plane, the outer perimeter of the light-reflecting plate 530

(the second part) is set to include the outer perimeter of the semiconductor layer 550 when the semiconductor layer 550 is projected onto the light-reflecting plate 530.

The semiconductor layer 550 includes the multiple light-emitting surfaces 551S1 and 551S2. The semiconductor layer 550 is a prismatic or cylindrical stacked body that includes a bottom surface 553B on the first surface 102a. The light-emitting surfaces 551S1 and 551S2 are surfaces of the semiconductor layer 550 at the side opposite to the bottom surface 553B. In the example, the bottom surface 553B is a surface contacting the graphene sheet 540. It is favorable for the light-emitting surfaces 551S1 and 551S2 to be surfaces in substantially parallel planes. The substantially parallel planes may be the same plane or may be different planes. The light-emitting surfaces 551S1 and 551S2 are provided to be separated.

The semiconductor layer 550 includes a p-type semiconductor layer 553, the light-emitting layer 552, and an n-type semiconductor layer 551. The p-type semiconductor layer 553, the light-emitting layer 552, and the n-type semiconductor layer 551 are stacked in this order from the bottom surface 553B toward the light-emitting surfaces 551S1 and 551S2.

The p-type semiconductor layer 553 includes connection parts 553a1 and 553a2. The connection part 553a1 is provided to protrude on the insulating layer 114 in one direction from the p-type semiconductor layer 553. The connection part 553a2 is provided to protrude on the insulating layer 114 from the p-type semiconductor layer 553 in a different direction from the connection part 553a1. The connection parts 553a1 and 553a2 are not limited to protruding in one direction and may be provided to protrude in multiple directions. A portion that protrudes over the outer perimeter of the semiconductor layer 550 may have portions used as the connection parts 553a1 and 553a2. The semiconductor layer 550 is formed in a staircase shape in which the heights of the connection parts 553a1 and 553a2 are provided to be less than the height of the semiconductor layer 550, and are the same as the height of the p-type semiconductor layer 553 or less than the height of the p-type semiconductor layer 553 as in the example.

The connection part 553a1 is of the p-type, and the via 561a1 having one end connected to the connection part 553a1 is electrically connected to the p-type semiconductor layer 553. The connection part 553a2 is of the p-type, and the via 561a2 having one end connected to the connection part 553a2 is electrically connected to the p-type semiconductor layer 553.

The n-type semiconductor layer 551 includes the two light-emitting surfaces 551S1 and 551S2 at the upper surface. The two light-emitting surfaces 551S1 and 551S2 are provided to be separated from each other. That is, one subpixel group 520 substantially includes two subpixels. According to the embodiment, similarly to the other embodiments described above, a display region is formed by arranging the subpixel group 520 substantially including two subpixels in a lattice shape.

For example, the protruding directions of the connection parts 553a1 and 553a2 are determined respectively according to the locations of the light-emitting surfaces 551S1 and 551S2. For example, the connection part 553a1 is located so that the distance from the light-emitting surface 551S1 is sufficiently less than the distance from the light-emitting surface 551S2. That is, the connection part 553a1 is located at a position sufficiently closer to the light-emitting surface 551S1 than the light-emitting surface 551S2. For example, the connection part 553a2 is located so that the distance from the light-emitting surface 551S2 is sufficiently less than the distance from the light-emitting surface 551S1. That is, the connection part 553a2 is located at a position sufficiently closer to the light-emitting surface 551S2 than the light-emitting surface 551S1.

The first inter-layer insulating film (the first insulating film) 156 covers the lateral surface of the p-type semiconductor layer 553, the lateral surface of the light-emitting layer 552, and the lateral surface of the n-type semiconductor layer 551. The first inter-layer insulating film 156 covers a portion of the upper surface of the n-type semiconductor layer 551. The light-emitting surfaces 551S1 and 551S2 of the n-type semiconductor layer 551 are not covered with the first inter-layer insulating film 156. Similarly to the other embodiments described above, the first inter-layer insulating film 156 is favorably a white resin.

The TFT underlying film 106 is formed over the first inter-layer insulating film 156. The TFT underlying film 106 is not provided on the light-emitting surfaces 551S1 and 551S2. The TFT underlying film 106 is planarized, and the TFT channels 104-1 and 104-2, etc., are formed on the TFT underlying film 106.

The insulating layer 105 covers the TFT underlying film 106 and the TFT channels 104-1 and 104-2. A gate 107-1 is located on the TFT channel 104-1 with the insulating layer 105 interposed. A gate 107-2 is located on the TFT channel 104-2 with the insulating layer 105 interposed. The transistor 103-1 includes the TFT channel 104-1 and the gate 107-1. The transistor 103-2 includes the TFT channel 104-2 and the gate 107-2.

The second inter-layer insulating film (the second insulating film) 108 covers the insulating layer 105 and the gates 107-1 and 107-2.

The TFT channels 104-1 and 104-2 include regions doped to be of the p-type, and the transistors 103-1 and 103-2 are p-channel TFTs. The transistor 103-1 is located at a position closer to the light-emitting surface 551S1 than the light-emitting surface 551S2. The transistor 103-2 is located at a position closer to the light-emitting surface 551S2 than the light-emitting surface 551S1.

An opening 558-1 is provided above the light-emitting surface 551S1. An opening 558-2 is provided above the light-emitting surface 551S2. The second inter-layer insulating film 108, the insulating layer 105, the TFT underlying film 106, and the first inter-layer insulating film 156 are not provided in the openings 558-1 and 558-2, and the light-emitting surfaces 551S1 and 551S2 are exposed via the openings 558-1 and 558-2.

A light-transmitting electrode 559k is provided over the light-emitting surfaces 551S1 and 551S2. Electrons are injected via the light-transmitting electrode 559k and the light-emitting surfaces 551S1 and 551S2. The light-emitting surfaces 551S1 and 551S2 are covered with the light-transmitting electrode 559k, and the openings 558-1 and 558-2 are filled with the surface resin layer 170.

The light-emitting surfaces 551S1 and 551S2 are squares, rectangles, other polygons, circles, etc., when projected onto the XY plane. The shapes of the uppermost portions of the openings 558-1 and 558-2 also can be squares, rectangles, other polygons, circles, etc. For example, as in the example, it is favorable for the openings 558-1 and 558-2 to be formed in tapered shapes so that the areas widen upward to reduce loss due to light reflected by the wall surfaces of the openings 558-1 and 558-2. When projected onto the XY plane, the shapes of the light-emitting surfaces 551S1 and 551S2 and the shapes of the uppermost portions of the openings 558-1 and 558-2 may be similar or may not be similar.

The wiring layer 110 is located on the second inter-layer insulating film 108. The wiring layer 110 includes wiring parts 510s1, 510d1, 510k, 510d2, and 510s2.

The wiring part 510k is located between the light-emitting surface 551S1 and the light-emitting surface 551S2. The light-transmitting electrode 559k is provided over the wiring part 510k. For example, the wiring part 510k and the light-transmitting electrode 559k are connected to the ground line 4 of FIG. 3.

Vias 111d1, 111s1, 111d2, and 111s2 are provided to extend through the second inter-layer insulating film 108 and the insulating layer 105. The via 111d1 is located between the wiring part 510d1 and one region of the transistor 103-1 doped to be of the p-type. The via 111s1 is located between the wiring part 510s1 and another region of the transistor 103-1 doped to be of the p-type. The via 111d2 is located between the wiring part 510d2 and one region of the transistor 103-2 doped to be of the p-type. The via 111s2 is located between the wiring part 510s2 and another region of the transistor 103-2 doped to be of the p-type.

The wiring part 510d1 is located above the connection part 553a1. The wiring part 510d1 is connected to a p-type region corresponding to the drain electrode of the transistor 103-1 by the via 111d1. The wiring part 510s1 is connected to a p-type region corresponding to the source electrode of the transistor 103-1 by the via 111s1. The wiring part 510d2 is located above the connection part 553a2. The wiring part 510d2 is connected to a region corresponding to the drain electrode of the transistor 103-2 by the via 111d2. The wiring part 510s2 is connected to a region corresponding to the source electrode of the transistor 103-2 by the via 111s2.

The via 561a1 is provided to extend through the second inter-layer insulating film 108, the insulating layer 105, the TFT underlying film 106, and the first inter-layer insulating film 156. The via 561a1 is located between the connection part 553a1 and the wiring part 510d1 and electrically connects the connection part 553a1 and the wiring part 110d1.

The via 561a2 is provided to extend through the second inter-layer insulating film 108, the insulating layer 105, the TFT underlying film 106, and the first inter-layer insulating film 156. The via 561a2 is located between the connection part 553a2 and the wiring part 510d2 and electrically connects the connection part 553a2 and the wiring part 510d2.

The transistors 103-1 and 103-2 are drive transistors of adjacent subpixels and are sequentially driven. Holes that are supplied from one of the two transistors 103-1 and 103-2 are injected into the light-emitting layer 552, electrons that are supplied from the wiring part 510k are injected into the light-emitting layer 552, and the light-emitting layer 552 emits light.

According to the embodiment, the drift current that flows in a direction parallel to the XY plane is suppressed by the resistance of the n-type semiconductor layer 551 and the p-type semiconductor layer 553. Therefore, the electrons that are injected from the light-emitting surfaces 551S1 and 551S2 and the holes that are injected from the vias 561a1 and 561a2 both travel along the stacking direction of the semiconductor layer 550. Because a light emission source substantially does not operate further outward of the light-emitting surfaces 551S1 and 551S2, the multiple light-emitting surfaces 551S1 and 551S2 that are located in one semiconductor layer 550 can be caused to emit light respectively by the transistors 103-1 and 103-2.

As described above, because the region further outward of the light-emitting surfaces 551S1 and 551S2 does not operate as a light emission source, the light-reflecting plate 530 also may be provided for each of the light-emitting surfaces 551S1 and 551S2.

A method for manufacturing the image display device of the embodiment will now be described.

FIGS. 24A to 26B are schematic cross-sectional views illustrating the method for manufacturing the image display device of the embodiment.

Figure 24A:
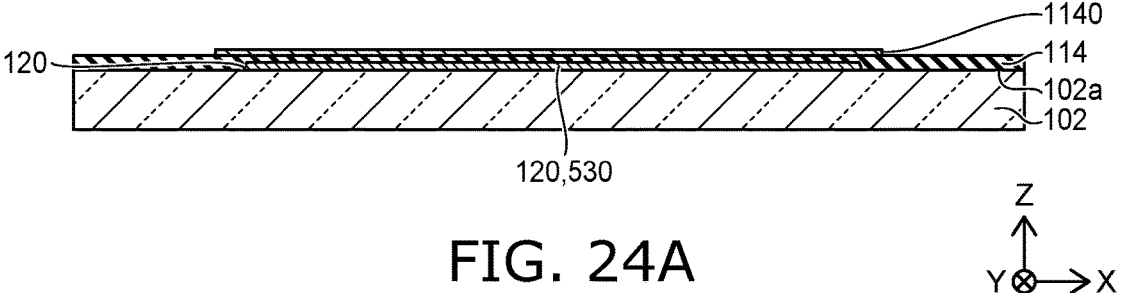
FIG. 24A is a schematic cross-sectional view illustrating a method for manufacturing the image display device of the fifth embodiment.

The embodiment can be similar to the other embodiments described above up to the formation of the light-reflecting layer 120 and the insulating layer 114. In the following description, the process of FIG. 24A is performed after performing the process corresponding to the process of FIG. 14B. The embodiment differs from the other embodiments described above in that the light-reflecting layer 120 includes the light-reflecting plate 530, and the shape of the light-reflecting plate 530 is different.

As shown in FIG. 24A, the graphene layer 1140 is located on the insulating layer 114. The graphene layer 1140 has a sufficient area; for example, the outer perimeter of the graphene layer 1140 is set to include the outer perimeter of the light-reflecting plate 530.

Figure 24B:
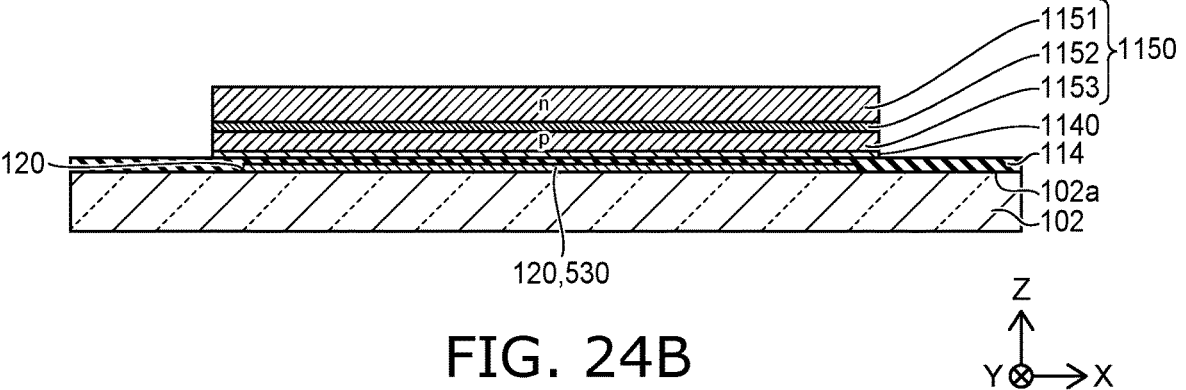
FIG. 24B is a schematic cross-sectional view illustrating the method for manufacturing the image display device of the fifth embodiment.

As shown in FIG. 24B, the semiconductor layer 1150 is formed on the graphene layer 1140. The semiconductor layer 1150 includes the p-type semiconductor layer 1153, the light-emitting layer 1152, and the n-type semiconductor layer 1151 formed in this order from the graphene layer 1140 toward the positive direction of the Z-axis.

Figure 24C:
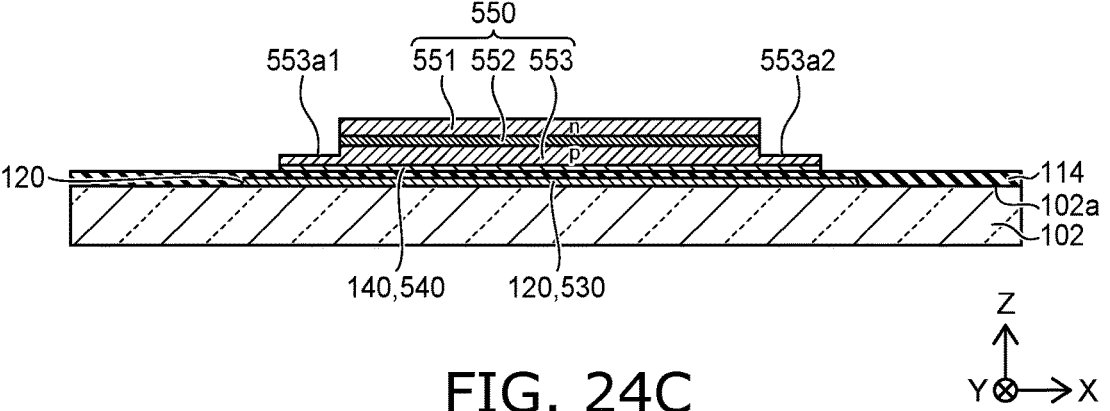
FIG. 24C is a schematic cross-sectional view illustrating the method for manufacturing the image display device of the fifth embodiment.

As shown in FIG. 24C, the semiconductor layer 550 that includes the connection parts 553a1 and 553a2 is formed by shaping the semiconductor layer 1150 shown in FIG. 24B into the desired shape by etching, etc. The desired shape is, for example, a square, rectangle, other polygon, circle, etc., when projected onto the XY plane. In the example, the connection part 553a1 is formed in the negative direction of the X-axis, and the connection part 553a2 is formed in the positive direction of the X-axis. The graphene layer 1140 shown in FIG. 24B is shaped so that the outer perimeter substantially matches the outer perimeter of the semiconductor layer 1150 due to over-etching when shaping of the semiconductor layer 1150.

Figure 25A:
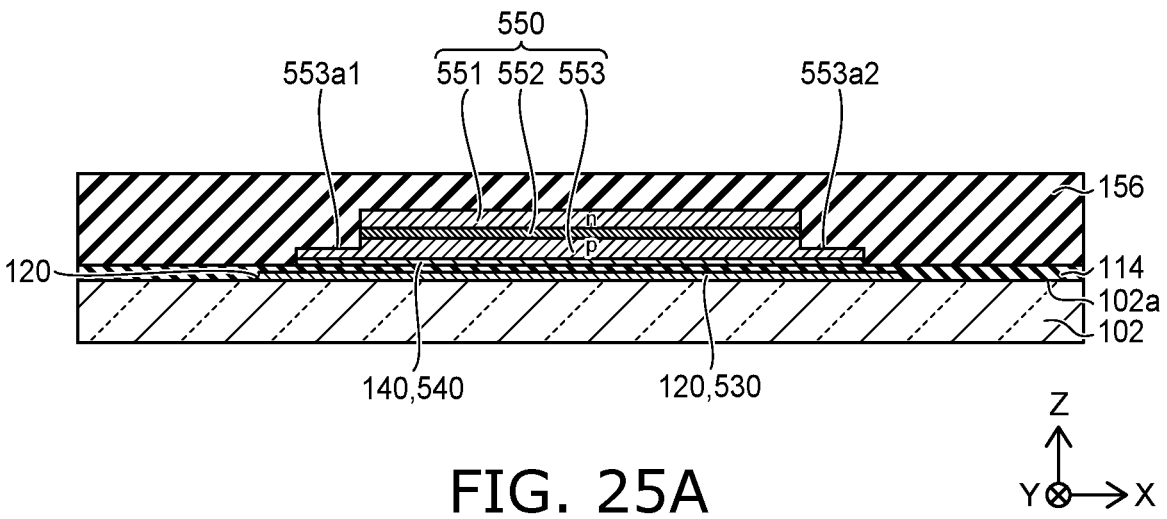
FIG. 25A is a schematic cross-sectional view illustrating the method for manufacturing the image display device of the fifth embodiment.

As shown in FIG. 25A, the first inter-layer insulating film 156 is formed to cover the insulating layer 114, the graphene layer 140, and the semiconductor layer 550.

Figure 25B:
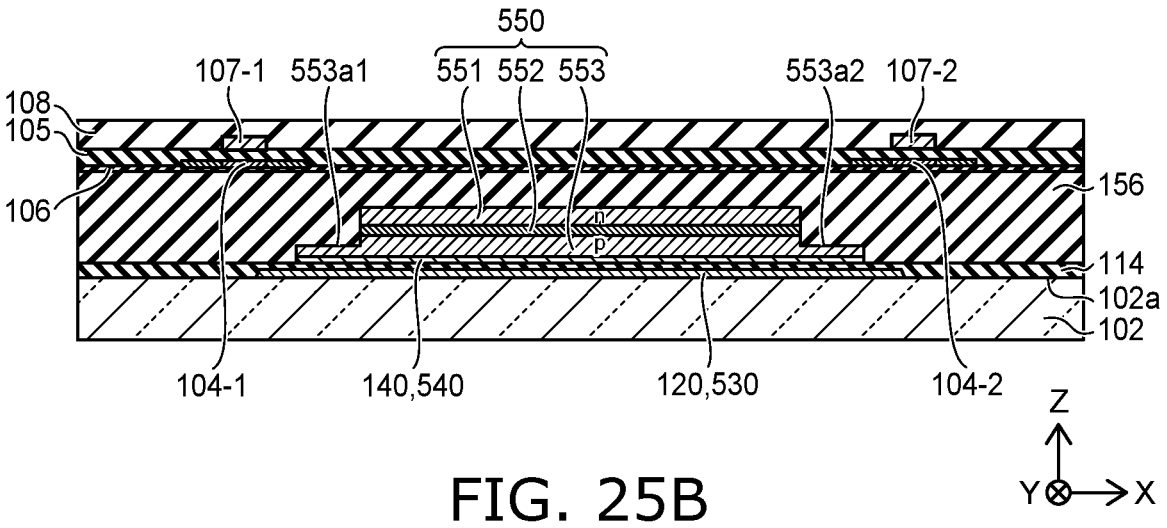
FIG. 25B is a schematic cross-sectional view illustrating the method for manufacturing the image display device of the fifth embodiment.

As shown in FIG. 25B, the TFT underlying film 106 is formed on the first inter-layer insulating film 156, and the TFT channels 104-1 and 104-2 are formed on the TFT underlying film 106. The insulating layer 105 is formed over the TFT underlying film 106 and the TFT channels 104-1 and 104-2. The gate 107-1 is formed on the TFT channel 104-1 with the insulating layer 105 interposed. The gate 107-2 is formed on the TFT channel 104-2 with the insulating layer 105 interposed. The second inter-layer insulating film 108 is formed over the insulating layer 105 and the gates 107-1 and 107-2. The formation methods, materials, and the like of the TFT channels 104-1 and 104-2, the insulating layer 105, the gates 107-1 and 107-2, etc., can be similar to those of the other embodiments described above.

Figure 26A:
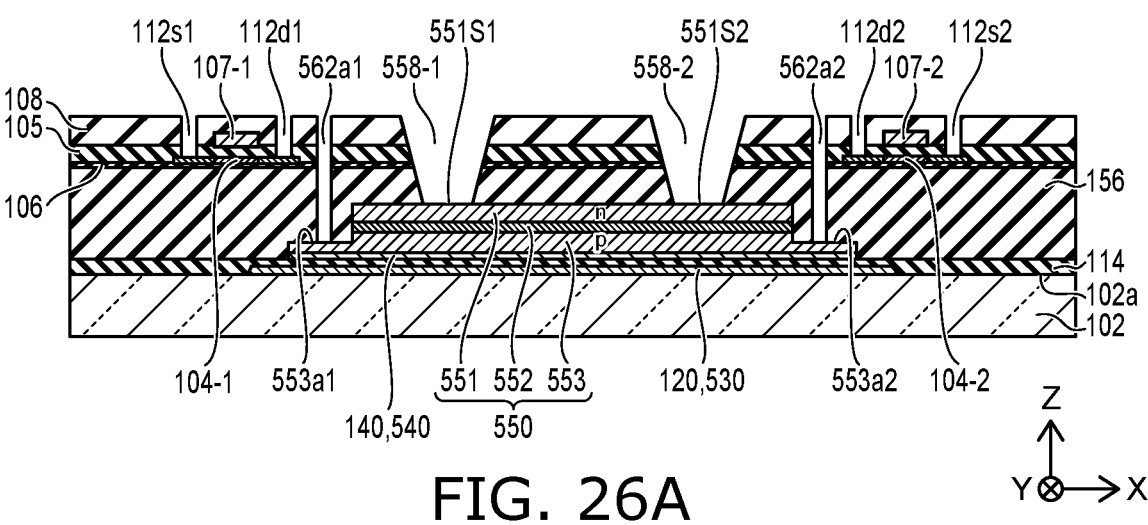
FIG. 26A is a schematic cross-sectional view illustrating the method for manufacturing the image display device of the fifth embodiment.

As shown in FIG. 26A, via holes 112d1 and 112s1 that extend through the second inter-layer insulating film 108 and the insulating layer 105 and reach the TFT channel 104-1 are formed. Via holes 112d2 and 112s2 that extend through the second inter-layer insulating film 108 and the insulating layer 105 and reach the TFT channel 104-2 are formed. A via hole 562a1 that extends through the second inter-layer insulating film 108, the insulating layer 105, the TFT underlying film 106, and the first inter-layer insulating film 156 and reaches the connection part 553a1 is formed. A via hole 562a2 that extends through the second inter-layer insulating film 108, the insulating layer 105, the TFT underlying film 106, and the first inter-layer insulating film 156 and reaches the connection part 553a2 is formed. The opening 558-1 that reaches the light-emitting surface 551S1 is formed by removing a portion of the second inter-layer insulating film 108, a portion of the insulating layer 105, a portion of the TFT underlying film 106, and a portion of the first inter-layer insulating film 156. The opening 558-2 that reaches the light-emitting surface 551S2 is formed by removing a portion of the second inter-layer insulating film 108, a portion of the insulating layer 105, a portion of the TFT underlying film 106, and a portion of the first inter-layer insulating film 156.

Figure 26B:
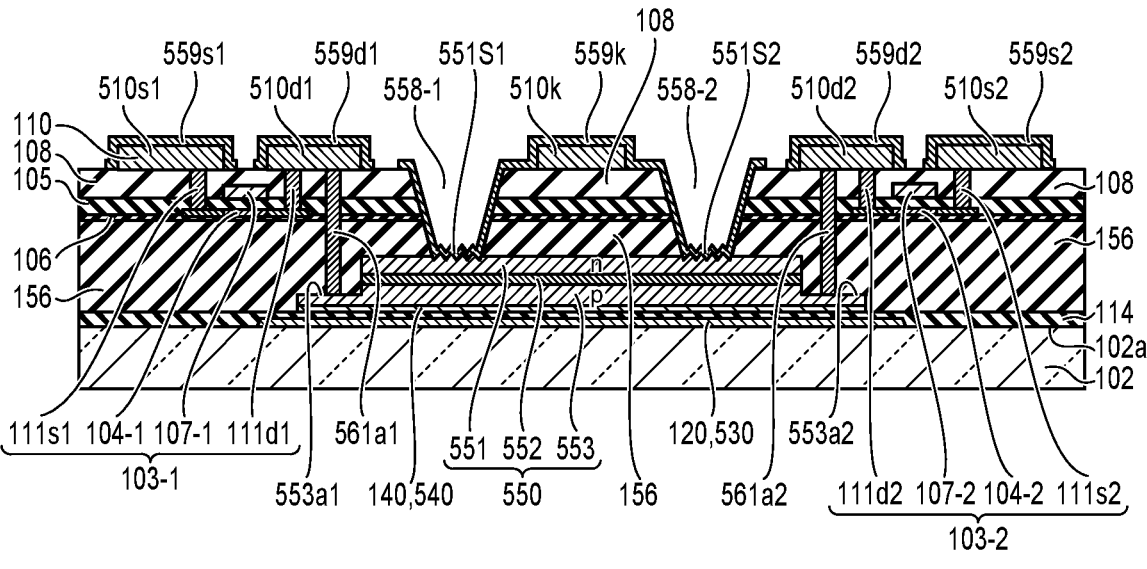
FIG. 26B is a schematic cross-sectional view illustrating the method for manufacturing the image display device of the fifth embodiment.
Figure 26B:
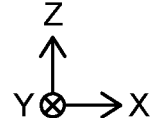

As shown in FIG. 26B, the vias 111d1, 111s1, 111d2, 111s2, 561a1, and 561a2 are formed by filling the via holes 112d1, 112s1, 112d2, 112s2, 562a1, and 562a2 with a conductive material. The wiring layer 110 is formed, and the wiring parts 510d1, 510s1, 510d2, 510s2, and 510k are formed.

The light-emitting surfaces 551S1 and 551S2 each are roughened. Subsequently, light-transmitting electrodes 559d1, 559s1, 559d2, 559s2, and 559k are formed by providing a transmissive conductive film to cover the wiring layer 110. The light-transmitting electrode 559k is formed to cover the light-emitting surfaces 551S1 and 551S2 and electrically connects the wiring part 510k and the light-emitting surfaces 551S1 and 551S2.

Subsequently, the upper structures such as the color filter, etc., are formed.

Thus, the subpixel group 520 that includes the semiconductor layer 550 including the two light-emitting surfaces 551S1 and 551S2 is formed.

Although two light-emitting surfaces 551S1 and 551S2 are provided in one semiconductor layer 550 according to the example, the number of light-emitting surfaces is not limited to two; three or more light-emitting surfaces can be provided in one semiconductor layer 550. As an example, one column or two columns of subpixels may be realized by a single semiconductor layer 550. As described below, the recombination current that does not contribute to the light emission per light-emitting surface can be reduced thereby, and the effect of realizing a finer light-emitting element can be increased.

(Modification)

Figure 27:
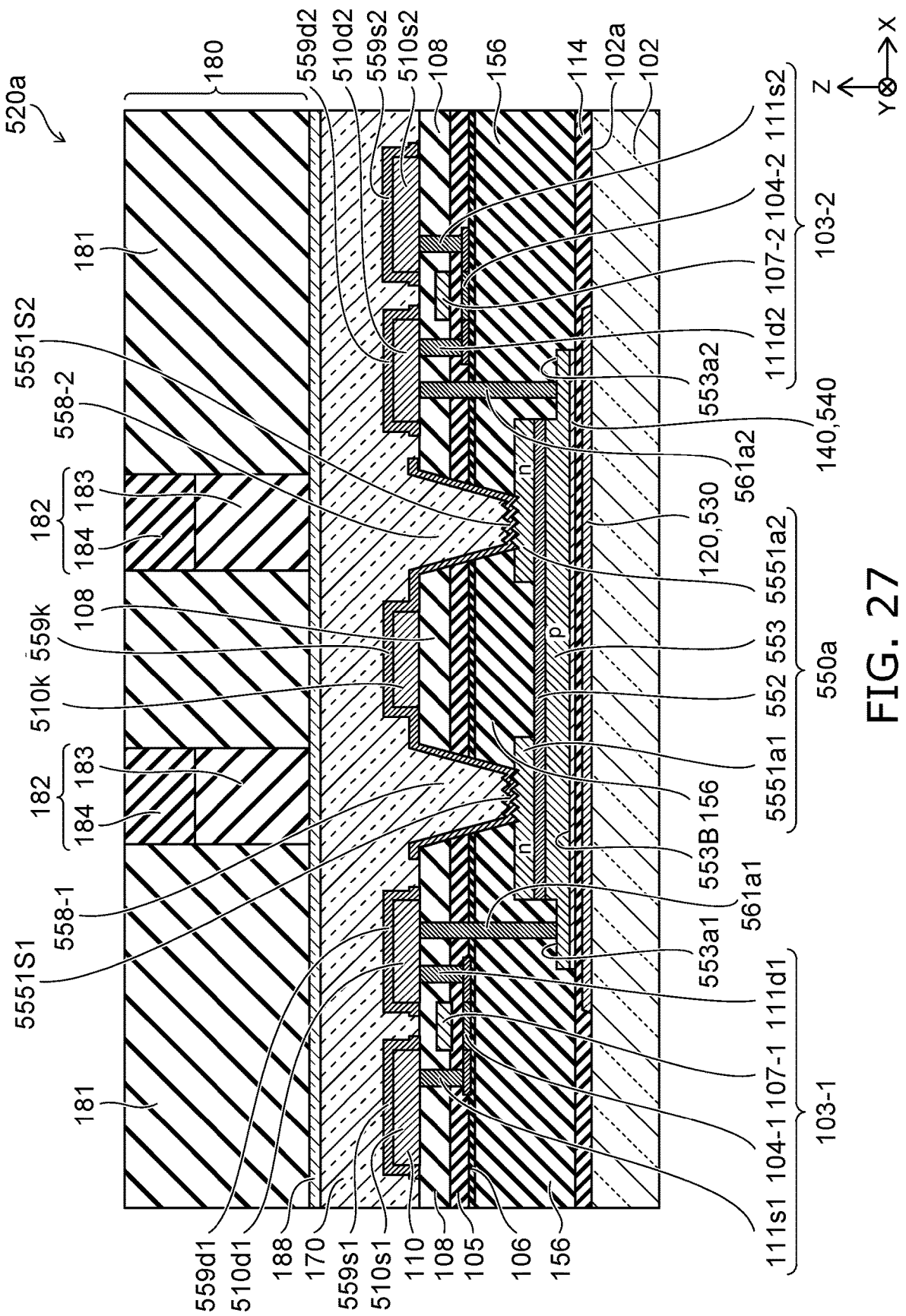
FIG. 27 is a schematic cross-sectional view illustrating a portion of an image display device according to a modification of the fifth embodiment.

FIG. 27 is a schematic cross-sectional view illustrating a portion of an image display device according to a modification of the embodiment.

The modification differs from the fifth embodiment described above in that two n-type semiconductor layers 5551a1 and 5551a2 are located on the light-emitting layer 552. Otherwise, the modification is the same as the fifth embodiment, the same components are marked with the same reference numerals, and a detailed description is omitted as appropriate.

As shown in FIG. 27, the image display device of the modification includes a subpixel group 520a. The subpixel group 520a includes a semiconductor layer 550a. The semiconductor layer 550a includes the p-type semiconductor layer 553, the light-emitting layer 552, and the n-type semiconductor layers 5551a1 and 5551a2. The p-type semiconductor layer 553 and the light-emitting layer 552 are stacked in this order from the graphene layer 140. The n-type semiconductor layers 5551a1 and 5551a2 each are stacked on the light-emitting layer 552.

The n-type semiconductor layers 5551a1 and 5551a2 are formed in an island configuration on the light-emitting layer 552, and in the example, are provided to be separated along the X-axis direction. The first inter-layer insulating film 156 is located between the n-type semiconductor layers 5551a1 and 5551a2, and the n-type semiconductor layers 5551a1 and 5551a2 are divided by the first inter-layer insulating film 156.

The n-type semiconductor layers 5551a1 and 5551a2 have substantially the same shape when projected onto the XY plane, and the shape may be substantially a square, rectangle, other polygon, circle, etc.

The n-type semiconductor layer 5551a1 includes a light-emitting surface 5551S1. The n-type semiconductor layer 5551a2 includes a light-emitting surface 555152. The light-emitting surface 5551S1 is exposed via the opening 558-1 formed by removing portions of the first inter-layer insulating film 156, the TFT underlying film 106, the insulating layer 105, and the second inter-layer insulating film 108. The exposed light-emitting surface 5551S1 is a surface of the n-type semiconductor layer 5551a1. The light-emitting surface 5551S2 is exposed via the opening 558-2 formed by removing portions of the first inter-layer insulating film 156, the TFT underlying film 106, the insulating layer 105, and the second inter-layer insulating film 108. The exposed light-emitting surface 5551S2 is a surface of the n-type semiconductor layer 5551a2.

Similarly to the shapes of the light-emitting surfaces according to the fifth embodiment, the shapes of the light-emitting surfaces 5551S1 and 5551S2 when projected onto the XY plane are substantially the same shape and are a shape such as substantially a square, etc. The shapes of the light-emitting surfaces 5551S1 and 5551S2 are not limited to rectangles such as those of the embodiment and may be circular, elliptical, polygonal such as hexagonal, etc. The shapes of the light-emitting surfaces 5551S1 and 5551S2 may be similar to or different from the shapes of the openings 558-1 and 558-2.

The light-transmitting electrode 559k is located on each of the light-emitting surfaces 5551S1 and 5551S2. The light-transmitting electrode 559k also is located on the wiring part 510k. The light-transmitting electrode 559k is located between the wiring part 510k and the light-emitting surface 5551S1 and located between the wiring part 510k and the light-emitting surface 5551S2. The light-transmitting electrode 559k electrically connects the wiring part 510k and the light-emitting surfaces 5551S1 and 5551S2.

A manufacturing method of the modification will now be described.

FIGS. 28A to 29B are schematic cross-sectional views illustrating a method for manufacturing the image display device of the modification.

Processes similar to the processes described in reference to FIGS. 24A and 24B according to the fifth embodiment described above up to the process of forming the semiconductor layer 1150 on the graphene layer 1140 are applied to the modification. In the following description, the process of FIG. 28A is applied to the process of FIG. 24B above and subsequent processes.

Figure 28A:
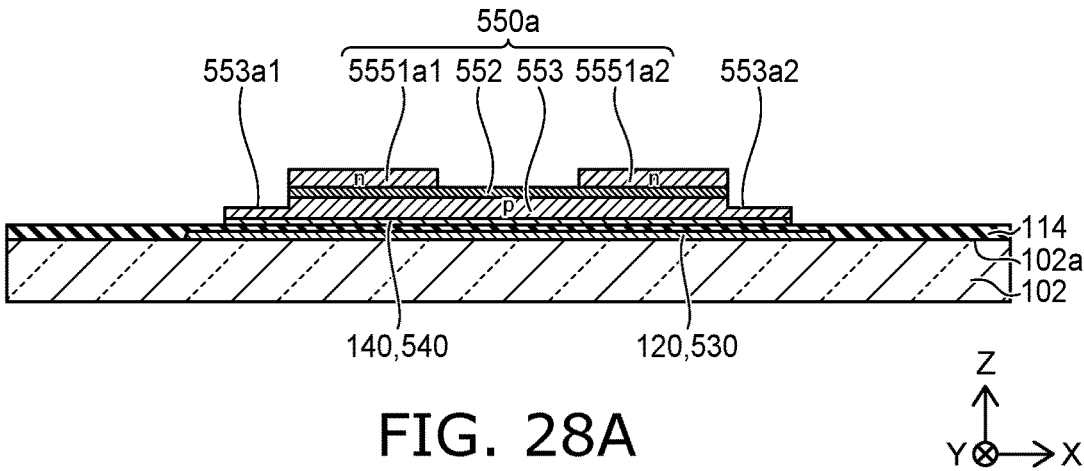
FIG. 28A is a schematic cross-sectional view illustrating a method for manufacturing the image display device of the modification of the fifth embodiment.

According to the modification as shown in FIG. 28A, the light-emitting layer 552 and the p-type semiconductor layer 553 that includes the connection parts 553a1 and 553a2 are formed by etching the semiconductor layer 1150 shown in FIG. 24B. The two n-type semiconductor layers 5551$a$1 and 5551$a$2 are formed by further etching.

The etching may be performed deeper when forming the n-type semiconductor layers 5551$a$1 and 5551$a$2. For example, the etching for forming the n-type semiconductor layers 5551$a$1 and 5551$a$2 may be performed to exceed a depth that reaches the light-emitting layer 552 and the p-type semiconductor layer 553. Thus, when the n-type semiconductor layers are formed by performing deep etching, it is desirable to etch outward of the outer perimeters of the light-emitting surfaces 5551S1 and 5551S2 shown in FIG. 27 by not less than 1 μm. The recombination current can be suppressed by separating the etching position outward from the outer perimeters of the light-emitting surfaces 5551S1 and 5551S2.

Figure 28B:
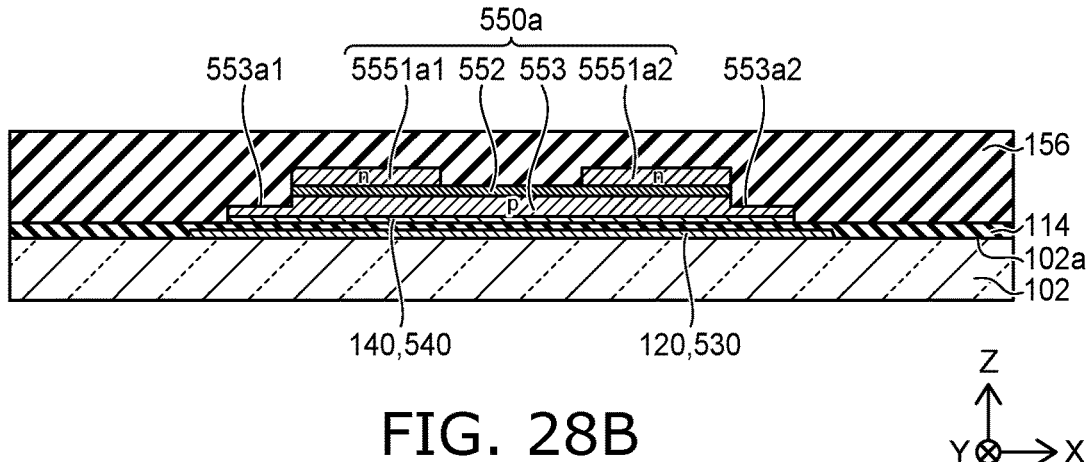
FIG. 28B is a schematic cross-sectional view illustrating the method for manufacturing the image display device of the modification of the fifth embodiment.

As shown in FIG. 28B, the first inter-layer insulating film 156 is formed to cover the insulating layer 114, the graphene layer 140, and the semiconductor layer 550$a$.

Figure 28C:
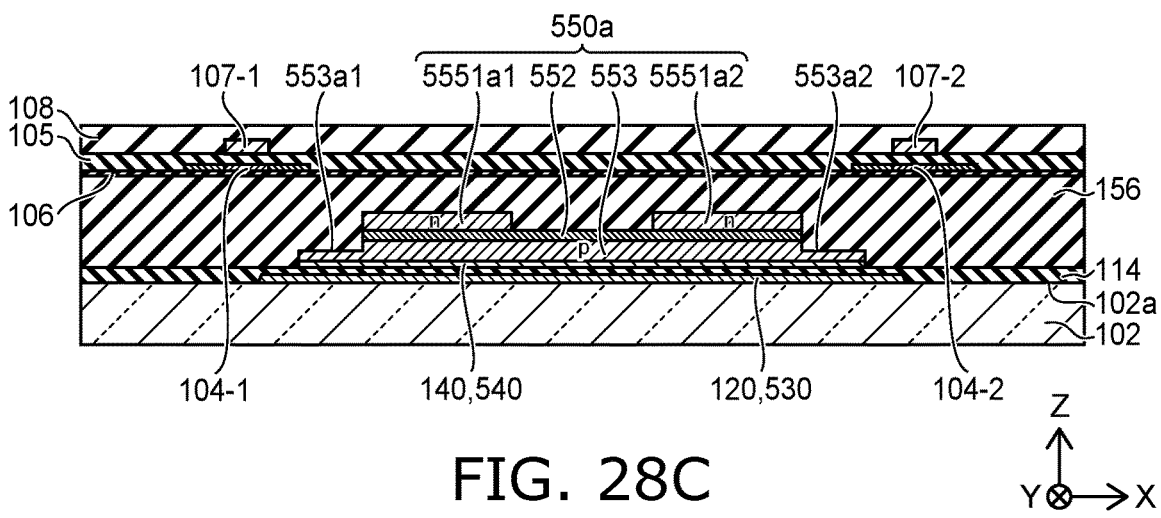
FIG. 28C is a schematic cross-sectional view illustrating the method for manufacturing the image display device of the modification of the fifth embodiment.

As shown in FIG. 28C, the TFT underlying film 106 is formed on the first inter-layer insulating film 156, and the TFT channels 104-1 and 104-2 are formed on the TFT underlying film 106. Also, the insulating layer 105 is formed on the TFT channels 104-1 and 104-2, and the gates 107-1 and 107-2 are formed on the insulating layer 105. The second inter-layer insulating film 108 is formed to cover the insulating layer 105 and the gates 107-1 and 107-2.

As shown in FIG. 29A, the via holes 112$d$1, 112$s$1, 112$d$2, 112$s$2, 562$a$1, and 562$a$2 are formed similarly to those of the fifth embodiment. The opening 558-1 is formed to reach the light-emitting surface 5551S1 by removing a portion of the second inter-layer insulating film 108, a portion of the insulating layer 105, a portion of the TFT underlying film 106, and a portion of the first inter-layer insulating film 156. The opening 558-2 is formed to reach the light-emitting surface 5551S2 by removing a portion of the second inter-layer insulating film 108, a portion of the insulating layer 105, a portion of the TFT underlying film 106, and a portion of the first inter-layer insulating film 156.

As shown in FIG. 29B, similarly to the fifth embodiment, the wiring layer 110 is formed, and transmissive conductive films are formed.

Thus, the subpixel group 520$a$ that includes the two light-emitting surfaces 5551S1 and 5551S2 is formed.

According to the modification as well, similarly to the fifth embodiment, the number of light-emitting surfaces is not limited to two; three or more light-emitting surfaces may be provided in the one semiconductor layer 550$a$.

Effects of the image display device of the embodiment will now be described.

Figure 30:
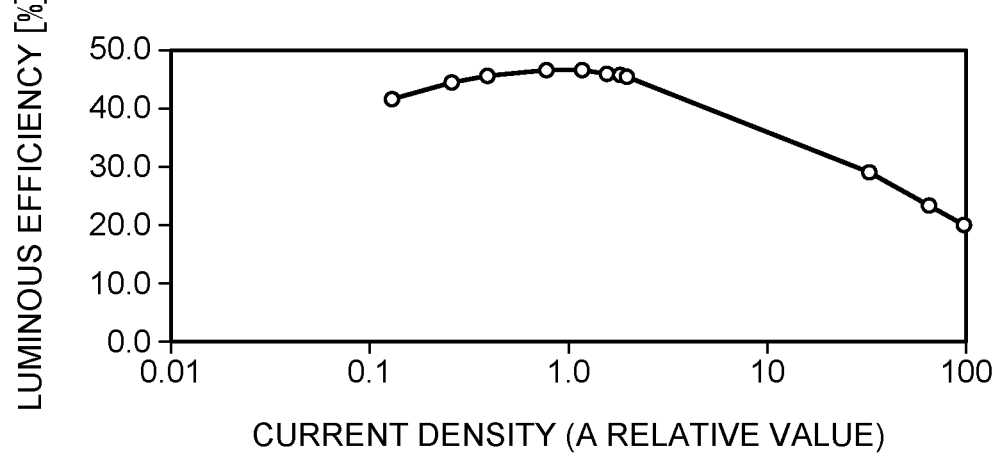
FIG. 30 is a graph illustrating a characteristic of a pixel LED element.

FIG. 30 is a graph illustrating a characteristic of a pixel LED element.

The vertical axis of FIG. 30 is the luminous efficiency (%) of the pixel LED element. The horizontal axis is the current density caused to flow in the pixel LED element shown as a relative value.

As shown in FIG. 30, the luminous efficiency of the pixel LED element is substantially constant or monotonously increases in the region in which the relative value of the current density is less than 1.0. The luminous efficiency monotonously decreases in the region in which the relative value of the current density is greater than 1.0. That is, an appropriate current density at which the luminous efficiency has a maximum exists in the pixel LED element.

It may be expected that a highly efficient image display device is realized by suppressing the current density so that a sufficient luminance is obtained from the light-emitting element. However, it is shown by FIG. 30 that there is a tendency for the current density to decrease and for the luminous efficiency to decrease for a low current density.

As described in the first to fourth embodiments, the light-emitting element is formed by individually singulating by etching or the like of all of the layers of the semiconductor layer 1150 that includes the light-emitting layer. At this time, the bonding surface between the light-emitting layer and the n-type semiconductor layer is exposed at the end portion. Similarly, the bonding surface between the light-emitting layer and the p-type semiconductor layer is exposed at the end portion.

When such end portions exist, electrons and holes recombine at the end portions. On the other hand, such recombination does not contribute to the light emission. The recombination at the end portions occurs substantially regardless of the current caused to flow in the light-emitting element. It is considered that the recombination occurs according to the lengths of the bonding surfaces that contribute to the light emission at the end portions.

When two light-emitting elements that have cubic shapes of the same dimension emit light, end portions are formed at four lateral surfaces for each light-emitting element; therefore, the two light-emitting elements have a total of eight end portions, and recombination may occur at eight end portions.

In contrast, according to the embodiment, the semiconductor layers 550 and 550$a$ include four lateral surfaces, and there are four end portions of the two light-emitting surfaces. However, the region between the openings 558-1 and 558-2 substantially does not contribute to the light emission because few electrons and holes are injected; therefore, the end portions that contribute to the light emission can be considered to be six. Thus, according to the embodiment, by substantially reducing the number of end portions of the semiconductor layer, the recombination that does not contribute to the light emission is reduced. By reducing the recombination that does not contribute to the light emission, the drive current per light-emitting surface is reduced.

When reducing the distance between the subpixels for higher definition or the like, when the current density is relatively high, etc., the distance between the light-emitting surface 551S1 and the light-emitting surface 551S2 becomes short in the subpixel group 520 of the fifth embodiment. In such a case, when the n-type semiconductor layer is shared as in the fifth embodiment, there is a risk that a portion of the electrons injected into the light-emitting surface being driven may shunt, and the light-emitting surface that is not being driven may have a micro light emission. In the subpixel group 520$a$ of the modification, the n-type semiconductor layer is divided into two, and each n-type semiconductor layer includes a light-emitting surface; therefore, the micro light emission of the light-emitting surface at the side that is not driven can be reduced.

In the semiconductor layer that includes the light-emitting layer according to the embodiment, the p-type semiconductor layer, the light-emitting layer, and the n-type semiconductor layer are stacked in this order from the first inter-layer insulating film 156 side; the roughening of the exposed surface of the n-type semiconductor layer is favorable from the perspective of increasing the luminous efficiency. Similarly to the other embodiments, the n-type semiconductor layer, the light-emitting layer, and the p-type semiconductor layer may be stacked in the order described above instead of the stacking order of the p-type semiconductor layer and the n-type semiconductor layer.

Specific examples of the subpixels and subpixel groups of the image display devices of the embodiments are described above. Each specific example is an example, and other configuration examples are possible by appropriately combining the configurations and procedures of processes of these embodiments. For example, the n-type semiconductor layer can be the light-emitting surface instead of the p-type semiconductor layer according to the first embodiment, and the p-type semiconductor layer can be the light-emitting surface instead of the n-type semiconductor layer being the light-emitting surface according to the second to fourth embodiments.

Sixth Embodiment

The image display device described above can be used as an image display module including the appropriate number of pixels in, for example, a computer display, a television, a portable terminal such as a smartphone, car navigation, etc.

Figure 31:
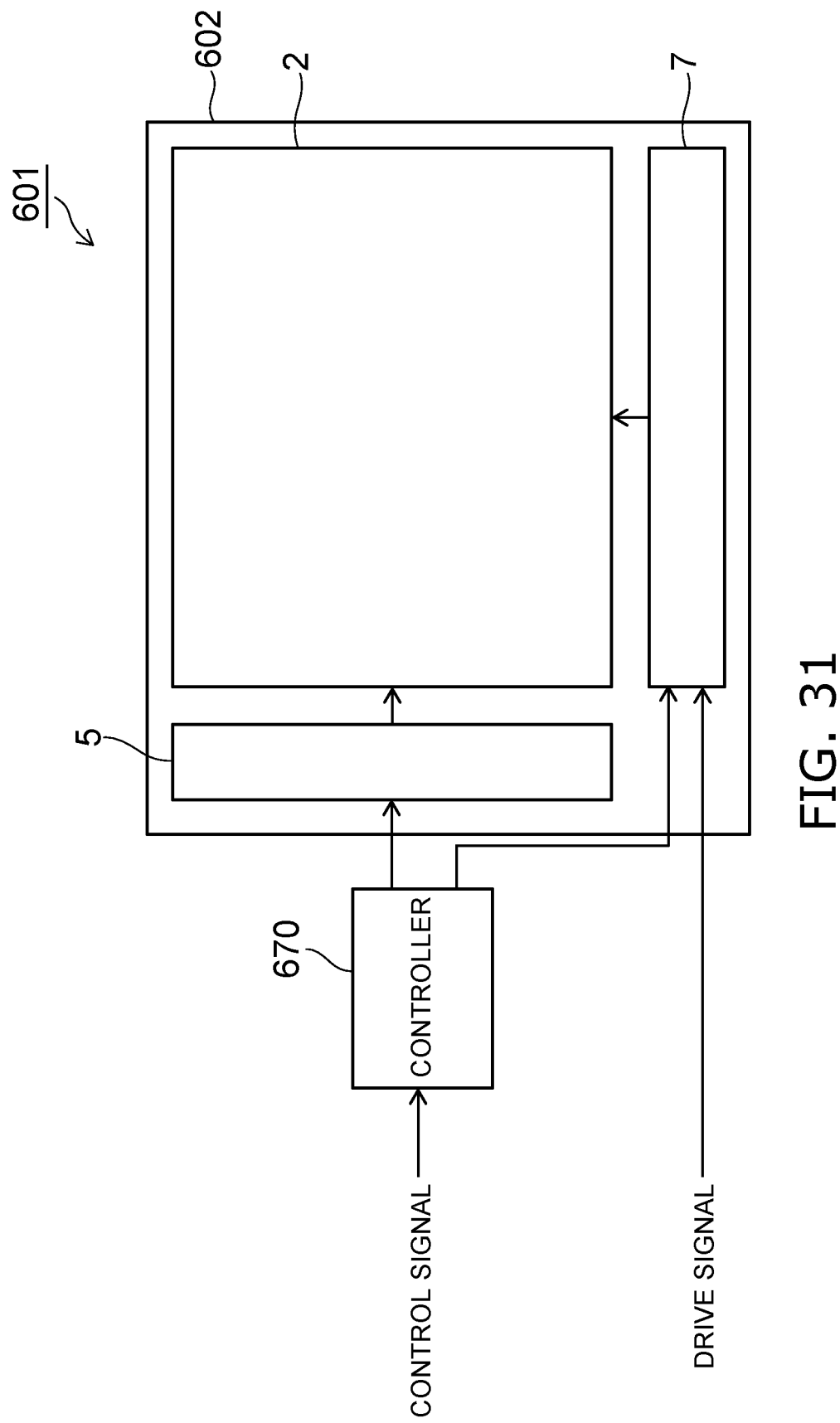
FIG. 31 is a block diagram illustrating an image display device according to a sixth embodiment.

FIG. 31 is a block diagram illustrating an image display device according to the embodiment.

FIG. 31 shows the major parts of the configuration of a computer display.

As shown in FIG. 31, the image display device 601 includes an image display module 602. The image display module 602 is, for example, an image display device that includes the configuration according to the first embodiment described above. The image display module 602 includes the display region 2 in which the multiple subpixels including the subpixels 20 are arranged, the row selection circuit 5, and the signal voltage output circuit 7.

The image display device 601 further includes a controller 670. The controller 670 receives input of control signals that are separated and generated by not-illustrated interface circuitry, and controls the driving and drive sequence of the subpixels in the row selection circuit 5 and the signal voltage output circuit 7.

(Modification)

The image display device described above can be used as an image display module including the appropriate number of pixels in, for example, a computer display, a television, a portable terminal such as a smartphone, car navigation, etc.

Figure 32:
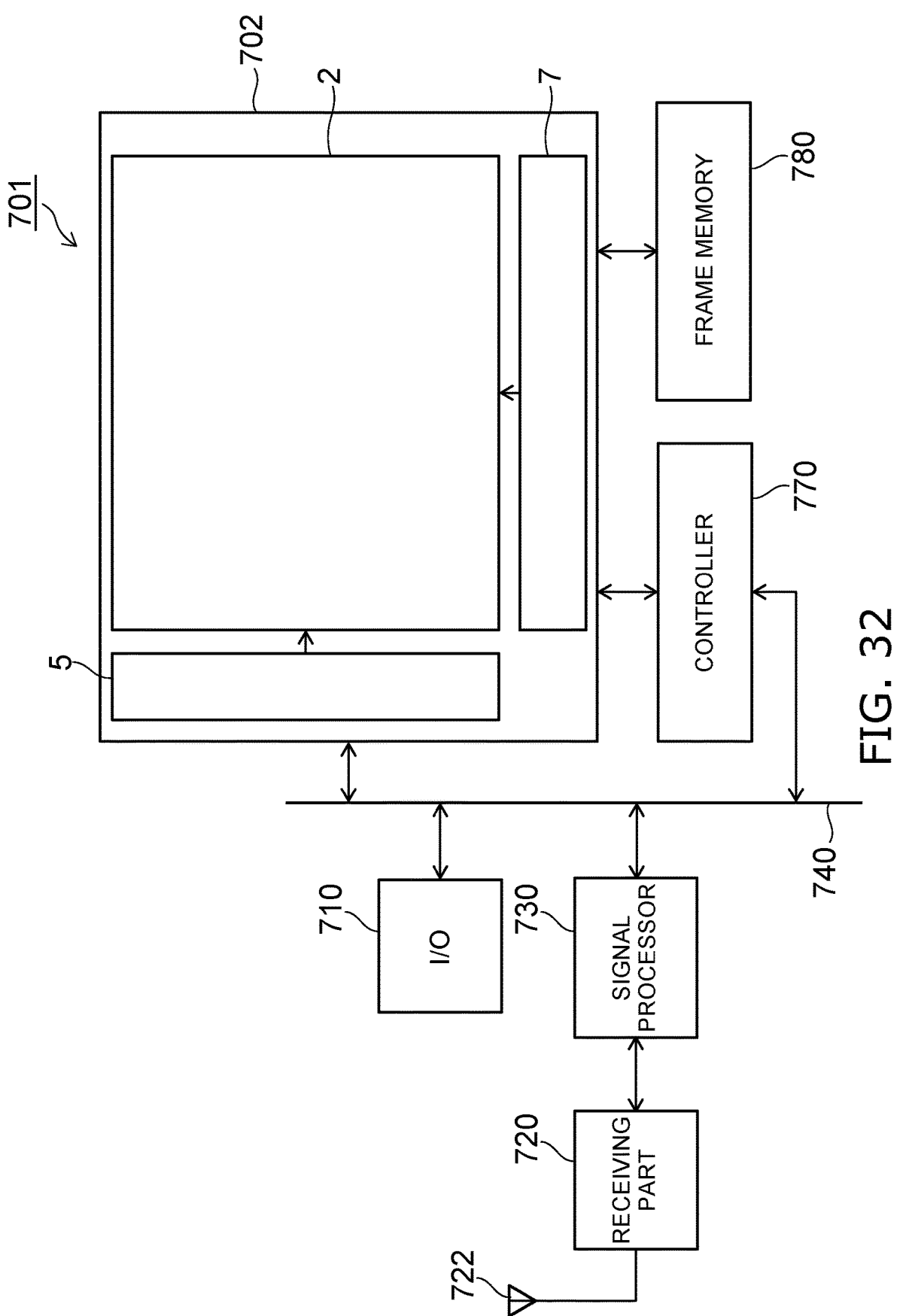
FIG. 32 is a block diagram illustrating an image display device according to a modification of the sixth embodiment.

FIG. 32 is a block diagram illustrating an image display device according to a modification of the embodiment.

FIG. 32 shows the configuration of a high-definition thin television.

As shown in FIG. 32, the image display device 701 includes an image display module 702. The image display module 702 is, for example, the image display device 1 that includes the configuration according to the first embodiment described above. The image display device 701 includes a controller 770 and a frame memory 780. Based on a control signal supplied by a bus 740, the controller 770 controls the drive sequence of the subpixels of the display region 2. The frame memory 780 stores one frame of display data and is used for smooth processing such as video image reproduction, etc.

The image display device 701 includes an I/O circuit 710. The I/O circuit 710 is labeled as simply "I/O" in FIG. 32. The I/O circuit 710 provides interface circuitry for connecting with an external terminal, a device, etc. The I/O circuit 710 includes, for example, an audio interface, a USB interface that connects an external hard disk device, etc.

The image display device 701 includes a receiving part 720 and a signal processor 730. An antenna 722 is connected to the receiving part 720, and the necessary signal is separated and generated from the radio wave received by the antenna 722. The signal processor 730 includes a DSP (Digital Signal Processor), a CPU (Central Processing Unit), etc., and the signal that is separated and generated by the receiving part 720 is separated and generated into image data, voice data, etc., by the signal processor 730.

Other image display devices also can be made by using the receiving part 720 and the signal processor 730 as a high-frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module according to the embodiment is not limited to the configuration of the image display device according to the first embodiment; modifications of the first embodiment or other embodiments may be used. Also, it goes without saying that the configurations of the image display modules according to the embodiment and modifications include many subpixels as shown in FIG. 11.

According to the embodiments described above, a method for manufacturing an image display device and an image display device can be realized in which a transfer process of a light-emitting element is reduced, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are within the scope and spirit of the inventions, and are within the scope of the inventions and equivalents recited in the claims. Also, the embodiments described above can be implemented in combination with each other.

What is claimed is:

1. A method for manufacturing an image display device, the method comprising:

forming a graphene-including layer on a first substrate;

forming a semiconductor layer on the graphene-including layer, the semiconductor layer comprising a light-emitting layer;

forming a light-emitting element by patterning the semiconductor layer, the light-emitting element comprising:

a bottom surface on the graphene-including layer, and a light-emitting surface at a side opposite to the bottom surface;

forming a first insulating film that covers the first substrate, the graphene-including layer, and the light-emitting element;

forming a circuit element on the first insulating film;

forming a second insulating film that covers the first insulating film and the circuit element, exposing a surface that includes the light-emitting surface by removing a portion of the first insulating film and a portion of the second insulating film;

forming a via that extends through the first and second insulating films; and forming a wiring layer on the second insulating film; wherein:

the light-emitting element comprises a connection part formed on the graphene-including layer; and the via is located between the wiring layer and the connection part and electrically connects the wiring layer and the connection part.

2. The method for manufacturing the image display device according to claim 1, wherein:

in the step of forming the semiconductor layer, the semiconductor layer is formed by sputtering.

3. The method for manufacturing the image display device according to claim 1, further comprising:

before the step of forming the graphene-including layer, forming a first part on the first substrate, the first part being light-reflective, wherein:

in a plan view, an outer perimeter of the light-emitting element is located within an outer perimeter of the first part.

4. The method for manufacturing the image display device according to claim 1, wherein:

the first substrate comprises a light-transmitting substrate.

5. The method for manufacturing the image display device according to claim 4, wherein:

the first substrate further comprises a second substrate located on the light-transmitting substrate, the second substrate being flexible, and the method further comprises, after the step of forming the wiring layer, removing the light-transmitting substrate.

6. The method for manufacturing the image display device according to claim 5, further comprising:

before the step of forming the graphene-including layer, forming a layer including a silicon compound on the second substrate.

7. The method for manufacturing the image display device according to claim 1, further comprising:

forming a light-transmitting electrode on the light-emitting surface.

8. The method for manufacturing the image display device according to claim 1, wherein:

the semiconductor layer comprises a gallium nitride compound semiconductor.

9. The method for manufacturing the image display device according to claim 1, further comprising:

forming a wavelength conversion member on the light-emitting element.

* * * * *